United States Patent
Nemoto et al.

(10) Patent No.: US 12,517,429 B2
(45) Date of Patent: Jan. 6, 2026

(54) RADIATION-SENSITIVE RESIN COMPOSITION AND METHOD FOR FORMING PATTERN

(71) Applicant: JSR CORPORATION, Tokyo (JP)

(72) Inventors: Ryuichi Nemoto, Tokyo (JP); Kensuke Miyao, Tokyo (JP)

(73) Assignee: JSR CORPORATION, Tokyo (JP)

( * ) Notice: Subject to any disclaimer, the term of this patent is extended or adjusted under 35 U.S.C. 154(b) by 546 days.

(21) Appl. No.: 17/994,515

(22) Filed: Nov. 28, 2022

(65) Prior Publication Data

US 2023/0106095 A1  Apr. 6, 2023

Related U.S. Application Data

(63) Continuation-in-part of application No. PCT/JP2021/018197, filed on May 13, 2021.

(30) Foreign Application Priority Data

May 29, 2020 (JP) .................................. 2020-094924

(51) Int. Cl.
*G03F 7/029* (2006.01)
*G03F 7/004* (2006.01)
*G03F 7/039* (2006.01)

(52) U.S. Cl.
CPC ............ *G03F 7/029* (2013.01); *G03F 7/0048* (2013.01); *G03F 7/039* (2013.01)

(58) Field of Classification Search
None
See application file for complete search history.

(56) References Cited

U.S. PATENT DOCUMENTS

| | | | |
|---|---|---|---|
| 2025/0076760 A1* | 3/2025 | Nemoto | G03F 7/0388 |
| 2025/0076761 A1* | 3/2025 | Nemoto | G03F 7/004 |
| 2025/0076762 A1* | 3/2025 | Nemoto | G03F 7/20 |
| 2025/0085629 A1* | 3/2025 | Nemoto | G03F 7/004 |

FOREIGN PATENT DOCUMENTS

| | | |
|---|---|---|
| JP | 2014178645 A | 9/2014 |
| JP | 2014224991 A | 12/2014 |
| JP | 2018012684 A | 1/2018 |
| JP | 2019127482 A | 8/2019 |

OTHER PUBLICATIONS

Machine translation of JP 2019-127482, published on Aug. 1, 2019 (Year: 2019).*
English translation of the International Preliminary Report on Patentability and Written Opinion issued Dec. 8, 2022 in PCT/JP2021/018197, 6 pages.
Combined Taiwanese Office Action and Search Report issued Aug. 14, 2024 in corresponding Taiwanese Patent Application No. 110117979 (with English translation), 18 pages.
Office Action issued Nov. 18, 2024, in corresponding Taiwanese Patent Application No. 110117979 (with English translation), 9 pages.
International Search Report issued Aug. 3, 2021 in PCT/JP2021/018197 , 3 pages.
Office Action issued Jan. 17, 2025, in corresponding Korean Patent Application No. 10-2022-7041220 (with machine English translation), 21 pages.
Office Action issued Jan. 28, 2025, in corresponding Japanese Patent Application No. 2022-526874 (with machine English translation), 8 pages.

* cited by examiner

*Primary Examiner* — Anca Eoff
(74) *Attorney, Agent, or Firm* — Element IP, PLC

(57) ABSTRACT

A radiation-sensitive resin composition includes a solvent and an onium salt compound having a structure represented by formula (1). $R^{f1}$ and $R^{f2}$ each independently represent a fluorine atom or a monovalent fluorinated hydrocarbon group having 1 to 20 carbon atoms. $R^1$ represents a hydrogen atom, a monovalent hydrocarbon group having 1 to 20 carbon atoms, a fluorine atom, or a monovalent fluorinated hydrocarbon group having 1 to 20 carbon atoms. $R^2$, $R^3$, $R^4$, $R^5$, $R^6$, and $R^7$ each independently represent a hydrogen atom or a monovalent hydrocarbon group having 1 to 20 carbon atoms. $n_1+n_2$ is an integer of 2 to 8. $n_3$ represents an integer of 0 to 5. $X^1$ and $X^2$ each independently represent an oxygen atom or a sulfur atom. Each * represents a bond with another structure. $Z^+$ represents a monovalent radiation-sensitive onium cation.

(1)

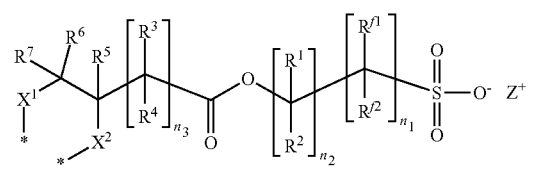

14 Claims, No Drawings

RADIATION-SENSITIVE RESIN COMPOSITION AND METHOD FOR FORMING PATTERN

CROSS-REFERENCE TO RELATED APPLICATIONS

The present application is a continuation-in-part application of International Application No. PCT/JP2021/018197, filed May 13, 2021, which claims priority to Japanese Patent Application No. 2020-094924 filed May 29, 2020. The contents of these applications are incorporated herein by reference in their entirety.

BACKGROUND OF THE INVENTION

Field of the Invention

The present invention relates to a radiation-sensitive resin composition and a method for forming a pattern.

Discussion of the Background

A photolithography technology using a resist composition has been used for the fine circuit formation in a semiconductor device. As the representative procedure, for example, a resist pattern is formed on a substrate by generating an acid by irradiating the coating of the resist composition with a radioactive ray through a mask pattern, and then reacting in the presence of the acid as a catalyst to generate the difference of solubility of a resin into an alkaline or organic developer between an exposed part and a non-exposed part.

In the photolithography technique, the micronization of the pattern is promoted by using a short-wavelength radioactive ray such as an ArF excimer laser or by using an immersion exposure method (liquid immersion lithography) in which exposure is performed in a state in which a space between a lens of an exposure apparatus and a resist film is filled with a liquid medium. As a next-generation technology, lithography using shorter wavelength radiation such as electron beams, X-rays and EUV (extreme ultraviolet rays) is also being considered.

While efforts for further technological progress are in progress, attempts have been made to improve the sensitivity and resolution and the like of a photoacid generator, which is a main component of a resist composition. For example, an acid generator capable of substituting a proximal carbon of a sulfonic acid group with fluorine to impart a strong acid has been studied (JP-A-2018-12684).

SUMMARY OF THE INVENTION

According to an aspect of the present invention, a radiation-sensitive resin composition includes a solvent and an onium salt compound having a structure represented by formula (1).

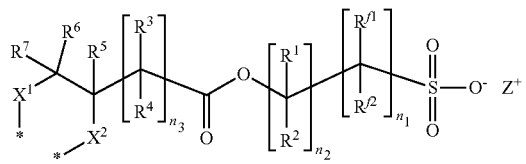

(1)

In the formula (1), $R^{f1}$ and $R^{f2}$ each independently represent a fluorine atom or a monovalent fluorinated hydrocarbon group having 1 to 20 carbon atoms; $R^1$ represents a hydrogen atom, a monovalent hydrocarbon group having 1 to 20 carbon atoms, a fluorine atom, or a monovalent fluorinated hydrocarbon group having 1 to 20 carbon atoms; $R^2$, $R^3$, $R^4$, $R^5$, $R^6$, and $R^7$ each independently represent a hydrogen atom or a monovalent hydrocarbon group having 1 to 20 carbon atoms; $n_1$ represents an integer of 0 to 4, provided that when there are a plurality of $R^{f1}$s and $R^{f2}$s, the plurality of $R^{f1}$s and $R^{f2}$s are the same or different from each other; $n_2$ represents an integer of 0 to 4, provided that when there are a plurality of $R^1$s and $R^2$s, the plurality of $R^1$s and $R^2$s are the same or different from each other; $n_1+n_2$ is an integer of 2 to 8; $n_3$ represents an integer of 0 to 5, provided that when there are a plurality of $R^3$s and $R^4$s, the plurality of $R^3$s and $R^4$s are the same as or different from each other; $X^1$ and $X^2$ each independently represent an oxygen atom or a sulfur atom; each * represents a bond with another structure; and $Z^+$ represents a monovalent radiation-sensitive onium cation.

According to another aspect of the present invention, a method for forming a pattern, includes directly or indirectly applying the above-described radiation-sensitive resin composition onto a substrate to form a resist film. The resist film is exposed. The exposed resist film is developed with a developer.

DESCRIPTION OF EMBODIMENTS

As used herein, the words "a" and "an" and the like carry the meaning of "one or more." When an amount, concentration, or other value or parameter is given as a range, and/or its description includes a list of upper and lower values, this is to be understood as specifically disclosing all integers and fractions within the given range, and all ranges formed from any pair of any upper and lower values, regardless of whether subranges are separately disclosed. Where a range of numerical values is recited herein, unless otherwise stated, the range is intended to include the endpoints thereof, as well as all integers and fractions within the range. As an example, a stated range of 1-10 fully describes and includes the independent subrange 3.4-7.2 as does the following list of values: 1, 4, 6, 10.

Among such efforts for the next-generation technology, various resist performances equal to or higher than ever before are required in terms of sensitivity, line width uniformity (LWR) performance indicating variation in line width of a resist pattern, and critical dimension uniformity (CDU) performance.

That is, the present invention relates, in one embodiment, to a radiation-sensitive resin composition containing:
a solvent; and
an onium salt compound having a structure represented by the formula (1):

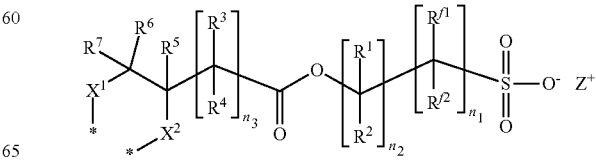

(1)

wherein
  $R^{f1}$ and $R^{f2}$ each independently represent a fluorine atom or a monovalent fluorinated hydrocarbon group having 1 to 20 carbon atoms,
  $R^1$ represents a hydrogen atom, a monovalent hydrocarbon group having 1 to 20 carbon atoms, a fluorine atom, or a monovalent fluorinated hydrocarbon group having 1 to 20 carbon atoms,
  $R^2$, $R^3$, $R^4$, $R^5$, $R^6$, and $R^7$ each independently represent a hydrogen atom or a monovalent hydrocarbon group having 1 to 20 carbon atoms,
  $n_1$ represents an integer of 0 to 4, when there are a plurality of $R^{f1}$s and $R^{f2}$s, the plurality of $R^{f1}$s and $R^{f2}$s are the same or different from each other,
  $n_2$ represents an integer of 0 to 4, when there are a plurality of $R^1$s and $R^2$s, the plurality of $R^1$s and $R^2$s are the same or different from each other,
  $n_1+n_2$ represents an integer of 2 to 8,
  $n_3$ represents an integer of 0 to 5, when there are a plurality of $R^3$s and $R^4$s, the plurality of $R^3$s and $R^4$s are the same as or different from each other,
  $X^1$ and $X^2$ each independently represent an oxygen atom or a sulfur atom,
  * each represents a bond with another structure, and
  $Z^+$ represents a monovalent radiation-sensitive onium cation.

Since the radiation-sensitive resin composition contains the onium salt compound having the structure represented by the above formula (1) (hereinafter, also referred to as "compound (1)") as a radiation-sensitive acid generator, the radiation-sensitive resin composition can exhibit excellent sensitivity, LWR performance, and CDU performance when forming a resist pattern. The reason for this is not bound by any theory, but can be expected as follows. By bonding an electron-withdrawing group to a carbon atom to which a sulfo group is bonded, a generated acid can be a strong acid, and by introducing an ester bond and two (thio) ether structures close to each other into a skeleton portion, the diffusion length of the acid and the affinity with a resin can be set to appropriate levels. By these synergistic effects, various given resist performances can be exhibited. It is to be noted that an organic group refers to a group containing at least one carbon atom.

The present invention relates to, in another embodiment, a method for forming a pattern, the method including:
  directly or indirectly applying the radiation-sensitive resin composition onto a substrate to form a resist film;
  exposing the resist film; and
  developing the exposed resist film with a developer.

The method for forming a resist pattern uses the above-described radiation-sensitive resin composition excellent in sensitivity, LWR performance, and CDU performance, and therefore a high-quality resist pattern can efficiently be formed.

Hereinbelow, embodiments of the present invention will be described in detail, but the present invention is not limited to these embodiments.

<Radiation-Sensitive Resin Composition>

A radiation-sensitive resin composition according to the present embodiment (hereinafter, also simply referred to as "composition") contains a compound (1) and a solvent. More suitably, the radiation-sensitive resin composition contains a resin, and contains an acid diffusion controlling agent as necessary. The composition may further contain other optional components as long as the effects of the present invention are not impaired. When the radiation-sensitive resin composition contains the compound (1) as a radiation-sensitive acid generator, high levels of sensitivity, LWR performance, and CDU performance can be imparted to the radiation-sensitive resin composition.

(Compound (1))

The compound (1) has a structure represented by the formula (1) (hereinafter, also referred to as "specific moiety structure"). The form of the compound (1) is not particularly limited as long as the compound (1) has the specific moiety structure. Examples thereof include a resin form in which the other structure to which the specific moiety structure is bonded is a resin (resin skeleton), and has the specific moiety structure as a part of the structure of the resin (hereinafter, the resin having the specific moiety structure is also referred to as "acid-generating resin"), and a compound form in which the other structure to which the specific moiety structure is bonded is an optional group, and has the specific moiety structure as a part of a low-molecular compound. When the composition contains the compound (1) in a resin form (when the compound (1) is the acid-generating resin), the composition may or may not contain a resin which is a suitable component to be described later. The acid generating resin is treated as the compound (1) as long as the acid generating resin has the specific moiety structure. When the compound (1) is in the compound form, the composition suitably contains a resin to be described later. The compound may have one specific moiety structure or two or more specific moiety structures in either the resin form or the compound form. When the compound has the two or more specific moiety structures, the plurality of specific moiety structures may be the same or different from each other. The compound (1) is preferably in the compound form.

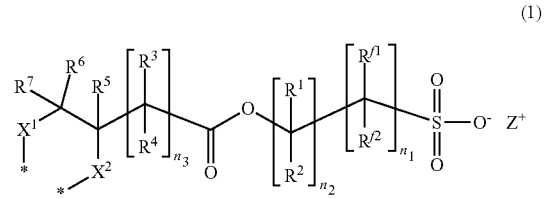

(1)

In the formula (1),
  $R^{f1}$ and $R^{f2}$ each independently represent a fluorine atom or a monovalent fluorinated hydrocarbon group having 1 to 20 carbon atoms,
  $R^1$ represents a hydrogen atom, a monovalent hydrocarbon group having 1 to 20 carbon atoms, a fluorine atom, or a monovalent fluorinated hydrocarbon group having 1 to 20 carbon atoms,
  $R^2$, $R^3$, $R^4$, $R^5$, $R^6$, and $R^7$ each independently represent a hydrogen atom or a monovalent hydrocarbon group having 1 to 20 carbon atoms,
  $n_1$ represents an integer of 0 to 4, when there are a plurality of $R^{f1}$s and $R^{f2}$s, the plurality of $R^{f1}$s and $R^{f2}$s are the same or different from each other,
  $n_2$ represents an integer of 0 to 4, when there are a plurality of $R^1$s and $R^2$s, the plurality of $R^1$s and $R^2$s are the same or different from each other,
  $n_1+n_2$ represents an integer of 2 to 8,
  $n_3$ represents an integer of 0 to 5, when there are a plurality of $R^3$s and $R^4$s, the plurality of $R^3$s and $R^4$s are the same as or different from each other,
  $X^1$ and $X^2$ each independently represent an oxygen atom or a sulfur atom,

* each represents a bond with another structure, and $Z^+$ represents a monovalent radiation-sensitive onium cation.

Examples of the monovalent fluorinated hydrocarbon group having 1 to 20 carbon atoms represented by $R^{f1}$ and $R^{f2}$ include a monovalent fluorinated chain hydrocarbon group having 1 to 20 carbon atoms and a monovalent fluorinated alicyclic hydrocarbon group having 3 to 20 carbon atoms.

Examples of the monovalent fluorinated chain hydrocarbon group having 1 to 20 carbon atoms include:

fluorinated alkyl groups such as a trifluoromethyl group, a 2,2,2-trifluoroethyl group, a pentafluoroethyl group, a 2,2,3,3,3-pentafluoropropyl group, a 1,1,1,3,3,3-hexafluoropropyl group, a heptafluoro-n-propyl group, a heptafluoro-i-propyl group, a nonafluoro-n-butyl group, a nonafluoro-i-butyl group, a nonafluoro-t-butyl group, a 2,2,3,3,4,4,5,5-octafluoro-n-pentyl group, a tridecafluoro-n-hexyl group, and a 5,5,5-trifluoro-1,1-diethylpentyl group;

fluorinated alkenyl groups such as a trifluoroethenyl group and a pentafluoropropenyl group; and fluorinated alkynyl groups such as a fluoroethynyl group and a trifluoropropynyl group.

Examples of the monovalent fluorinated alicyclic hydrocarbon group having 3 to 20 carbon atoms include:

fluorinated cycloalkyl groups such as a fluorocyclopentyl group, a difluorocyclopentyl group, a nonafluorocyclopentyl group, a fluorocyclohexyl group, a difluorocyclohexyl group, an undecafluorocyclohexylmethyl group, a fluoronorbornyl group, a fluoroadamantyl group, a fluorobornyl group, a fluoroisobornyl group, a fluorotricyclodecyl group, and a fluorotetracyclodecyl group; and fluorinated cycloalkenyl groups such as a fluorocyclopentenyl group and a nonafluorocyclohexenyl group.

The fluorinated hydrocarbon group is preferably a monovalent fluorinated chain hydrocarbon group having 1 to 20 carbon atoms, and more preferably a monovalent fluorinated chain hydrocarbon group having 1 to 10 carbon atoms. The monovalent fluorinated chain hydrocarbon group having 1 to 10 carbon atoms can be suitably employed among the monovalent fluorinated chain hydrocarbon groups having 1 to 20 carbon atoms.

$R^{f1}$ and $R^{f2}$ preferably represent a fluorine atom from the viewpoint of the degree of freedom of the peripheral structure of a sulfo group and the acidity of a generated acid.

Examples of the monovalent hydrocarbon group having 1 to 20 carbon atoms represented by $R^1$ include a monovalent chain hydrocarbon group having 1 to 20 carbon atoms, a monovalent alicyclic hydrocarbon group having 3 to 20 carbon atoms, and a monovalent aromatic hydrocarbon group having 6 to 20 carbon atoms.

Examples of the monovalent chain hydrocarbon group having 1 to 20 carbon atoms include a linear or branched saturated hydrocarbon group having 1 to 20 carbon atoms and a linear or branched unsaturated hydrocarbon group having 1 to 20 carbon atoms.

Examples of the alicyclic hydrocarbon group having 3 to 20 carbon atoms include a monocyclic or polycyclic saturated hydrocarbon group and a monocyclic or polycyclic unsaturated hydrocarbon group. Preferred examples of the monocyclic saturated hydrocarbon groups include a cyclopentyl group, a cyclohexyl group, a cycloheptyl group, and a cyclooctyl group. Preferred examples of the polycyclic cycloalkyl groups include bridged alicyclic hydrocarbon groups such as a norbornyl group, an adamantyl group, a tricyclodecyl group, and a tetracyclododecyl group. It is to be noted that the bridged alicyclic hydrocarbon group refers to a polycyclic alicyclic hydrocarbon group in which two carbon atoms that constitute an alicyclic ring and not adjacent to each other are bonded by a bonding chain containing at least one carbon atom.

Examples of the monovalent aromatic hydrocarbon group having 6 to 20 carbon atoms include:

aryl groups such as a phenyl group, a tolyl group, a xylyl group, a naphthyl group, and an anthryl group; and aralkyl groups such as a benzyl group, a phenethyl group, and a naphthylmethyl group.

As the monovalent fluorinated hydrocarbon group having 1 to 20 carbon atoms represented by $R^1$, the monovalent fluorinated hydrocarbon group having 1 to 20 carbon atoms exemplified in $R^{f1}$ and $R^{f2}$ can be suitably employed.

As the monovalent hydrocarbon group having 1 to 20 carbon atoms represented by $R^2$, $R^3$, $R^4$, $R^5$, $R^6$, and $R^7$, the monovalent hydrocarbon group having 1 to 20 carbon atoms exemplified in $R^1$ can be suitably employed.

It is preferable that $R^1$, $R^2$, $R^3$, $R^4$, $R^5$, $R^6$, and $R^7$ each independently represent a hydrogen atom, or a linear or branched saturated hydrocarbon group having 1 to 20 carbon atoms. In particular, $R^1$ and $R^2$ each preferably represent a hydrogen atom.

$n_1$ and $n_2$ each independently preferably represent an integer of 1 to 4, more preferably 1 to 3, and still more preferably 1 or 2. In particular, it is preferable that $n_1$ and $n_2$ each represent 1.

$n_1+n_2$ preferably represents an integer of 2 to 4, more preferably 2 or 3, and still more preferably 2.

$n_3$ preferably represents an integer of 0 to 3, more preferably an integer of 0 to 2, still more preferably 0 or 1, and particularly preferably 0.

It is preferable that $X^1$ and $X^2$ each represent an oxygen atom.

An example of the monovalent radiation-sensitive onium cation represented by $Z^+$ is a radioactive ray-degradable onium cation containing an element such as S, I, O, N, P, Cl, Br, F, As, Se, Sn, Sb, Te, or Bi. Examples of such a radioactive ray-degradable onium cation include a sulfonium cation, a tetrahydrothiophenium cation, a iodonium cation, a phosphonium cation, a diazonium cation, and a pyridinium cation. Among them, a sulfonium cation or a iodonium cation is preferred. The sulfonium cation or the iodonium cation is preferably represented by any of the following formulas (X-1) to (X-6).

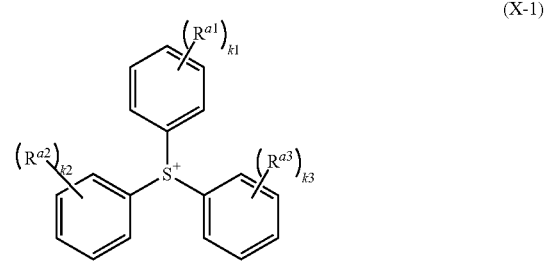

(X-1)

-continued

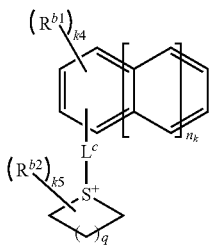
(X-2)

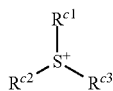
(X-3)

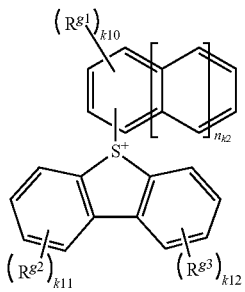
(X-4)

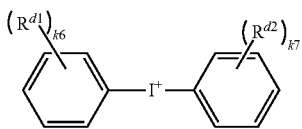
(X-5)

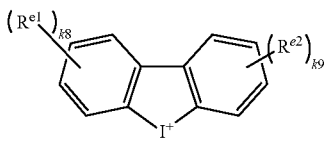
(X-6)

In the above formula (X-1), $R^{a1}$, $R^{a2}$ and $R^{a3}$ are each independently a substituted or unsubstituted, straight or branched chain alkyl group, alkoxy group or alkoxycarbonyloxy group having a carbon number of 1 to 12; a substituted or unsubstituted, monocyclic or polycyclic cycloalkyl group having a carbon number of 3 to 12; a substituted or unsubstituted aromatic hydrocarbon group having a carbon number of 6 to 12; a hydroxy group, a halogen atom, —OSO$_2$—R$^P$, —SO$_2$—R$^Q$ or —S—R$^T$; or a ring structure obtained by combining two or more of these groups. The ring structure may contain heteroatoms such as O and S between the carbon-carbon bonds forming the skeleton. R$^P$, R$^Q$ and R$^T$ are each independently a substituted or unsubstituted, straight or branched chain alkyl group having a carbon number of 1 to 12; a substituted or unsubstituted alicyclic hydrocarbon group having a carbon number of 5 to 25; and a substituted or unsubstituted aromatic hydrocarbon group having a carbon number of 6 to 12. k1, k2 and k3 are each independently an integer of 0 to 5. When there are a plurality of $R^{a1}$ to $R^{a3}$ and a plurality of R$^P$, R$^Q$ and R$^T$, a plurality of $R^{a1}$ to $R^{a3}$ and a plurality of R$^P$, R$^Q$ and R$^T$ may be each identical or different.

In the above formula (X-2), $R^{b1}$ is a substituted or unsubstituted, straight chain or branched alkyl group or alkoxy group having a carbon number of 1 to 20; a substituted or unsubstituted acyl group having a carbon number of 2 to 8; or a substituted or unsubstituted aromatic hydrocarbon group having a carbon number of 6 to 8; or a hydroxy group. $n_k$ is 0 or 1. When $n_k$ is 0, k4 is an integer of 0 to 4. When $n_k$ is 1, k4 is an integer of 0 to 7. When there are a plurality of $R^{b1}$, a plurality of $R^{b1}$ may be each identical or different. A plurality of $R^{b1}$ may represent a ring structure obtained by combining them. $R^{b2}$ is a substituted or unsubstituted, straight chain or branched alkyl group having a carbon number of 1 to 7; or a substituted or unsubstituted aromatic hydrocarbon group having a carbon number of 6 or 7. L$^C$ is a single bond or divalent linking group. k5 is an integer of 0 to 4. When there are a plurality of $R^{b2}$, a plurality of $R^{b2}$ may be each identical or different. A plurality of $R^{b2}$ may represent a ring structure obtained by combining them. q is an integer of 0 to 3. In the formula, the ring structure containing S$^+$ may contain a heteroatom such as O or S between the carbon-carbon bonds forming the skeleton.

In the above formula (X-3), $R^{c1}$, $R^{c2}$ and $R^{c3}$ are each independently a substituted or unsubstituted, straight or branched chain alkyl group having a carbon number of 1 to 12.

In the above formula (X-4), $R^{g1}$ is a substituted or unsubstituted linear or branched alkyl or alkoxy group having 1 to 20 carbon atoms, a substituted or unsubstituted acyl group having 2 to 8 carbon atoms, a substituted or unsubstituted aromatic hydrocarbon group having 6 to 8 carbon atoms, or a hydroxy group. $n_k$ is 0 or 1. When $n_{k2}$ is 0, k10 is an integer of 0 to 4, and when $n_{k2}$ is 1, k10 is an integer of 0 to 7. When there are two or more $R^{g1}$s, the two or more $R^{g1}$s are the same or different from each other, and may represent a cyclic structure formed by combining them together. $R^{g2}$ and $R^{g3}$ are each independently a substituted or unsubstituted linear or branched alkyl, alkoxy, or alkoxycarbonyloxy group having 1 to 12 carbon atoms, a substituted or unsubstituted monocyclic or polycyclic cycloalkyl group having 3 to 12 carbon atoms, a substituted or unsubstituted aromatic hydrocarbon group having 6 to 12 carbon atoms, a hydroxyl group, a halogen atom, or a ring structure formed by combining two or more of these groups together. K11 and k12 are each independently an integer of 0 to 4. When there are two or more $R^{g2}$s and two or more $R^{g3}$s, the two or more $R^{g2}$s may be the same or different from each other, and the two or more $R^{g3}$s may be the same or different from each other.

In the above formula (X-5), $R^{d1}$ and $R^{d2}$ are each independently a substituted or unsubstituted, straight or branched chain alkyl group, alkoxy group or alkoxycarbonyl group having a carbon number of 1 to 12; a substituted or unsubstituted aromatic hydrocarbon group having a carbon number of 6 to 12; a halogen atom; a halogenated alkyl group having a carbon number of 1 to 4; a nitro group; or a ring structure obtained by combining two or more of these groups. k6 and k7 are each independently an integer of 0 to 5. When there are a plurality of $R^{d1}$ and a plurality of $R^{d2}$, a plurality of $R^{d1}$ and a plurality of $R^{d2}$ may be each identical or different.

In the above formula (X-6), $R^{e1}$ and $R^{e2}$ are each independently a halogen atom; a substituted or unsubstituted straight or branched chain alkyl group having a carbon number of 1 to 12; or a substituted or unsubstituted aromatic hydrocarbon group having a carbon number of 6 to 12. k8 and k9 are each independently an integer of 0 to 4.

Specific examples of radiation-sensitive onium cations include, but are not limited to, structures represented by the following structures and the like.

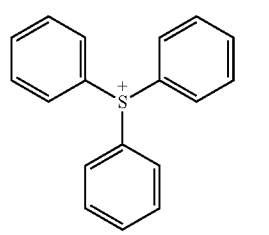
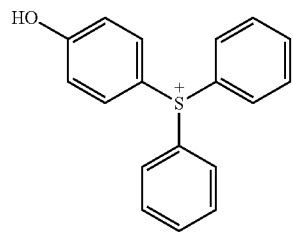
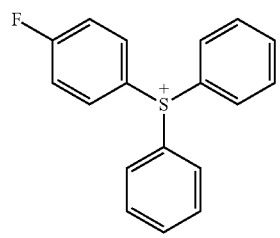
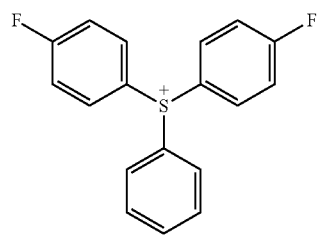
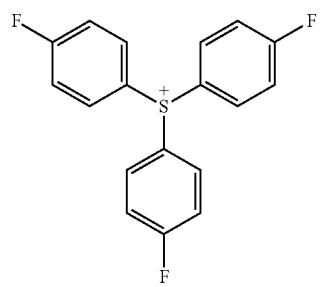
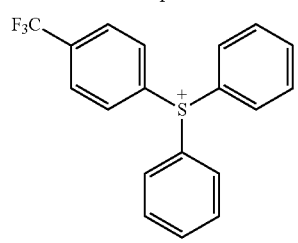
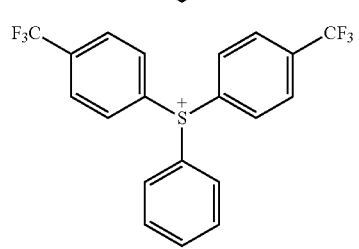
-continued
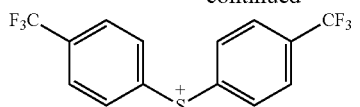
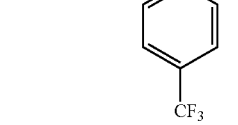
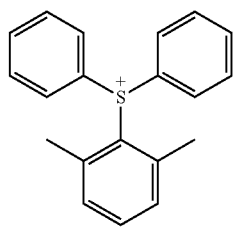
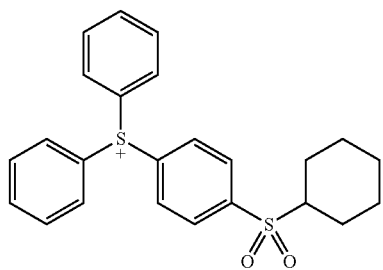
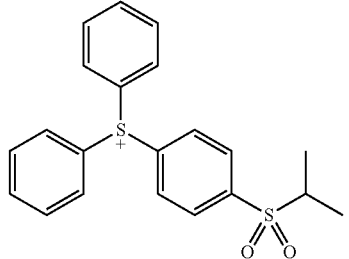
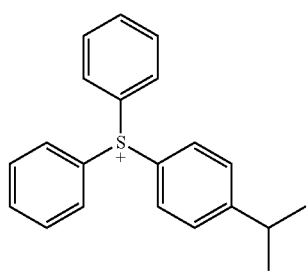
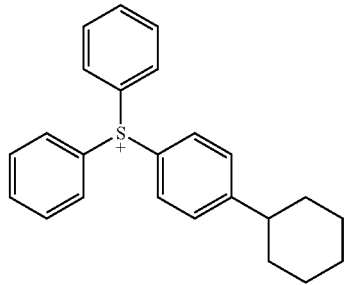

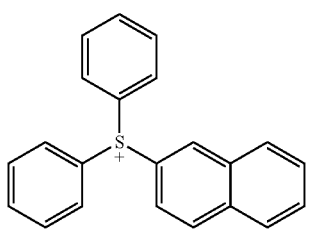
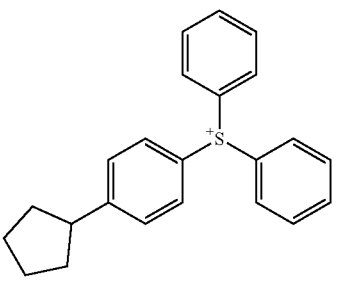
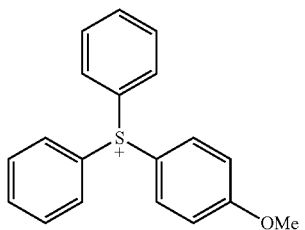
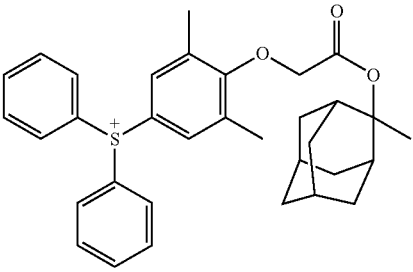
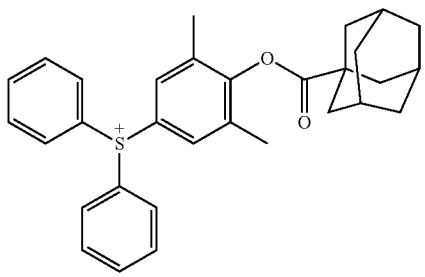
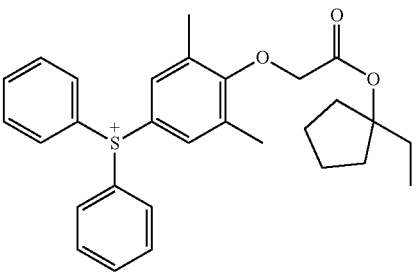
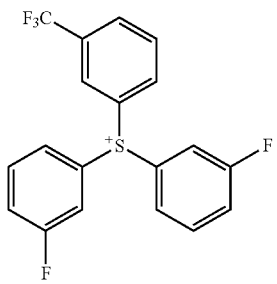
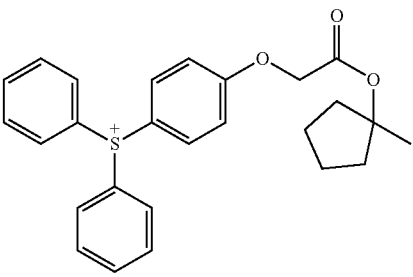
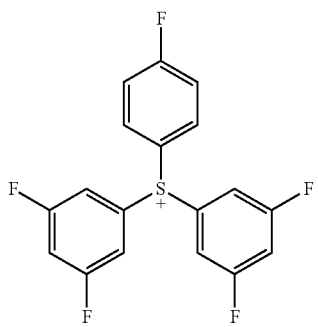
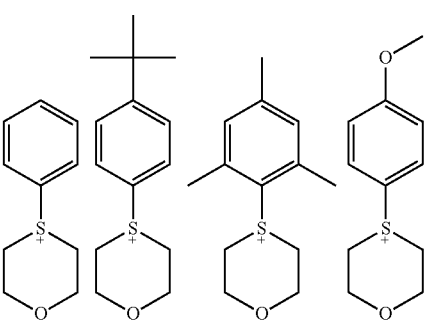
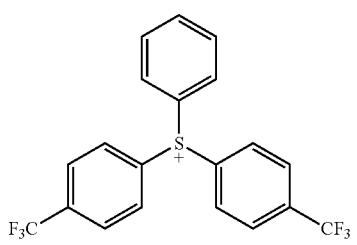
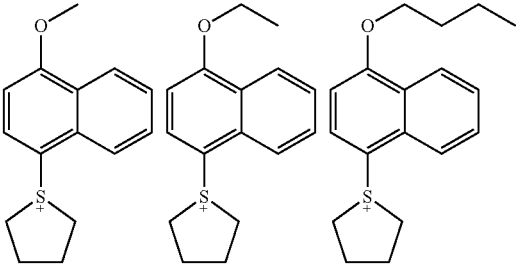

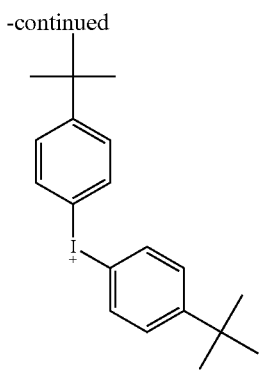

Examples of the compound (1) include a structure in which any anion moiety having a specific moiety structure is combined with any radiation-sensitive onium cation.

When the compound (1) is in the compound form, the compound is preferably an onium salt compound represented by the formula (1-1) (hereinafter, also referred to as "compound (1-1)") or an onium salt compound represented by the formula (1-2) (hereinafter, also referred to as "compound (1-2)").

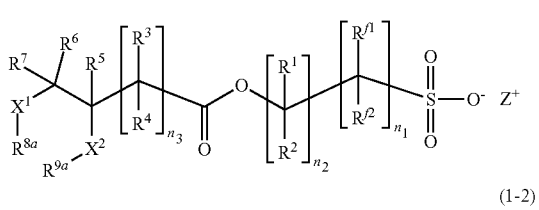

(1-1)

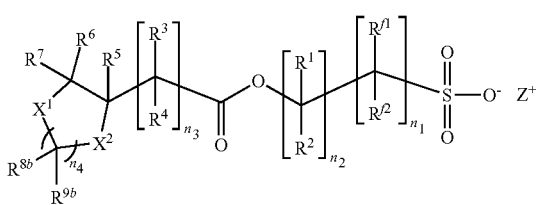

(1-2)

In the formulas (1-1) and (1-2), $R^{f1}$, $R^{f2}$, $R^1$, $R^2$, $R^3$, $R^4$, $R^5$, $R^6$, $R^7$, $n_1$, $n_2$, $n_3$, $X^1$, $X^2$, and $Z^+$ have the same meanings as those in the above formula (1), $R^{8a}$ and $R^{9a}$ each independently represent a monovalent organic group having 1 to 40 carbon atoms, $R^{8b}$ and $R^{9b}$ each independently represent a hydrogen atom or a monovalent organic group having 1 to 40 carbon atoms, or $R^{8b}$ and $R^{9b}$ each represent a ring structure having the number of ring members of 3 to 20 together with a carbon atom to which $R^{8b}$ and $R^{9b}$ are bonded, $n_4$ represents an integer of 1 to 4, and when there are a plurality of $R^{8b}$s and $R^{9b}$s, the plurality of $R^{8b}$s and $R^{9b}$s are the same or different from each other.

The monovalent organic group having 1 to 40 carbon atoms represented by $R^{8a}$, $R^{9a}$, $R^{8b}$, and $R^{9b}$ is not particularly limited, and may have a chain structure, a cyclic structure, or a combination thereof. Examples of the chain structure include chain hydrocarbon groups that may either be saturated or unsaturated and linear or branched. Examples of the cyclic structure include cyclic hydrocarbon groups that may be alicyclic, aromatic, or heterocyclic. Among them, the monovalent organic group is preferably a substituted or unsubstituted monovalent chain hydrocarbon group having 1 to 20 carbon atoms, a substituted or unsubstituted monovalent alicyclic hydrocarbon group having 3 to 20 carbon atoms, a substituted or unsubstituted monovalent aromatic hydrocarbon group having 6 to 20 carbon atoms, or a combination thereof. Other examples of the organic group include a group obtained by substituting a part or all of hydrogen atoms contained in a group having a chain structure or a group having a cyclic structure by a substituent and a group containing, between carbon atoms of such a group, CO, CS, O, S, $SO_2$, or NR' or a combination of two or more of them. R' represents a hydrogen atom or a monovalent hydrocarbon group having 1 to 10 carbon atoms.

Examples of the substituent that substitutes some or all of the hydrogen atoms of the organic group include halogen atoms such as a fluorine atom, a chlorine atom, a bromine atom, and an iodine atom; a hydroxy group; a carboxy group; a cyano group; a nitro group; an alkyl group, an alkoxy group, an alkoxycarbonyl group, an alkoxycarbonyloxy group, an acyl group, an acyloxy group, or a group in which a hydrogen atom of these groups has been substituted with a halogen atom; and an oxo group (=O).

Examples of the monovalent chain hydrocarbon group having 1 to 20 carbon atoms, the monovalent alicyclic hydrocarbon group having 3 to 20 carbon atoms, and the monovalent aromatic hydrocarbon group having 6 to 20 carbon atoms include the monovalent chain hydrocarbon group having 1 to 20 carbon atoms, the monovalent alicyclic hydrocarbon group having 3 to 20 carbon atoms, and the monovalent aromatic hydrocarbon group having 6 to 20 carbon atoms, which are exemplified in $R^1$ of the formula (1). Among them, the alicyclic hydrocarbon group is preferably a monovalent monocyclic alicyclic group having 3 to 10 carbon atoms or a monovalent polycyclic alicyclic group having 6 to 14 carbon atoms.

Examples of the heterocyclic cyclic hydrocarbon group include a group obtained by removing one hydrogen atom from an aromatic heterocyclic structure and a group obtained by removing one hydrogen atom from an alicyclic heterocyclic structure. A 5-membered aromatic structure having aromaticity and containing a hetero atom is also included in the heterocyclic structure. Examples of the hetero atom include an oxygen atom, a nitrogen atom, and a sulfur atom.

Examples of the aromatic heterocyclic structure include:
oxygen atom-containing aromatic heterocyclic structures such as furan, pyran, benzofuran, and benzopyran;
nitrogen atom-containing aromatic heterocyclic structures such as pyrrole, imidazole, pyridine, pyrimidine, pyrazine, indole, quinoline, isoquinoline, acridine, phenazine, and carbazole;
sulfur atom-containing aromatic heterocyclic structure such as thiophene; and aromatic heterocyclic structures containing a plurality of heteroatoms, such as thiazole, benzothiazole, thiazine, and oxazine.

Examples of the alicyclic heterocyclic structure include:

oxygen atom-containing alicyclic heterocyclic structures such as oxirane, tetrahydrofuran, tetrahydropyran, dioxolane, and dioxane;

nitrogen atom-containing alicyclic heterocyclic structures such as aziridine, pyrrolidine, piperidine, and piperazine;

sulfur atom-containing alicyclic heterocyclic structures such as thietane, thiolane, and thiane; and alicyclic heterocyclic structures containing a plurality of heteroatoms, such as morpholine, 1,2-oxathiolane, and 1,3-oxathiolane.

Examples of the cyclic structure include lactone structure, cyclic carbonate structure, and sultone structure. Examples of such structures include structures represented by the formulas (H-1) to (H-10).

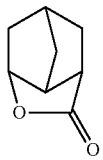 (H-1)

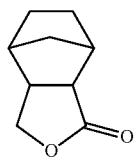 (H-2)

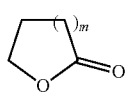 (H-3)

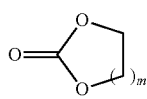 (H-4)

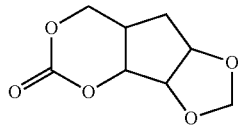 (H-5)

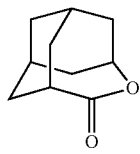 (H-6)

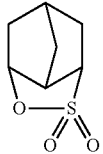 (H-7)

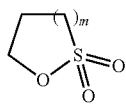 (H-8)

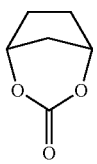 (H-9)

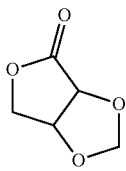 (H-10)

In the above formulas, m is an integer of 1 to 3.

The ring structure of the number of ring members of 3 to 20 composed of $R^{8b}$ and $R^{9b}$ together with a carbon atom to which $R^{8b}$ and $R^{9b}$ are bonded is preferably an alicyclic monocyclic structure having 3 to 10 carbon atoms, an alicyclic polycyclic structure having 6 to 14 carbon atoms, or an aromatic ring structure having 8 to 20 carbon atoms. The alicyclic monocyclic structure having 3 to 10 carbon atoms and the alicyclic polycyclic structure having 6 to 14 carbon atoms may be either a saturated hydrocarbon structure or an unsaturated hydrocarbon structure. The alicyclic polycyclic structure may be either a bridged alicyclic hydrocarbon structure or a condensed alicyclic hydrocarbon structure. The condensed alicyclic hydrocarbon structure refers to a polycyclic alicyclic hydrocarbon structure in which a plurality of alicyclic rings share a side (a bond between two adjacent carbon atoms).

Among the alicyclic monocyclic structures, the saturated hydrocarbon structure is preferably cyclopentane, cyclohexane, cycloheptane, or cyclooctane or the like, and the unsaturated hydrocarbon structure is preferably cyclopentene, cyclohexene, cycloheptene, cyclooctene, or cyclodecene or the like. The alicyclic polycyclic structure is preferably a bridged alicyclic saturated hydrocarbon structure, and preferably, for example, bicyclo[2.2.1]heptane(norbornane), bicyclo[2.2.2]octane, or tricyclo[3.3.1.1$^{3,7}$]decane adamantine) or the like.

Examples of the aromatic ring structure having 8 to 20 carbon atoms include indene, fluorene, and xanthene.

$n_4$ preferably represents an integer of 1 to 3, more preferably 1 or 2, and particularly preferably 1.

It is preferable that the compound (1) is represented by the formula (1-2), the $R^{f1}$ and $R^{f2}$ each independently represent a fluorine atom or a perfluoroalkyl group having 1 to 5 carbon atoms, $R^1$ and $R^2$ represent a hydrogen atom, $n^1$ and $n^2$ represent 1, $n^3$ represents 0, $n_4$ represents 1, and $X^1$ and $X^2$ represent an oxygen atom. When the compound (1) has the structure, sensitivity, LWR performance, and CDU performance can be improved.

Specific examples of the compound (1-1) include, but are not limited to, onium salt compounds represented by the following formulas (1-1-1) to (1-1-32) (hereinafter, the onium salt compounds represented by the following formulas (1-1-1) to (1-1-32) are also referred to as "compounds (1-1-1) to (1-1-32)").

(1-1-1)
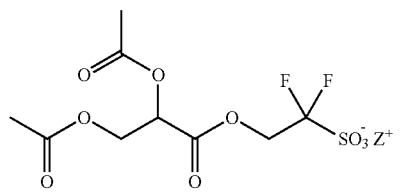
(1-1-2)
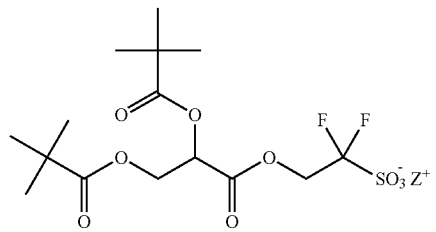
(1-1-3)
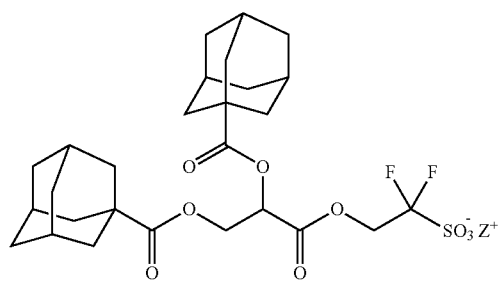
(1-1-4)
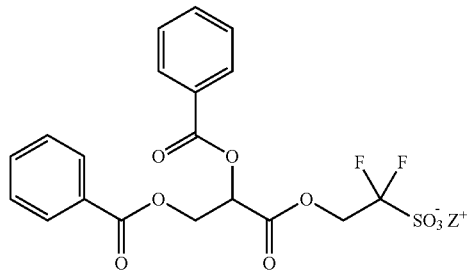
(1-1-5)
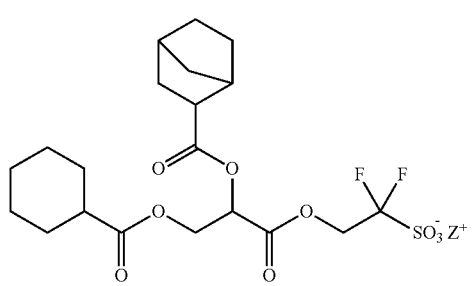
-continued
(1-1-6)
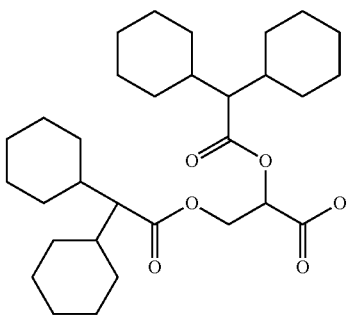
(1-1-7)
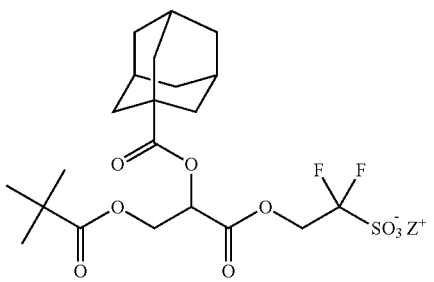
(1-1-8)
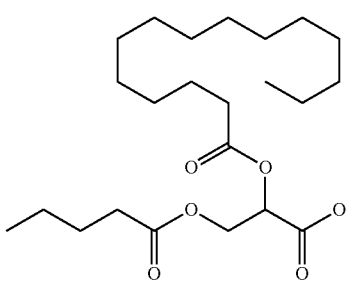
(1-1-9)
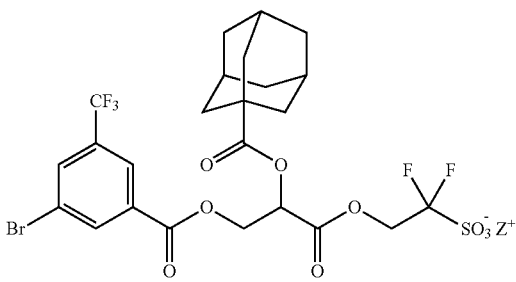
(1-1-10)
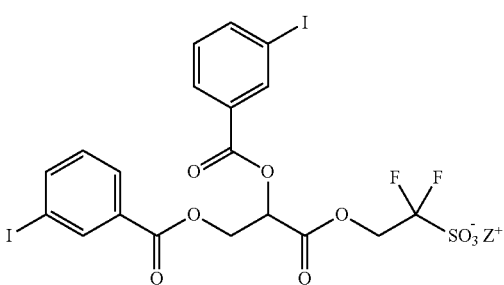

(1-1-11)
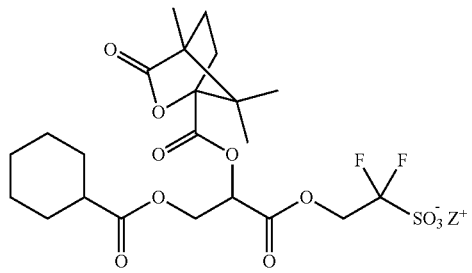
(1-1-16)
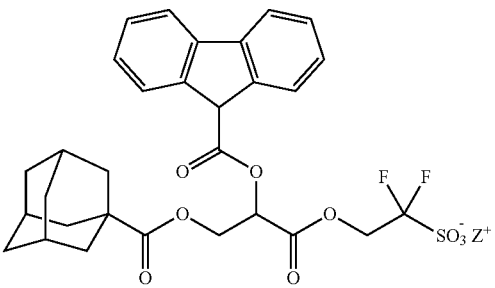
(1-1-12)
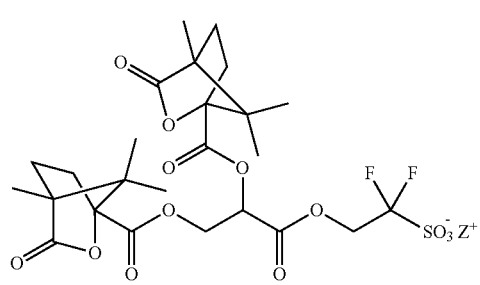
(1-1-17)
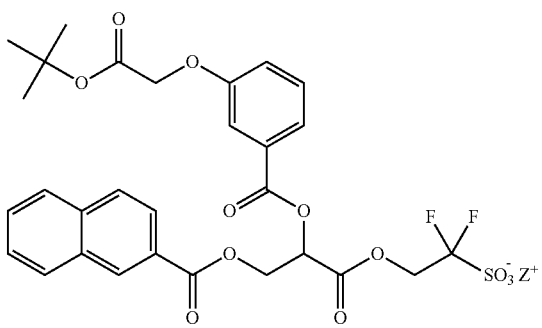
(1-1-13)
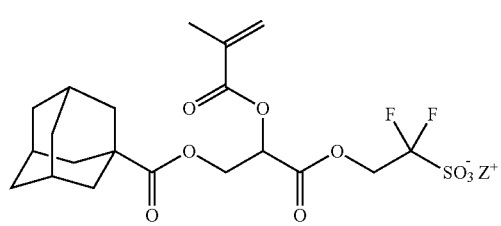
(1-1-18)
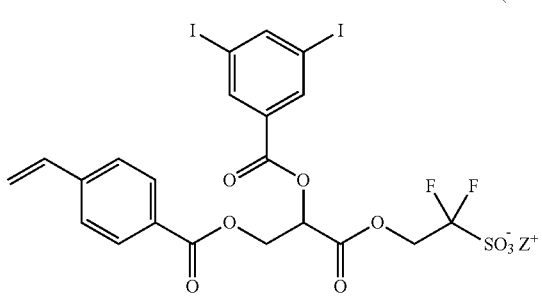
(1-1-14)
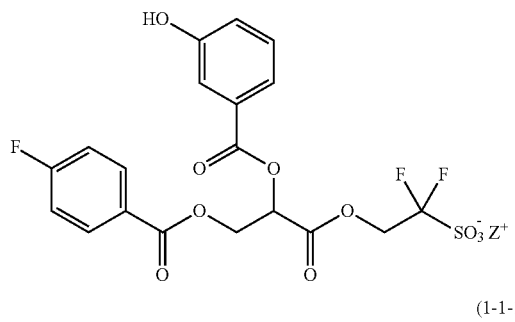
(1-1-19)
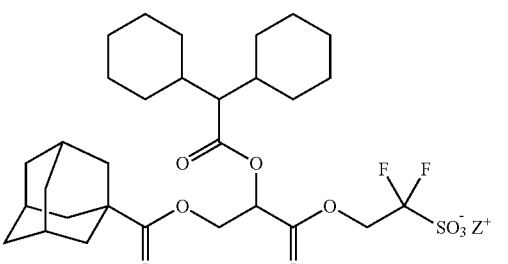
(1-1-15)
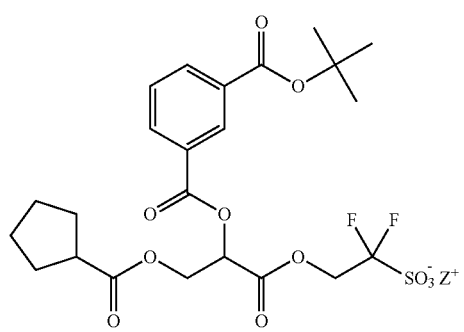
(1-1-20)
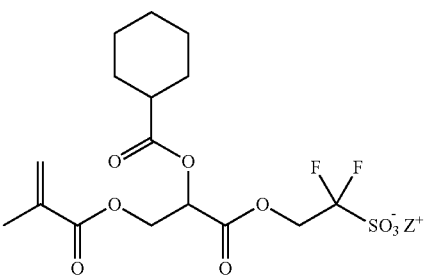

(1-1-21)
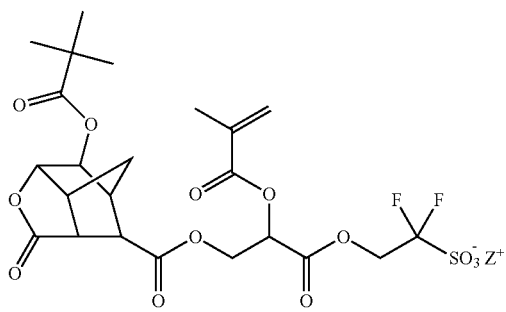
(1-1-22)
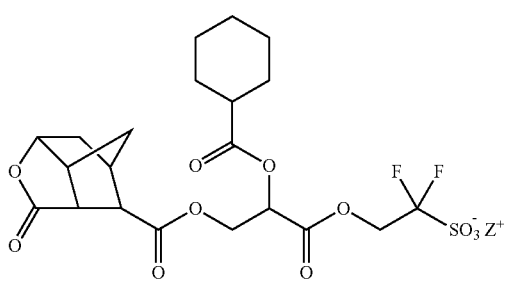
(1-1-23)
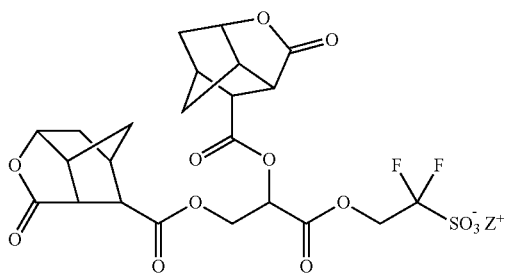
(1-1-24)
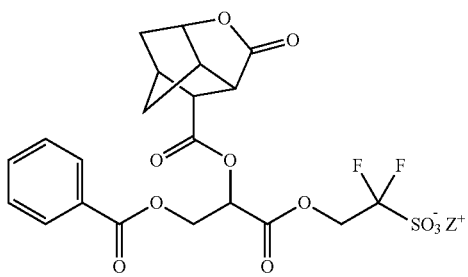
(1-1-25)
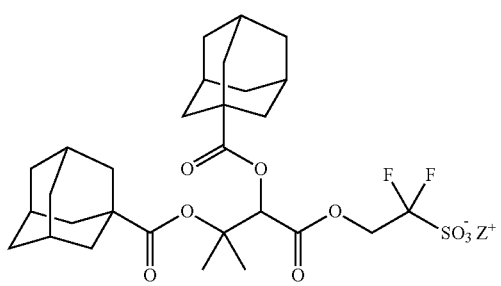
(1-1-26)
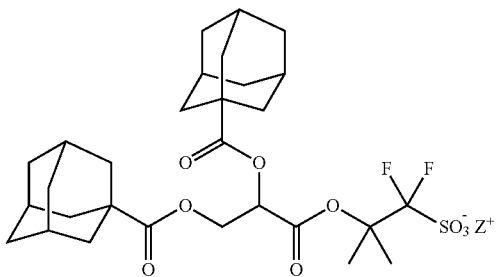
(1-1-27)
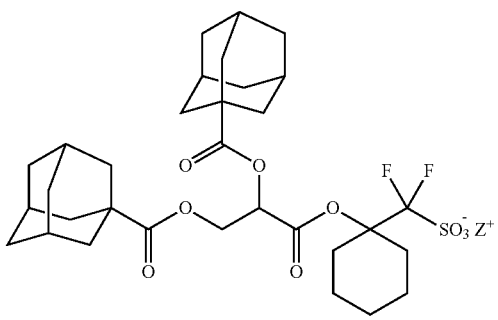
(1-1-28)
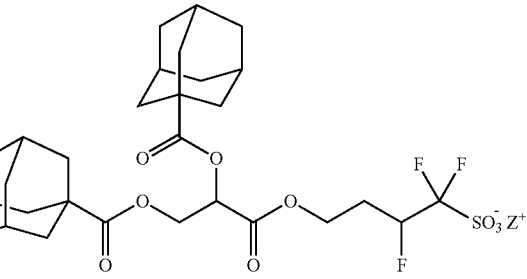
(1-1-29)
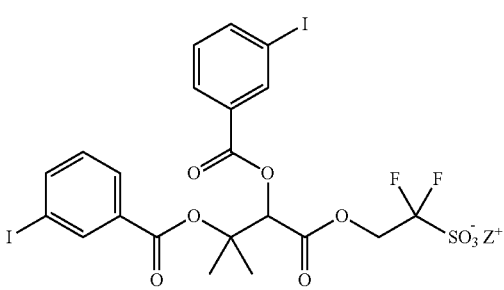
(1-1-30)
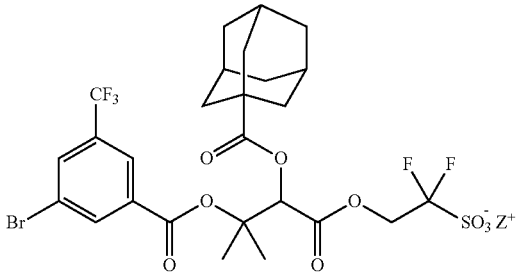

-continued
(1-1-31)
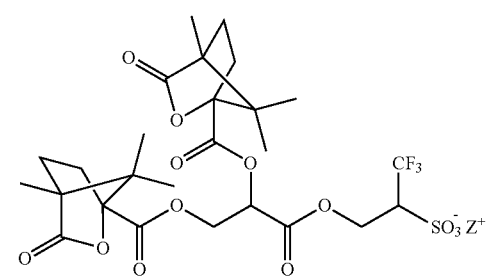
(1-1-32)
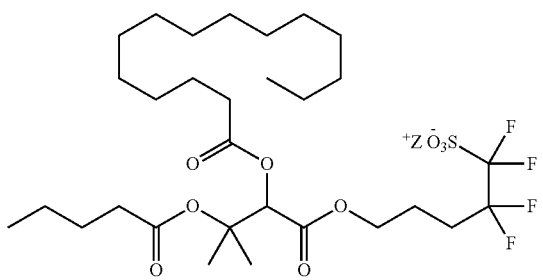
In the above formulas (1-1-1) to (1-1-32), $Z^+$ represents a radiation-sensitive onium cation.
Specific examples of the compound (1-2) include, but are not limited to, onium salt compounds represented by the following formulas (1-2-1) to (1-2-86) (hereinafter, the onium salt compounds represented by the following formulas (1-2-1) to (1-2-86) are also referred to as "compounds (1-2-1) to (1-2-86)").
(1-2-1)
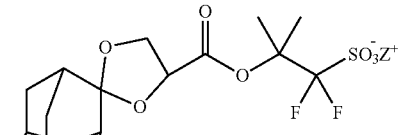
(1-2-2)
(1-2-3-)
(1-2-4)
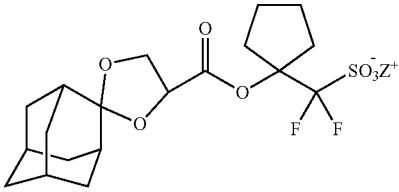
(1-2-5)
(1-2-6)
(1-2-7)
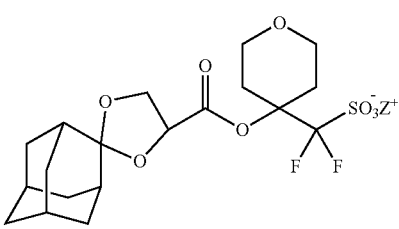
(1-2-8)
(1-2-9)
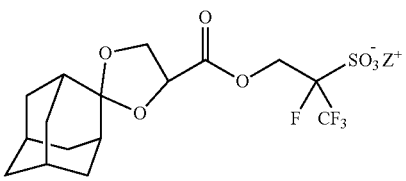
(1-2-10)
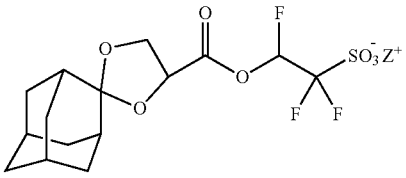
(1-2-11)
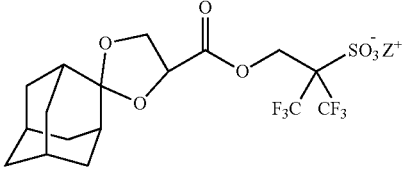
(1-2-12)
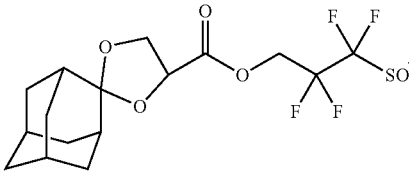
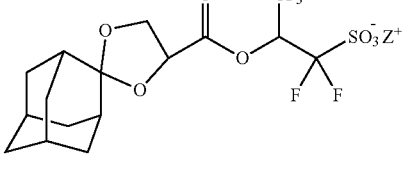

(1-2-13)
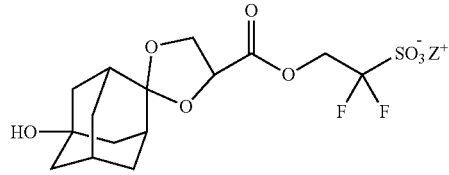
(1-2-14)
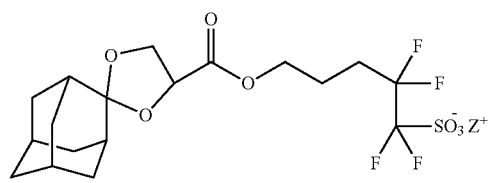
(1-2-15)
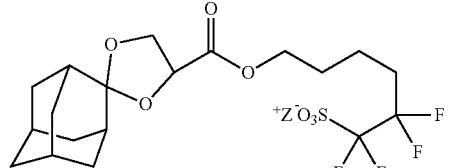
(1-2-16)
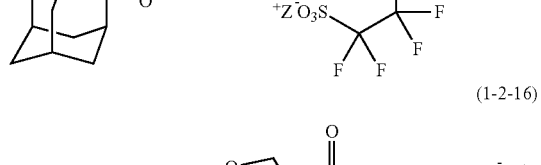
(1-2-17)
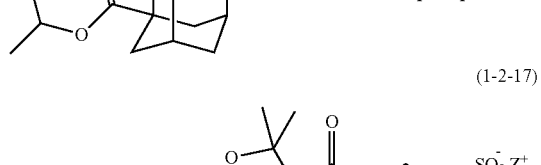
(1-2-18)
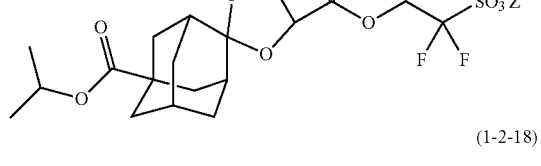
(1-2-19)
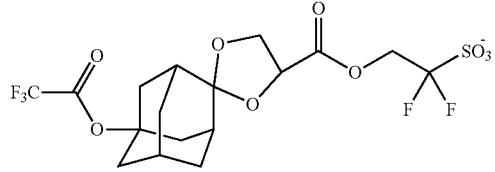
(1-2-20)
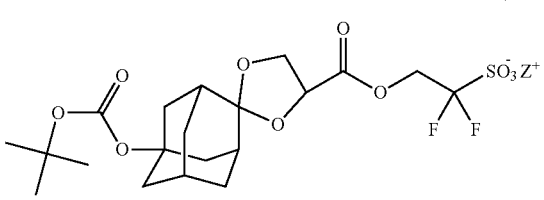
(1-2-21)
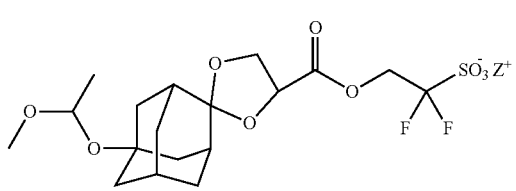
(1-2-22)
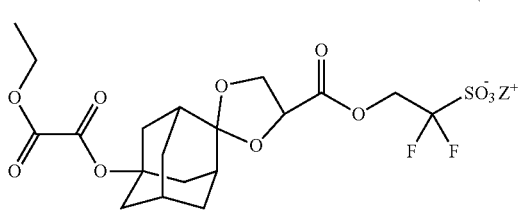
(1-2-23)
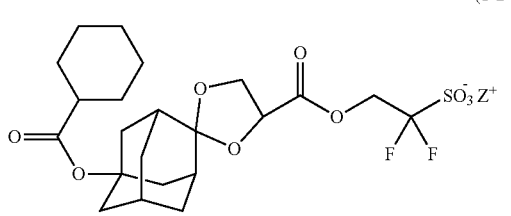
(1-2-24)
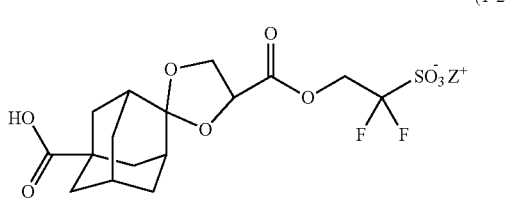
(1-2-25)
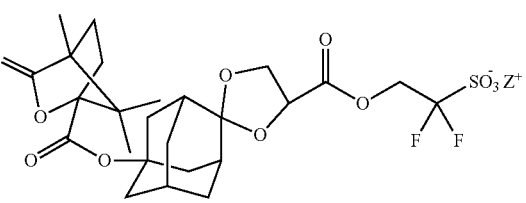
(1-2-26)
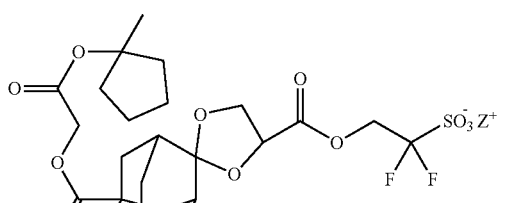
(1-2-27)
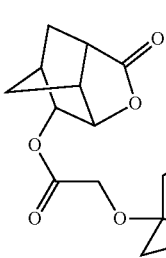
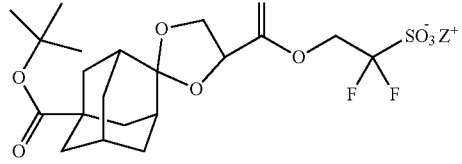

(1-2-28)
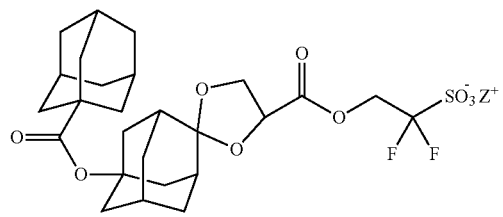
(1-2-29)
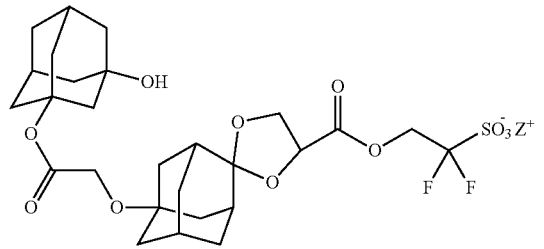
(1-2-30)
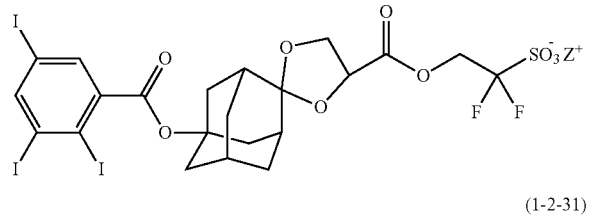
(1-2-31)
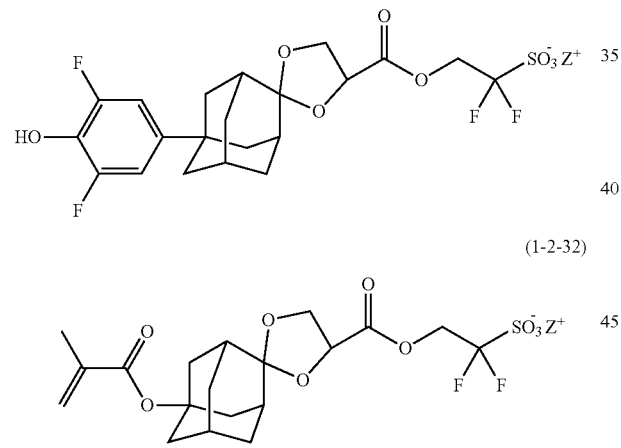
(1-2-32)
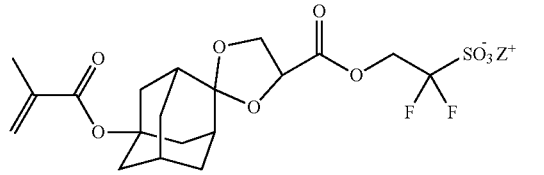
(1-2-33)
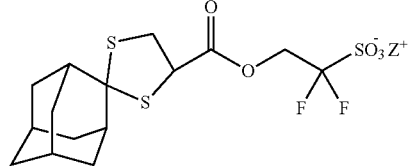
(1-2-34)
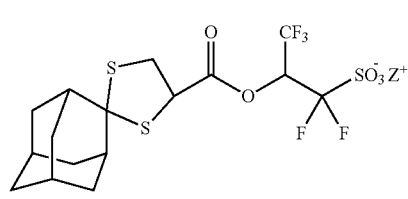
(1-2-35)
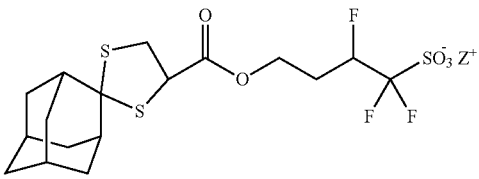
(1-2-36)
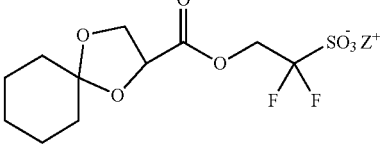
(1-2-37)
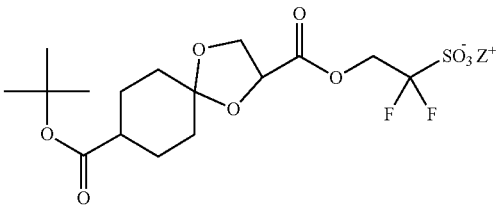
(1-2-38)
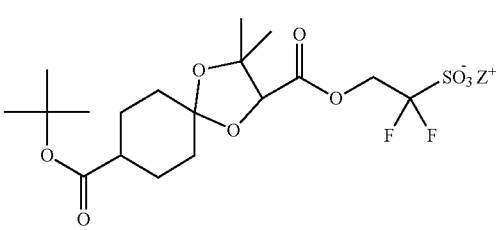
(1-2-39)
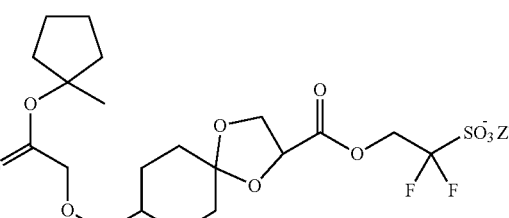
(1-2-40)
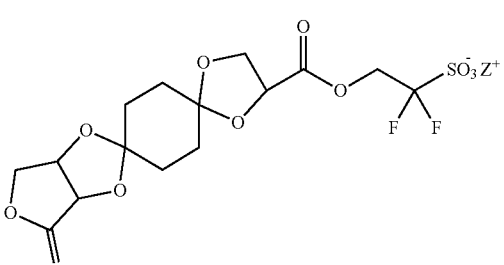
(1-2-41)
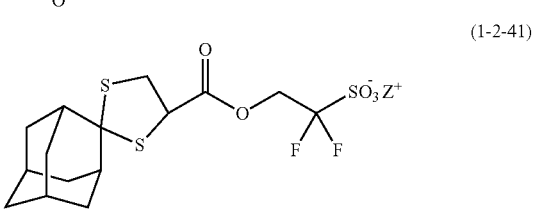

-continued (1-2-42)
(1-2-43)
(1-2-44)
(1-2-45)
(1-2-46)
(1-2-47)
(1-2-48)

(1-2-49)
(1-2-50)
(1-2-51)
(1-2-52)
(1-2-53)
(1-2-54)
(1-2-55)

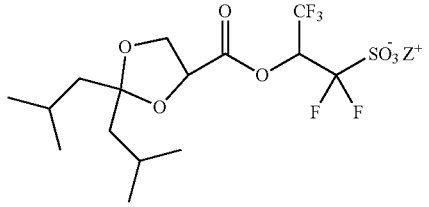
(1-2-56)
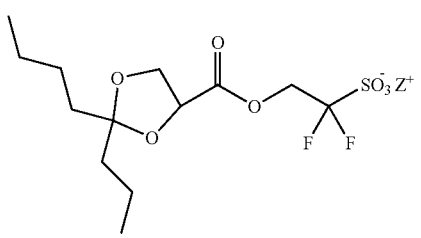
(1-2-57)
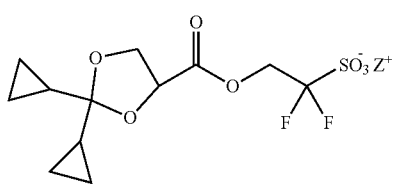
(1-2-58)
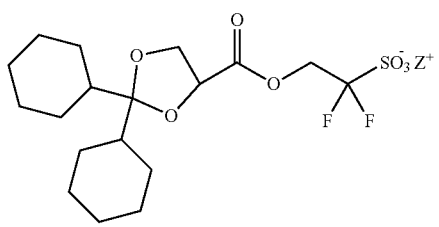
(1-2-59)
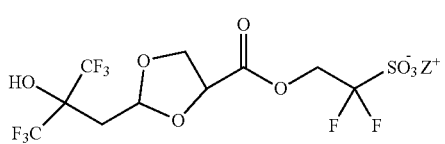
(1-2-60)
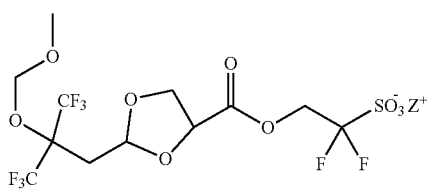
(1-2-61)
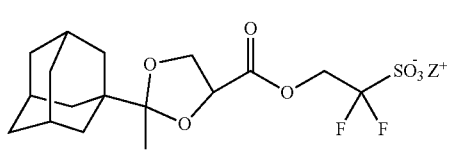
(1-2-62)
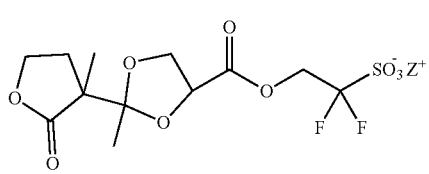
(1-2-63)
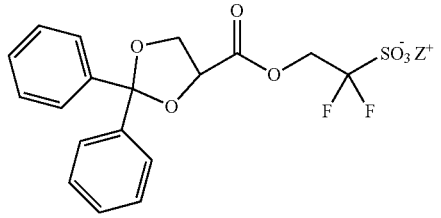
(1-2-64)
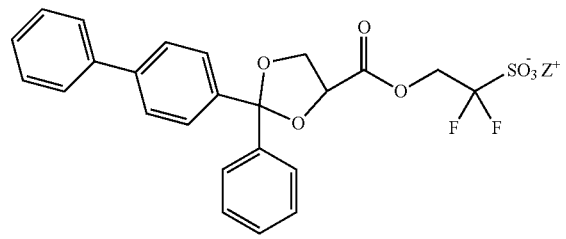
(1-2-65)
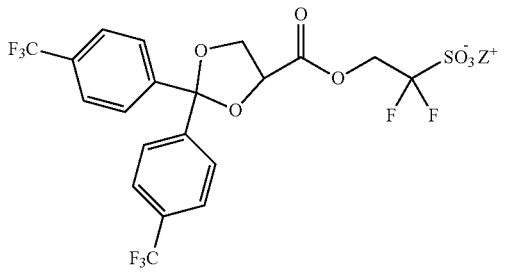
(1-2-66)
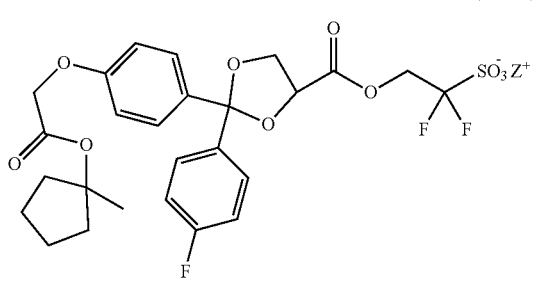
(1-2-67)
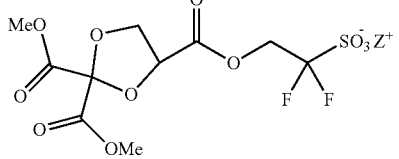
(1-2-68)
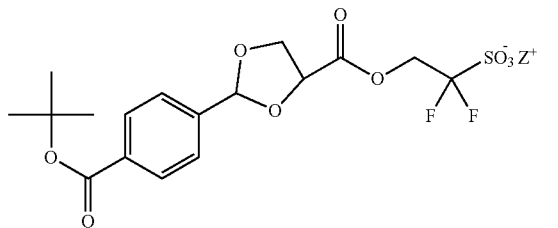
(1-2-69)

(1-2-70)
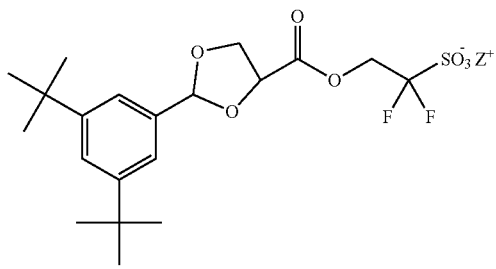
(1-2-71)
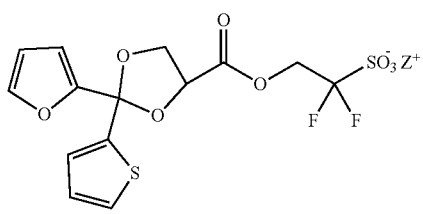
(1-2-72)
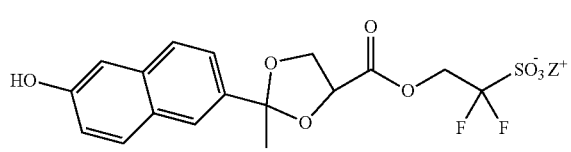
(1-2-73)
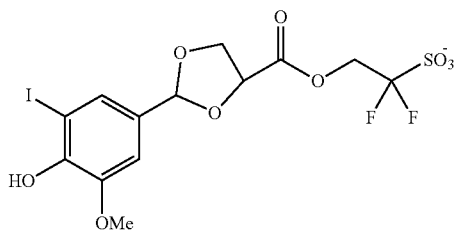
(1-2-74)
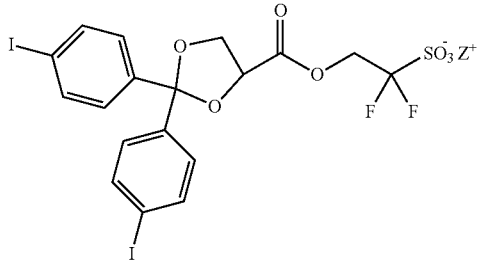
(1-2-75)
(1-2-76)
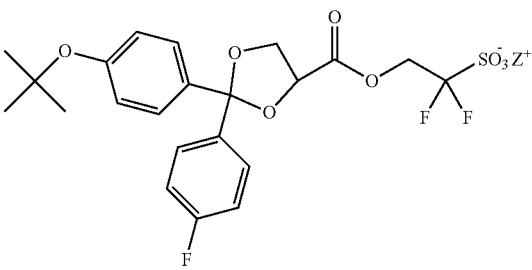
(1-2-77)
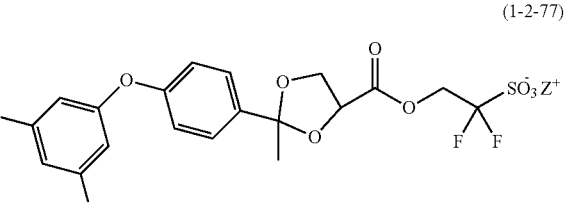
(1-2-78)
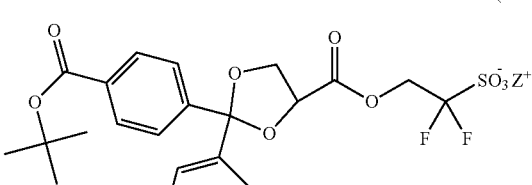
(1-2-79)
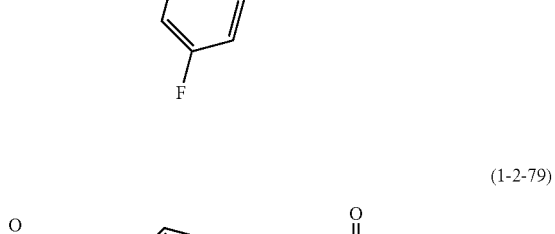
(1-2-80)
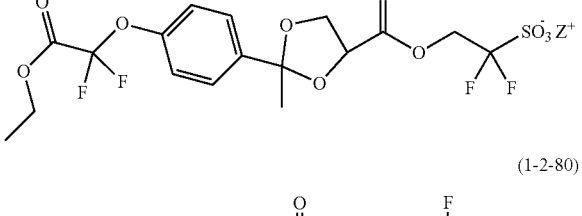
(1-2-81)
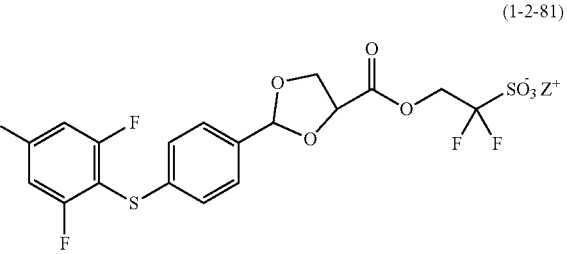

(1-2-82)

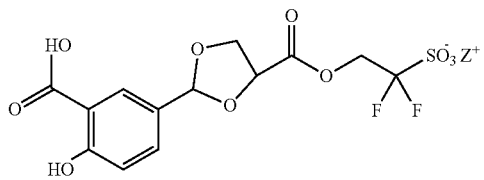

(1-2-83)

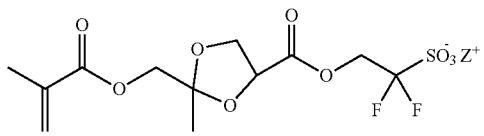

(1-2-84)

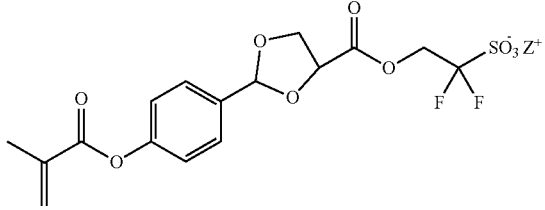

(1-2-85)

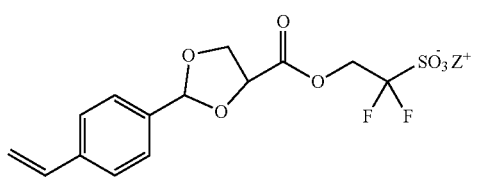

(1-2-86)

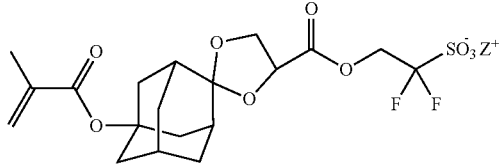

In the above formulas (1-2-1) to (1-2-86), $Z^+$ represents a radiation-sensitive onium cation.

The compounds (1-1-1) to (1-1-32) and the compounds (1-2-1) to (1-2-86) are onium salt compounds having one specific moiety structure. The compounds (1-2-80) and (1-2-83) to (1-2-86) are compounds which can also be subjected to a polymerization reaction, combined with other acrylic acid ester-based monomers and hydroxystyrene-based monomers and the like as necessary to give a resin form (acid generating resin) having a specific moiety structure as a part of a resin.

Examples of the onium salt compound having two specific moiety structures include compounds represented by the following formulas (1-3-1) to (1-3-2).

(1-3-1)

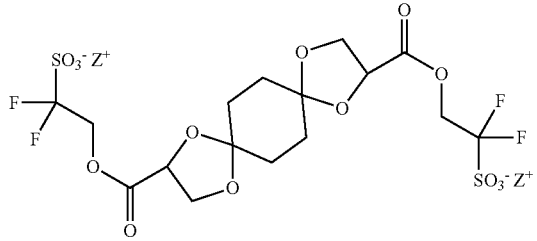

(1-3-2)

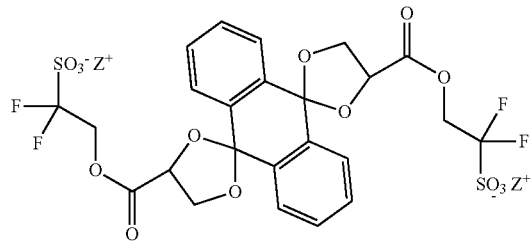

The content of the compound (1) in the compound form (in a case of combined use of the compounds (1), the total content thereof) is preferably 0.01 parts by mass or more, more preferably 0.05 parts by mass or more, still more preferably 0.1 parts by mass or more, and particularly preferably 0.5 parts by mass or more based on 100 parts by mass of the resin to be described later. The content is preferably 50 parts by mass or less, more preferably 40 parts by mass or less, and still more preferably 30 parts by mass or less. The content of the compound (1) in the resin form is an amount obtained by replacing the resin in the compound form with the acid-generating resin, and the content of other components may be defined as an amount based on 100 parts by mass of the acid-generating resin. The content of the compound (1) is appropriately selected depending on the type of the resin to be used, exposure conditions, required sensitivity, and the type and content of the radiation-sensitive acid generator to be described later. This makes it possible to exhibit excellent sensitivity, LWR performance, and CDU performance when forming a resist pattern.

(Synthesis Method of Compound (1))

As a method for synthesizing the compound (1), the compound (1-2) (in the formula (1-2), a case where $X^1$ and $X^2$ each represent an oxygen atom, and $n_4$ represents 1) will be described as an example. Typically, as shown in the following scheme, a dihydroxycarboxylic acid is first formed into an ester form, and a diol of the ester form is reacted with a ketone to form an acetal form. Subsequently, a desired compound (1-2a) can be synthesized by hydrolysis with an appropriate alkali (lithium hydroxide in the following scheme) to form a carboxylic acid form, and finally esterification with a hydroxyonium salt compound.

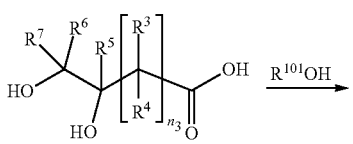

-continued

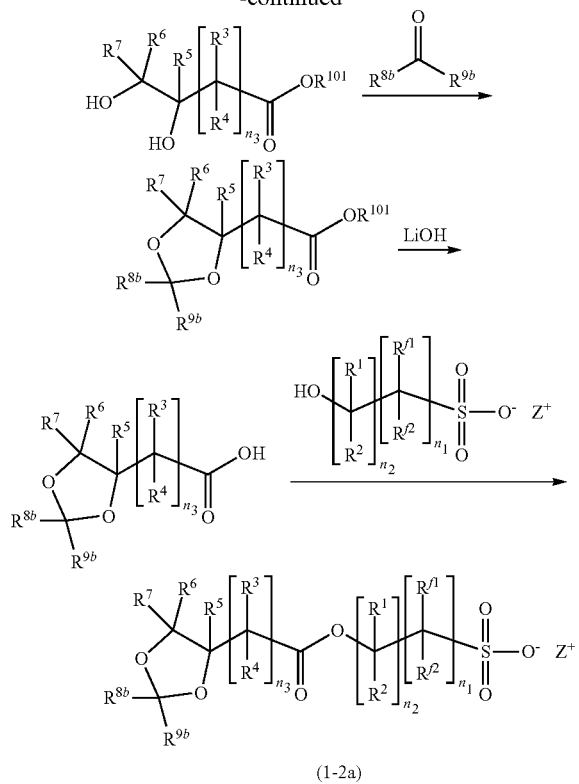

(1-2a)

In the above scheme, $R'^1$, $R'^2$, $R^1$, $R^2$, $R^3$, $R^4$, $R^5$, $R^6$, $R^7$, $R^{8b}$, $R^{9b}$, $n_1$, $n_2$, $n_3$, and $Z^+$ have the same meanings as those in the above formula (1). $R^{101}$ represents an alkyl group.

As a method for synthesizing the compound (1), the compound (1-1) (in the formula (1-1), a case where $X^1$ and $X^2$ each represent an oxygen atom, and $R^{8a}$ and $R^{9a}$ each represent an acyl group) will be described as an example. Typically, as shown in the following scheme, first, a diester form is formed from a hydroxy group of an ester form obtained in the synthesis scheme of the compound (1-2) and a carboxylic acid. Furthermore, the hydroxy group of the diester form and a carboxylic acid halide (chloride in the scheme) form a triester form. Subsequently, a desired compound (1-1a) can be synthesized by hydrolysis with an appropriate alkali (lithium hydroxide in the following scheme) to form a diester carboxylic acid form, and finally esterification with a hydroxyonium salt compound.

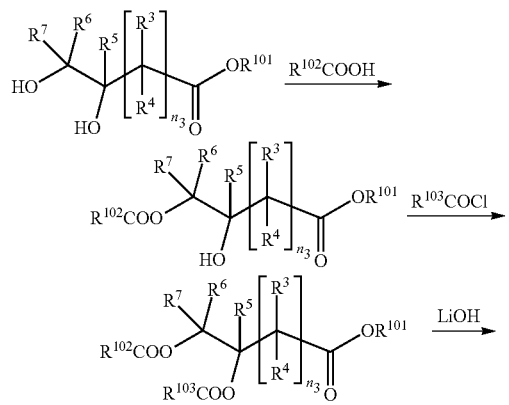

-continued

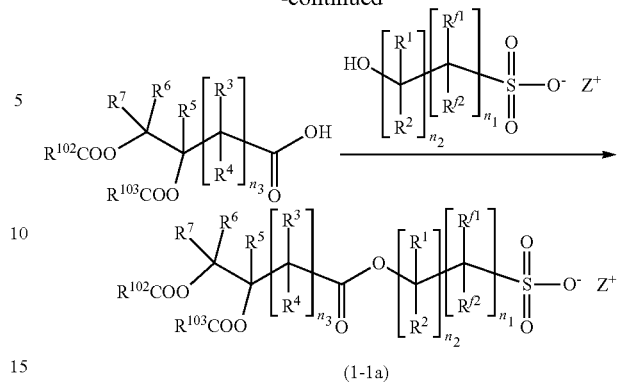

(1-1a)

In the above scheme, $R'^1$, $R'^2$, $R^1$, $R^2$, $R^3$, $R^4$, $R^5$, $R^6$, $R^7$, $n_1$, $n_2$, $n_3$, and $Z^+$ have the same meanings as those in the above formula (1). $R^{101}$ represents an alkyl group. $R^{102}$ and $R^{103}$ represent a monovalent organic group.

Similarly, the compound (1) having other structure can be synthesized by appropriately selecting precursors corresponding to the anion moiety and the onium cation moiety.

(Resin)

The resin is an aggregate of polymers having a structural unit (hereinafter, also referred to as "structural unit (I)") containing an acid-dissociable group (hereinafter, this resin is also referred to as "base resin"). The "acid-dissociable group" refers to a group that substitutes for a hydrogen atom of a carboxy group, a phenolic hydroxyl group, an alcoholic hydroxyl group, a sulfo group, or the like, and is dissociated by the action of an acid. The radiation-sensitive resin composition is excellent in pattern-forming performance because the resin has the structural unit (I).

In addition to the structural unit (I), the base resin preferably has a structural unit (II) containing at least one selected from the group consisting of a lactone structure, a cyclic carbonate structure, and a sultone structure described later, and may have another structural unit other than the structural units (I) and (II). Each of the structural units will be described below.

[Structural Unit (I)]

The structural unit (I) contains an acid-dissociable group. The structural unit (I) is not particularly limited as long as it contains an acid-dissociable group. Examples of such a structural unit (I) include a structural unit having a tertiary alkyl ester moiety, a structural unit having a structure obtained by substituting the hydrogen atom of a phenolic hydroxyl group with a tertiary alkyl group, and a structural unit having an acetal bond. From the viewpoint of improving the pattern-forming performance of the radiation-sensitive resin composition, a structural unit represented by the following formula (3) (hereinafter also referred to as a "structural unit (I-1)") is preferred.

(3)

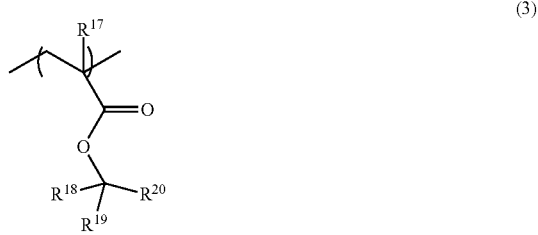

(In the above formula (3), $R^{17}$ is a hydrogen atom, a fluorine atom, a methyl group, or a trifluoromethyl group, $R^{18}$ is a monovalent hydrocarbon group having 1 to 20 carbon atoms, $R^{19}$ and $R^{20}$ are each independently a monovalent chain hydrocarbon group having 1 to 10 carbon atoms or a monovalent alicyclic hydrocarbon group having 3 to 20 carbon atoms or represent a divalent alicyclic group having 3 to 20 carbon atoms formed by these groups combined together and a carbon atom to which they are bonded.

From the viewpoint of copolymerizability of a monomer that will give the structural unit (I-1), $R^{17}$ is preferably a hydrogen atom or a methyl group, more preferably a methyl group.

Examples of the monovalent hydrocarbon group having 1 to 20 carbon atoms represented by $R^{18}$ include a chain hydrocarbon group having 1 to 10 carbon atoms, a monovalent alicyclic hydrocarbon group having 3 to 20 carbon atoms, and a monovalent aromatic hydrocarbon group having 6 to 20 carbon atoms.

Examples of the chain hydrocarbon groups having 1 to 10 carbon atoms represented by $R^{18}$ to $R^{20}$ include linear or branched saturated hydrocarbon groups having 1 to 10 carbon atoms and linear or branched unsaturated hydrocarbon groups having 1 to 10 carbon atoms.

Examples of the alicyclic hydrocarbon groups having 3 to 20 carbon atoms represented by $R^{18}$ to $R^{20}$ include monocyclic or polycyclic saturated hydrocarbon groups and monocyclic or polycyclic unsaturated hydrocarbon groups. Preferred examples of the monocyclic saturated hydrocarbon groups include a cyclopentyl group, a cyclohexyl group, a cycloheptyl group, and a cyclooctyl group. Preferred examples of the polycyclic saturated hydrocarbon groups include bridged alicyclic hydrocarbon groups such as a norbornyl group, an adamantyl group, a tricyclodecyl group, and a tetracyclododecyl group. It is to be noted that the bridged alicyclic hydrocarbon group refers to a polycyclic alicyclic hydrocarbon group in which two carbon atoms that constitute an alicyclic ring and not adjacent to each other are bonded by a bonding chain containing at least one carbon atom.

Examples of the monovalent aromatic hydrocarbon group having 6 to 20 carbon atoms represented by $R^{18}$ include: aryl groups such as a phenyl group, a tolyl group, a xylyl group, a naphthyl group, and an anthryl group; and aralkyl groups such as a benzyl group, a phenethyl group, and a naphthylmethyl group.

$R^{18}$ is preferably a linear or branched saturated hydrocarbon group having 1 to 10 carbon atoms or an alicyclic hydrocarbon group having 3 to 20 carbon atoms.

The divalent alicyclic group having 3 to 20 carbon atoms formed by $R^{19}$ and $R^{20}$ combined together and a carbon atom to which a chain hydrocarbon group or an alicyclic hydrocarbon group represented by $R^9$ and a chain hydrocarbon group or an alicyclic hydrocarbon group represented by $R^{10}$ are bonded is not particularly limited as long as it is a group obtained by removing two hydrogen atoms from the same carbon atom constituting a carbon ring of a monocyclic or polycyclic alicyclic hydrocarbon having the above-described carbon number. The divalent alicyclic group having 3 to 20 carbon atoms may either be a monocyclic hydrocarbon group or a polycyclic hydrocarbon group. The polycyclic hydrocarbon group may either be a bridged alicyclic hydrocarbon group or a condensed alicyclic hydrocarbon group and may either be a saturated hydrocarbon group or an unsaturated hydrocarbon group. It is to be noted that the condensed alicyclic hydrocarbon group refers to a polycyclic alicyclic hydrocarbon group in which two or more alicyclic rings share their sides (bond between two adjacent carbon atoms).

When the monocyclic alicyclic hydrocarbon group is a saturated hydrocarbon group, preferred examples thereof include a cyclopentanediyl group, a cyclohexanediyl group, a cycloheptanediyl group, and a cyclooctanediyl group. When the monocyclic alicyclic hydrocarbon group is an unsaturated hydrocarbon group, preferred examples thereof include a cyclopentenediyl group, a cyclohexenediyl group, a cycloheptenediyl group, a cyclooctenediyl group, and a cyclodecenediyl group. The polycyclic alicyclic hydrocarbon group is preferably a bridged alicyclic saturated hydrocarbon group, and preferred examples thereof include a bicyclo[2.2.1]heptane-2,2-diyl group (norbornane-2,2-diyl group), a bicyclo[2.2.2]octane-2,2-diyl group, and a tricyclo[3.3.1.1$^{3,7}$]decane-2,2-diyl group (adamantane-2,2-diyl group).

Among them, $R^{18}$ is preferably an alkyl group having 1 to 4 carbon atoms, and the alicyclic structure formed by $R^{19}$ and $R^{20}$ combined together and a carbon atom to which they are bonded is preferably a polycyclic or monocyclic cycloalkane structure.

Examples of the structural unit (I-1) include structural units represented by the following formulas (3-1) to (3-6) (hereinafter also referred to as "structural units (I-1-1) to (I-1-6)").

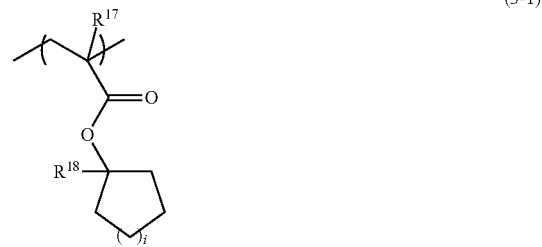

(3-1)

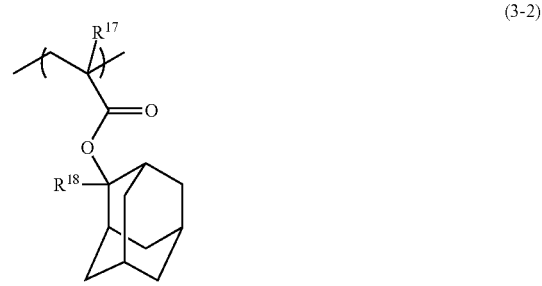

(3-2)

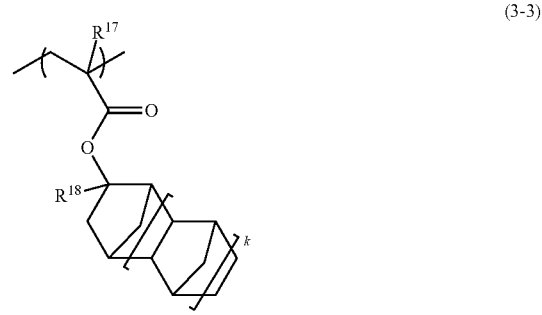

(3-3)

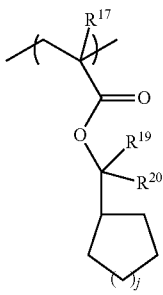

(3-4)

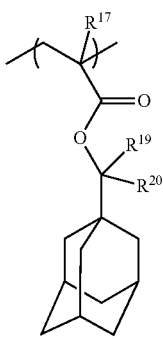

(3-5)

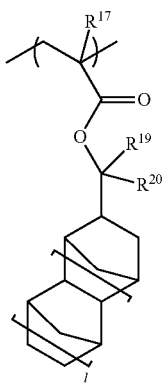

(3-6)

In the above formulas (3-1) to (3-6), $R^{17}$ to $R^{20}$ have the same meaning as in the above formula (3), i and j are each independently an integer of 1 to 4, and k and l are each 0 or 1.

In the above formulas (3-1) to (3-6), i and j are preferably 1, and $R^{18}$ is preferably a methyl group, an ethyl group, or an isopropyl group. $R^{19}$ and $R^{20}$ are each preferably a methyl group, or an ethyl group The base resin may contain one type or a combination of two or more types of the structural units (I).

The lower limit of the content (total content, if multiple types are included) of the structural unit (I) is preferably 10 mol %, more preferably 20 mol %, even more preferably 30 mol %, particularly preferably 35 mol % with respect to the total amount of the structural units constituting the base resin. The upper limit of the content is preferably 80 mol %, more preferably 75 mol %, even more preferably 70 mol %, particularly preferably 65 mol %. When the content of the structural unit (I) is set to fall within the above range, the pattern-forming performance of the radiation-sensitive resin composition can further be improved.

[Structural Unit (II)]

The structural unit (II) is a structural unit including at least one selected from the group consisting of a lactone structure, a cyclic carbonate structure and a sultone structure. The solubility of the base resin into a developer can be adjusted by further introducing the structural unit (II). As a result, the radiation-sensitive resin composition can provide improved lithography properties such as the resolution. The adhesion between a resist pattern formed from the base resin and a substrate can also be improved.

Examples of the structural unit (II) include structural units represented by the following formulae (T-1) to (T-10).

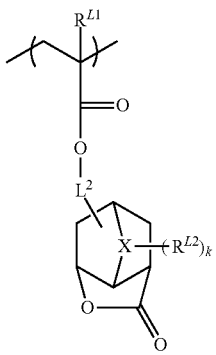

(T-1)

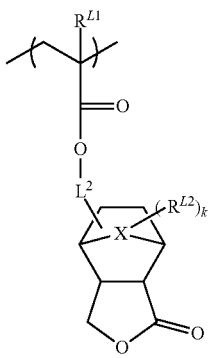

(T-2)

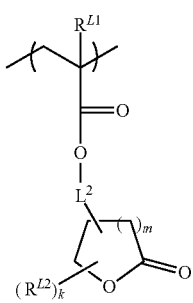

(T-3)

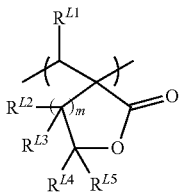

(T-4)

(T-5) 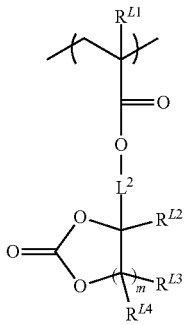

(T-6) 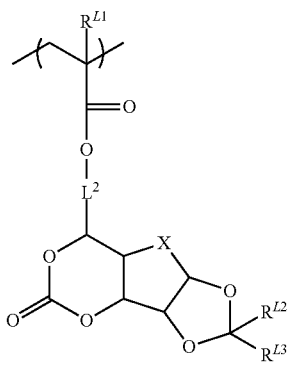

(T-7) 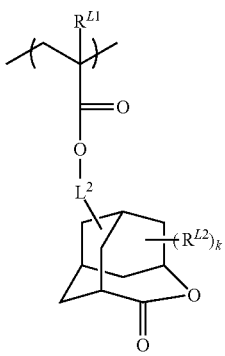

(T-8) 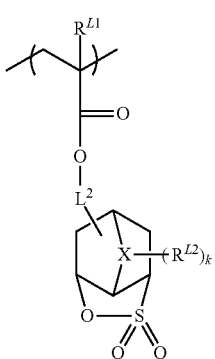

(T-9) 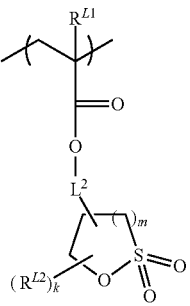

(T-10) 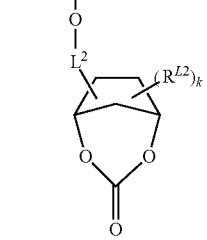

In the above formulae, $R^{L1}$ is a hydrogen atom, a fluorine atom, a methyl group, or a trifluoromethyl group; $R^{L2}$ to $R^{L5}$ are each independently a hydrogen atom, an alkyl group having a carbon number of 1 to 4, a cyano group, a trifluoromethyl group, a methoxy group, a methoxycarbonyl group, a hydroxy group, a hydroxymethyl group, or a dimethylamino group; $R^{L4}$ and $R^{L5}$ may be a divalent alicyclic group having a carbon number of 3 to 8, which is obtained by combining $R^{L4}$ and $R^{L5}$ with the carbon atom to which they are bound. $L^2$ is a single bond, or a divalent linking group; X is an oxygen atom or a methylene group; k is an integer of 0 to 3; and m is an integer of 1 to 3.

Example of the divalent alicyclic group having a carbon number of 3 to 8, which is composed of a combination of $R^{L4}$ and $R^{L5}$ with the carbon atom to which they are bound, includes the divalent alicyclic group having a carbon number of 3 to 8 in the divalent alicyclic group having a carbon number of 3 to 20, which is composed of a combination of the chain hydrocarbon group or the alicyclic hydrocarbon group represented by $R^{19}$ and $R^{20}$ in the above formula (3) with the carbon atom to which they are bound. One or more hydrogen atoms on the alicyclic group may be substituted with a hydroxy group.

Examples of the divalent linking group represented by $L^2$ as described above include a divalent straight or branched chain hydrocarbon group having a carbon number of 1 to 10; a divalent alicyclic hydrocarbon group having a carbon number of 4 to 12; and a group composed of one or more of the hydrocarbon group thereof and at least one group of —CO—, —O—, —NH— and —S—.

Among them, the structural unit (II) is preferably a group having a lactone structure, more preferably a group having a norbornane lactone structure, and further preferably a group derived from a norbornane lactone-yl (meth)acrylate.

The lower limit of the content by percent of the structural unit (II) is preferably 20 mol %, more preferably 30 mol %, and further preferably 35 mol % based on the total structural units as the component of the base resin. The upper limit of the content by percent is preferably 75 mol %, more preferably 70 mol %, and further preferably 65 mol %. By adjusting the content by percent of the structural unit D within the ranges, the radiation-sensitive resin composition can provide improved lithography properties such as the resolution. The adhesion between the formed resist pattern and the substrate can also be improved.

[Structural Unit (III)]

The base resin optionally has another structural unit in addition to the structural units (I) and (II). Another structural unit includes a structural unit (III) containing a polar group (excluding those corresponding to the structural unit (II)). When the base resin further has a structural unit (III), solubility in the developer can be adjusted. As a result, lithographic performance such as resolution of the radiation-sensitive resin composition can be improved. Examples of the polar group include a hydroxy group, a carboxy group, a cyano group, a nitro group, and a sulfonamide group. Among them, a hydroxy group and a carboxy group are preferable, and a hydroxy group is more preferable.

Examples of the structural unit (III) include structural units represented by the following formulas.

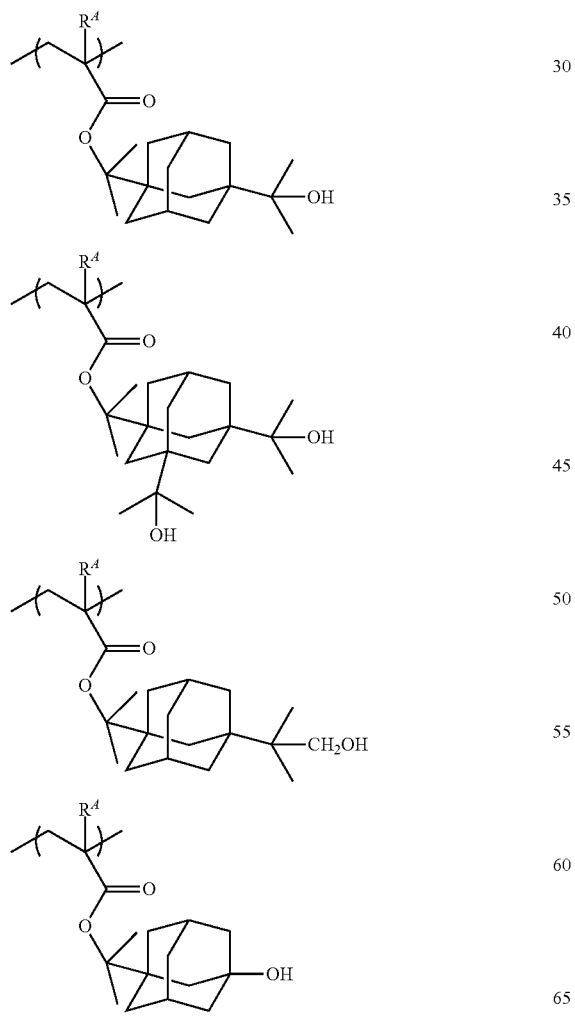
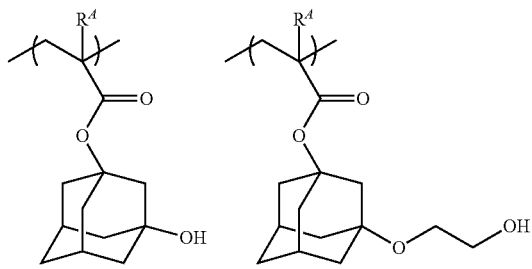
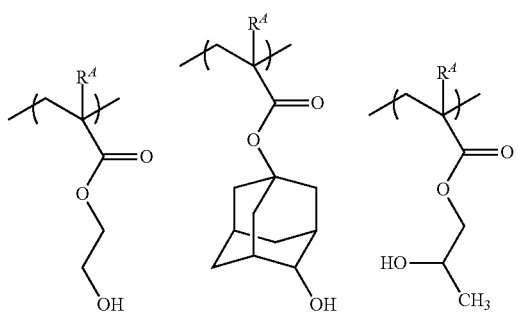
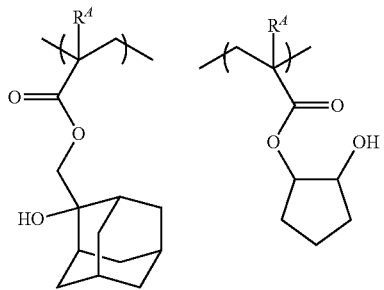
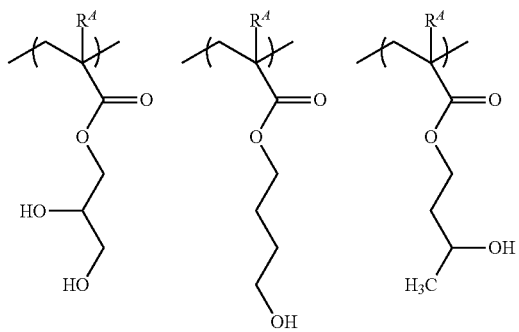
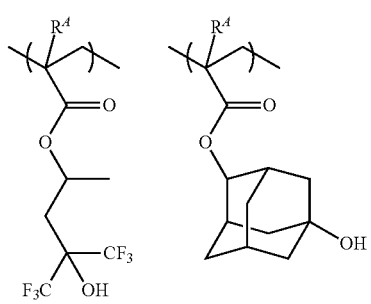

-continued

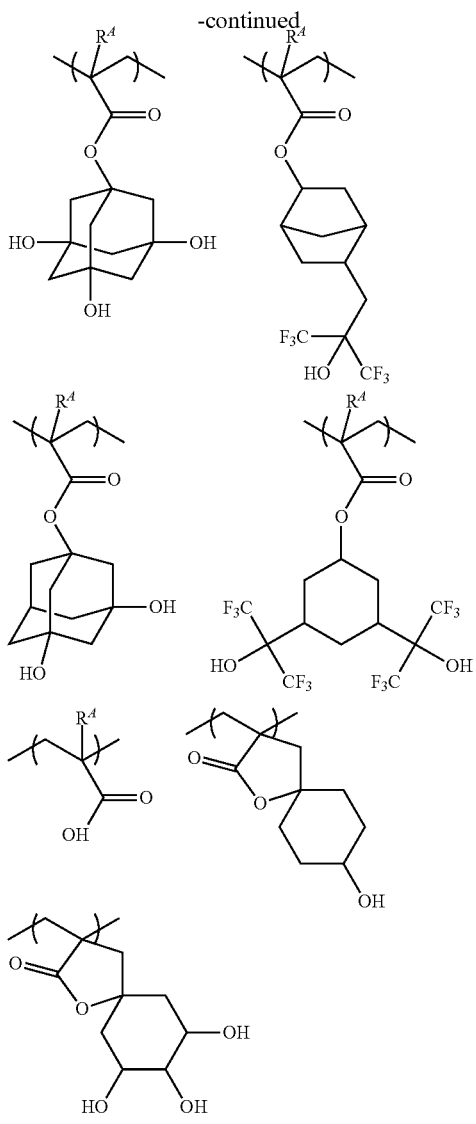

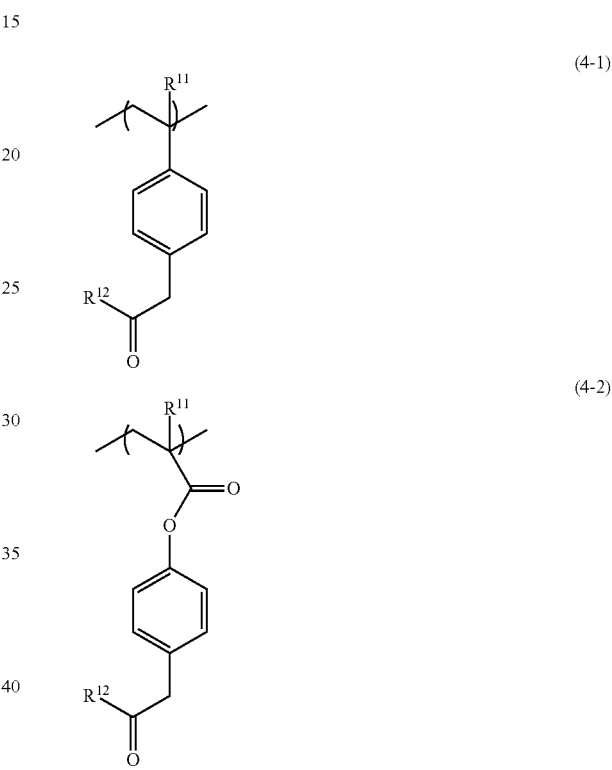

In the above formulas, $R^4$ is a hydrogen atom, a fluorine atom, a methyl group, or a trifluoromethyl group.

When the resin includes the structural unit (III) having a polar group, the lower limit of the content of the structural unit (III) with respect to the total amount of the structural units constituting the resin is preferably 5 mol %, more preferably 8 mol %, even more preferably 10 mol %. The upper limit of the content is preferably 40 mol %, more preferably 35 mol %, even more preferably 30 mol %. When the content of the structural unit having a polar group is set to fall within the above range, the radiation-sensitive resin composition can provide further improved lithography properties such as the resolution.

[Structural Unit (IV)]

The base resin optionally has, as another structural unit, a structural unit derived from hydroxystyrene or a structural unit having a phenolic hydroxyl group (hereinafter, both are also collectively referred to as "structural unit (IV)"), in addition to the structural unit (III) having a polar group. The structural unit (IV) contributes to an improvement in etching resistance and an improvement in a difference in solubility of a developer (dissolution contrast) between an exposed part and a non-exposed part. In particular, the structural unit (IV) can be suitably applied to pattern formation using exposure with a radioactive ray having a wavelength of 50 nm or less, such as an electron beam or EUV. In this case, the resin preferably has the structural unit (I) together with the structural unit (IV).

In this case, it is preferable to obtain the structural unit (IV) by performing polymerization in a state in which the phenolic hydroxyl group is protected by a protective group such as an alkali-dissociable group during polymerization, and then performing deprotection by hydrolysis. The structural unit that provides the structural unit (IV) by hydrolysis is preferably represented by the following formulas (4-1) and (4-2).

In the above formulas (4-1) and (4-2), $R^{11}$ is a hydrogen atom, a fluorine atom, a methyl group, or a trifluoromethyl group, and $R^{12}$ is a monovalent hydrocarbon group having 1 to 20 carbon atoms or an alkoxy group. Examples of the monovalent hydrocarbon group having 1 to 20 carbon atoms for $R^{12}$ include monovalent hydrocarbon groups having 1 to 20 carbon atoms for $R^8$ in the structural unit (I). Examples of the alkoxy group include a methoxy group, an ethoxy group, and a tert-butoxy group.

As $R^{12}$, an alkyl group and an alkoxy group are preferable, and among them, a methyl group and a tert-butoxy group are more preferable.

In the case of a resin for exposure with a radioactive ray having a wavelength of 50 nm or less, the lower limit of the content of the structural unit (IV) is preferably 10 mol %, more preferably 20 mol %, with respect to the total amount of structural units constituting the resin. The upper limit of the content is preferably 70 mol %, more preferably 60 mol %.

(Synthesis Method of Base Resin)

For example, the base resin can be synthesized by performing a polymerization reaction of each monomer for providing each structural unit with a radical polymerization initiator or the like in a suitable solvent.

Examples of the radical polymerization initiator include an azo-based radical initiator, including azobisisobutyronitrile (AIBN), 2,2'-azobis(4-methoxy-2,4-dimethylvaleronitrile), 2,2'-azobis(2-cyclopropylpropanenitrile), 2,2'-azobis(2,4-dimethylvaleronitrile), and dimethyl 2,2'-azobisisobutyrate; and peroxide-based radical initiator, including benzoyl peroxide, t-butyl hydroperoxide, and cumene hydroperoxide. Among them, AIBN or dimethyl 2,2'-azobisisobutyrate is preferred, and AIBN is more preferred. The radical initiator may be used alone, or two or more radical initiators may be used in combination.

Examples of the solvent used for the polymerization reaction include alkanes including n-pentane, n-hexane, n-heptane, n-octane, n-nonane, and n-decane;

cycloalkanes including cyclohexane, cycloheptane, cyclooctane, decalin, and norbornane;

aromatic hydrocarbons including benzene, toluene, xylene, ethylbenzene, and cumene;

halogenated hydrocarbons including chlorobutanes, bromohexanes, dichloroethanes, hexamethylenedibromide, and chlorobenzenes;

saturated carboxylate esters, including ethyl acetate, n-butyl acetate, i-butyl acetate, and methyl propionate;

ketones including acetone, methyl ethylketone, 4-methyl-2-pentanone, and 2-heptanone;

ethers including tetrahydrofuran, dimethoxyethanes, and diethoxyethanes; and alcohols including methanol, ethanol, 1-propanol, 2-propanol, and 4-methyl-2-pentanol. The solvent used for the polymerization reaction may be used alone, or two or more solvents may be used in combination.

The reaction temperature of the polymerization reaction is typically from 40° C. to 150° C., and preferably from 50° C. to 120° C. The reaction time is typically from 1 hour to 48 hours, and preferably from 1 hour to 24 hours.

The molecular weight of the base resin is not particularly limited, but the polystyrene-equivalent weight average molecular weight (Mw) measured by gel permeation chromatography (GPC) is preferably 1,000 or more and 50,000 or less, more preferably 2,000 or more and 30,000 or less, still more preferably 3,000 or more and 15,000 or less, particularly preferably 4,000 or more and 12,000 or less. When the Mw of the base resin is less than the lower limit, the heat resistance of the resulting resist film may be deteriorated. When the Mw of the base resin exceeds the above upper limit, the developability of the resist film may be deteriorated.

For the base resin as a base resin, the ratio of Mw to the number average molecular weight (Mn) as determined by GPC relative to standard polystyrene (Mw/Mn) is typically not less than 1 and not more than 5, preferably not less than 1 and not more than 3, and more preferably not less than 1 and not more than 2.

The Mw and Mn of the resin in the specification are amounts measured by using Gel Permeation Chromatography (GPC) with the condition as described below.

GPC column: two G2000HXL, one G3000HXL, and one G4000HXL (all manufactured from Tosoh Corporation)
Column temperature: 40° C.
Eluting solvent: tetrahydrofuran
Flow rate: 1.0 mL/min
Sample concentration: 1.0% by mass
Sample injection amount: 100 µL
Detector: Differential Refractometer
Reference material: monodisperse polystyrene The content of the base resin is preferably not less than 70% by mass, more preferably not less than 80% by mass, and further preferably not less than 85% by mass based on the total solid content of the radiation-sensitive resin composition.

<Another Resin>

The radiation-sensitive resin composition according to the present embodiment may contain, as another resin, a resin having higher content by mass of fluorine atoms than the above-described base resin (hereinafter, also referred to as a "high fluorine-content resin"). When the radiation-sensitive resin composition contains the high fluorine-content resin, the high fluorine-content resin can be localized in the surface layer of a resist film compared to the base resin, which as a result makes it possible to enhance the water repellency of the surface of the resist film during immersion exposure.

The high fluorine-content resin preferably has, for example, a structural unit represented by the following formula (5) (hereinafter, also referred to as "structural unit (V)"), and may have the structural unit (I) or the structural unit (II) in the base resin as necessary.

(5)

In the above formula (5), $R^{13}$ is a hydrogen atom, a methyl group, or a trifluoromethyl group; $G^L$ is a single bond, an oxygen atom, a sulfur atom, —COO—, —SO$_2$ONH—, —CONH—, or —OCONH—; $R^{14}$ is a monovalent fluorinated chain hydrocarbon group having a carbon number of 1 to 20, or a monovalent fluorinated alicyclic hydrocarbon group having a carbon number of 3 to 20.

As $R^{13}$ as described above, in terms of the copolymerizability of monomers resulting in the structural unit (V), a hydrogen atom or a methyl group is preferred, and a methyl group is more preferred.

As $G^L$ as described above, in terms of the copolymerizability of monomers resulting in the structural unit (V), a single bond or —COO— is preferred, and —COO— is more preferred.

Example of the monovalent fluorinated chain hydrocarbon group having a carbon number of 1 to 20 represented by $R^{14}$ as described above includes a group in which a part of or all of hydrogen atoms in the straight or branched chain alkyl group having a carbon number of 1 to 20 is/are substituted with a fluorine atom.

Example of the monovalent fluorinated alicyclic hydrocarbon group having a carbon number of 3 to 20 represented by $R^{14}$ as described above includes a group in which a part of or all of hydrogen atoms in the monocyclic or polycyclic hydrocarbon group having a carbon number of 3 to 20 is/are substituted with a fluorine atom.

The $R^{14}$ as described above is preferably a fluorinated chain hydrocarbon group, more preferably a fluorinated alkyl group, and further preferably 2,2,2-trifluoroethyl group, 1,1,1,3,3,3-hexafluoropropyl group and 5,5,5-trifluoro-1,1-diethylpentyl group.

When the high fluorine-content resin has the structural unit (V), the lower limit of the content of the structural unit (V) is preferably 30 mol %, more preferably 40 mol %, even more preferably 45 mol %, particularly preferably 50 mol % with respect to the total amount of all the structural units constituting the high fluorine-content resin. The upper limit of the content is preferably 95 mol %, more preferably 90 mol %, even more preferably 85 mol %. When the content of the structural unit (V) is set to fall within the above range, the content by mass of fluorine atoms of the high fluorine-content resin can more appropriately be adjusted to further promote the localization of the high fluorine-content resin in the surface layer of a resist film, as a result, the water repellency of the resist film during immersion exposure can be further improved.

The high fluorine-content resin may have a fluorine atom-containing structural unit represented by the following formula (f-2) (hereinafter, also referred to as a "structural unit (VI)") in addition to or in place of the structural unit (V). When the high fluorine-content resin has the structural unit (VI), solubility in an alkaline developing solution is improved, and therefore generation of development defects can be prevented.

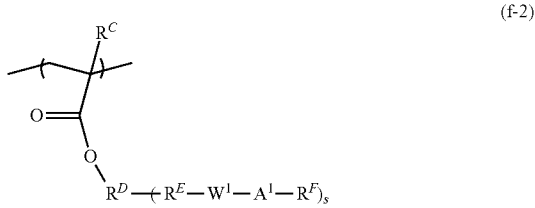

(f-2)

The structural unit (VI) is classified into two groups: a unit having an alkali soluble group (x); and a unit having a group (y) in which the solubility into the alkaline developing solution is increased by the dissociation by alkali (hereinafter, simply referred as an "alkali-dissociable group"). In both cases of (x) and (y), $R^C$ in the above formula (f-2) is a hydrogen atom, a fluorine atom, a methyl group, or a trifluoromethyl group; $R^D$ is a single bond, a hydrocarbon group having a carbon number of 1 to 20 with the valency of (s+1), a structure in which an oxygen atom, a sulfur atom, —$NR^{dd}$—, a carbonyl group, —COO— or —CONH— is connected to the terminal on RE side of the hydrocarbon group, or a structure in which a part of hydrogen atoms in the hydrocarbon group is substituted with an organic group having a hetero atom; $R^{dd}$ is a hydrogen atom, or a monovalent hydrocarbon group having a carbon number of 1 to 10; and s is an integer of 1 to 3.

When the structural unit (VI) has the alkali soluble group (x), RF is a hydrogen atom; $A^1$ is an oxygen atom, —COO—* or —SO$_2$O—*; * refers to a bond to $R^F$; $W^1$ is a single bond, a hydrocarbon group having a carbon number of 1 to 20, or a divalent fluorinated hydrocarbon group. When $A^1$ is an oxygen atom, $W^1$ is a fluorinated hydrocarbon group having a fluorine atom or a fluoroalkyl group on the carbon atom connecting to $A^1$. $R^E$ is a single bond, or a divalent organic group having a carbon number of 1 to 20. When s is 2 or 3, a plurality of $R^E$, $W^1$, $A^1$ and $R^F$ may be each identical or different. The affinity of the high fluorine-content resin into the alkaline developing solution can be improved by including the structural unit (VI) having the alkali soluble group (x), and thereby prevent from generating the development defect. As the structural unit (VI) having the alkali soluble group (x), particularly preferred is a structural unit in which $A^1$ is an oxygen atom and $W^1$ is a 1,1,1,3,3,3-hexafluoro-2,2-methanediyl group.

When the structural unit (VI) has the alkali-dissociable group (y), RF is a monovalent organic group having carbon number of 1 to 30; $A^1$ is an oxygen atom, —$NR^{aa}$—, —COO—*, or —SO$_2$O—*; $R^{aa}$ is a hydrogen atom, or a monovalent hydrocarbon group having a carbon number of 1 to 10; * refers to a bond to $R^F$; $W^1$ is a single bond, or a divalent fluorinated hydrocarbon group having a carbon number of 1 to 20; $R^E$ is a single bond, or a divalent organic group having a carbon number of 1 to 20. When $A^1$ is —COO—* or —SO$_2$O—*, $W^1$ or $R^F$ has a fluorine atom on the carbon atom connecting to $A^1$ or on the carbon atom adjacent to the carbon atom. When $A^1$ is an oxygen atom, $W^1$ and $R^E$ are a single bond; $R^D$ is a structure in which a carbonyl group is connected at the terminal on $R^E$ side of the hydrocarbon group having a carbon number of 1 to 20; and RF is an organic group having a fluorine atom. When s is 2 or 3, a plurality of $R^E$, $W^1$, $A^1$ and $R^F$ may be each identical or different. The surface of the resist film is changed from hydrophobic to hydrophilic in the alkaline developing step by including the structural unit (VI) having the alkali-dissociable group (y). As a result, the affinity of the high fluorine-content resin into the alkaline developing solution can be significantly improved, and thereby prevent from generating the development defect more efficiently. As the structural unit (VI) having the alkali-dissociable group (y), particularly preferred is a structural unit in which $A^1$ is —COO—*, and RF or $W^1$, or both is/are a fluorine atom.

In terms of the copolymerizability of monomers resulting in the structural unit (VI), $R^C$ is preferably a hydrogen atom or a methyl group, and more preferably a methyl group.

When $R^E$ is a divalent organic group, $R^E$ is preferably a group having a lactone structure, more preferably a group having a polycyclic lactone structure, and further preferably a group having a norbornane lactone structure.

When the high fluorine-content resin has the structural unit (VI), the lower limit of the content of the structural unit (VI) is preferably 40 mol %, more preferably 50 mol %, even more preferably 60 mol % with respect to the total amount of all the structural units constituting the high fluorine-content resin. The upper limit of the content is preferably 95 mol %, more preferably 90 mol %, even more preferably 85 mol %. When the content of the structural unit (VI) is set to fall within the above range, water repellency of a resist film during immersion exposure can further be improved.

[Other Structural Unit]

A high fluorine-containing resin may contain a structural unit having an alicyclic structure represented by the formula (6) as a structural unit other than the structural units listed above.

(6)

In the formula (6), $R^{1\alpha}$ represents a hydrogen atom, a fluorine atom, a methyl group, or a trifluoromethyl group, and $R^{2\alpha}$ represents a monovalent alicyclic hydrocarbon group having 3 to 20 carbon atoms.

In the formula (6), as the monovalent alicyclic hydrocarbon group having 3 to 20 carbon atoms represented by $R^{2\alpha}$, a monovalent alicyclic hydrocarbon group having 3 to 20 carbon atoms represented by $R^8$ in the formula (1) can be suitably employed.

When the high fluorine-containing resin contains the structural unit having an alicyclic structure, the content by percent of the structural unit having an alicyclic structure is preferably 10 mol % or more, more preferably 20 mol % or more, and still more preferably 30 mol % or more based on all structural units constituting the high fluorine-containing resin. The content by percent is preferably 70 mol % or less, more preferably 60 mol % or less, and still more preferably 50 mol % or less.

The Mw of the high fluorine-containing resin is preferably 1,000 or more, more preferably 2,000 or more, still more preferably 3,000 or more, and particularly preferably 5,000 or more. The Mw of the high fluorine-containing resin is preferably 50,000 or less, more preferably 30,000 or less, still more preferably 20,000 or less, and particularly preferably 15,000 or less.

The Mw/Mn of the high fluorine-containing resin is usually 1 or more, and more preferably 1.1 or more. The Mw/Mn of the high fluorine-containing resin is usually 5 or less, preferably 3 or less, more preferably 2 or less, and still more preferably 1.9 or less.

The content of the high fluorine-containing resin is preferably 0.1 parts by mass or more, more preferably 0.5 parts by mass or more, still more preferably 1 part by mass or more, and particularly preferably 1.5 parts by mass or more based on 100 parts by mass of the base resin. The content of the high fluorine-containing resin is preferably 15 parts by mass or less, more preferably 10 parts by mass or less, still more preferably 8 parts by mass or less, and particularly preferably 5 parts by mass or less.

When the content of the high fluorine-content resin is set to fall within the above range, the high fluorine-content resin can more effectively be localized in the surface layer of a resist film, which as a result makes it possible to further enhance the water repellency of the surface of the resist film during liquid immersion lithography. The radiation-sensitive resin composition may contain one kind of high fluorine-content resin or two or more kinds of high fluorine-content resins.

(Method for Synthesizing High Fluorine-Content Resin)

The high fluorine-content resin can be synthesized by a method similar to the above-described method for synthesizing a base resin.

(Acid Diffusion Controlling Agent)

The radiation-sensitive resin composition may include an acid diffusion controlling agent, if needed. The acid diffusion controlling agent has an effect of controlling the diffusion phenomenon in which an acid resulted from the compound (1) by the exposure is diffused in the resist film, and of inhibiting undesired chemical reaction in the non-exposed part. The acid diffusion controlling agent can also improve the storage stability of the resulting radiation-sensitive resin composition. The acid diffusion controlling agent can further improve the resolution of the resist pattern and prevent from changing the line width of the resist pattern because of the variation of the pulling and placing time, i.e., the time from the exposure to the developing treatment, and therefore provide the radiation-sensitive resin composition having an improved process stability.

Examples of the acid diffusion controlling agent include a compound represented by the following formula (7) (hereinafter, also referred as a "nitrogen-containing compound (I)"); a compound having two nitrogen atoms in one molecule (hereinafter, also referred as a "nitrogen-containing compound (II)"); a compound having three nitrogen atoms in one molecule (hereinafter, also referred as a "nitrogen-containing compound (III)"); a compound having an amide group; a urea compound; and a nitrogen-containing heterocyclic ring compound.

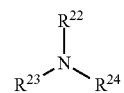

(7)

In the above formula (7), $R^{22}$, $R^{23}$ and $R^{24}$ are each independently a hydrogen atom, a substituted or unsubstituted alkyl group, a substituted or unsubstituted cycloalkyl group, a substituted or unsubstituted aryl group, or a substituted or unsubstituted aralkyl group.

Examples of the nitrogen-containing compound (I) include a monoalkylamine including n-hexylamine; a dialkylamine including di-n-butylamine; a trialkylamine including triethylamine; and an aromatic amine including aniline.

Examples of the nitrogen-containing compound (II) include ethylenediamine and N,N,N',N'-tetramethylethylenediamine.

Examples of the nitrogen-containing compound (III) include a polyamine compound, including polyethyleneimine and polyallylamine; and a polymer including dimethylaminoethylacrylamide.

Examples of the amide-containing compound include formamide, N-methylformamide, N,N-dimethylformamide, acetamide, N-methylacetamide, N,N-dimethylacetamide, propionamide, benzamide, pyrrolidone, and N-methyl pyrrolidone.

Examples of the urea compound include urea, methylurea, 1,1-dimethylurea, 1,3-dimethylurea, 1,1,3,3-tetramethylurea, 1,3-diphenylurea, and tributylthiourea.

Examples of the nitrogen-containing heterocyclic ring compound include pyridines, including pyridine and 2-methylpyridine; morpholines, including N-propylmorpholine and N-(undecylcarbonyloxyethyl)morpholine; pyrazine, and pyrazole.

A compound having an acid-dissociable group may be used as the nitrogen-containing organic compound. Examples of the nitrogen-containing organic compound having an acid-dissociable group include N-t-butoxycarbonylpiperidine, N-t-butoxycarbonylimidazole, N-t-butoxycarbonylbenzimidazole, N-t-butoxycarbonyl-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, N-t-butoxycarbonyl hydroxypiperidine, and N-t-amyloxycarbonyl-4-hydroxypiperidine.

As the acid diffusion control agent, a radiation-sensitive weak acid generator that generates a weak acid upon exposure can also be preferably used. The acid generated from the radiation-sensitive weak acid generator is a weak acid that does not induce the dissociation of the acid-dissociable groups in the resin under the conditions for dissociating the acid-dissociable groups. In the present specification, "dissociation" of an acid-dissociable group means dissociation upon post-exposure baking at 110° C. for 60 seconds.

Example of the radiation-sensitive weak acid generator includes an onium salt compound in which the compound is degraded by the exposure to lose the acid diffusion controlling properties. Examples of the onium salt compound include a sulfonium salt compound represented by the following formula (8-1), and an iodonium salt compound represented by the following formula (8-2).

$$J^+E^- \quad (8\text{-}1)$$

$$U^+Q^- \quad (8\text{-}2)$$

In the above formula (8-1) and formula (8-2), $J^+$ is a sulfonium cation; and $U^+$ is an iodonium cation. Examples of the sulfonium cation represented by $J^+$ include sulfonium cations represented by the above formulae (X-1) to (X-3). Examples of the iodonium cation represented by $U^+$ include iodonium cations represented by the above formulae (X-4) to (X-5). $E^-$ and $Q^-$ are each independently anion represented by $OH^-$, $R^\alpha$—$COO^-$, and $R^\alpha$—$SO_3^-$. $R^\alpha$ is an alkyl group, an aryl group, or an aralkyl group. A hydrogen atom in the aromatic ring of the aryl group or the aralkyl group represented by $R^\alpha$ may be substituted with a hydroxy group, a fluorine atom-substituted or unsubstituted alkyl group having a carbon number of 1 to 12, or an alkoxy group having a carbon number of 1 to 12.

Examples of the radiation-sensitive weak acid generator include compounds represented by the following formulae.

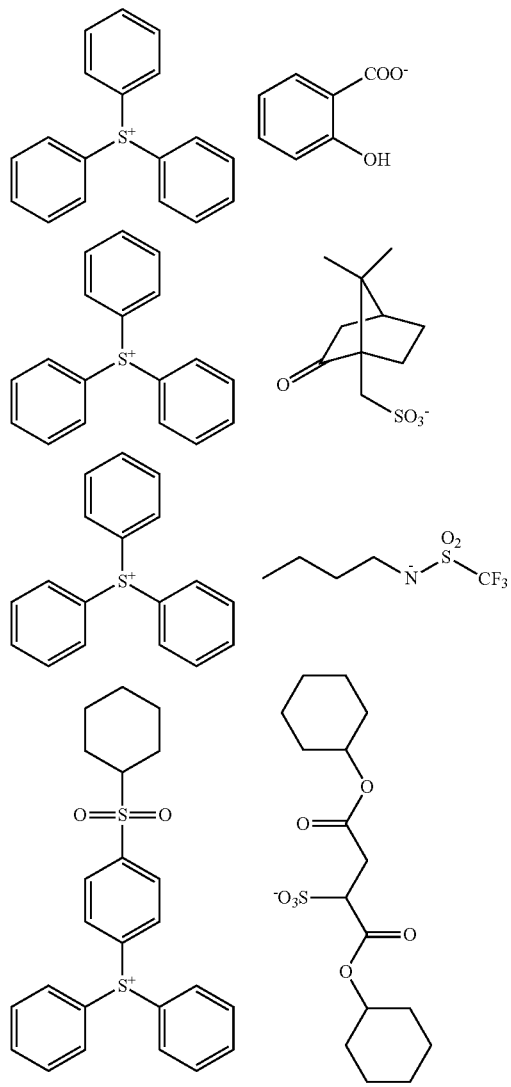

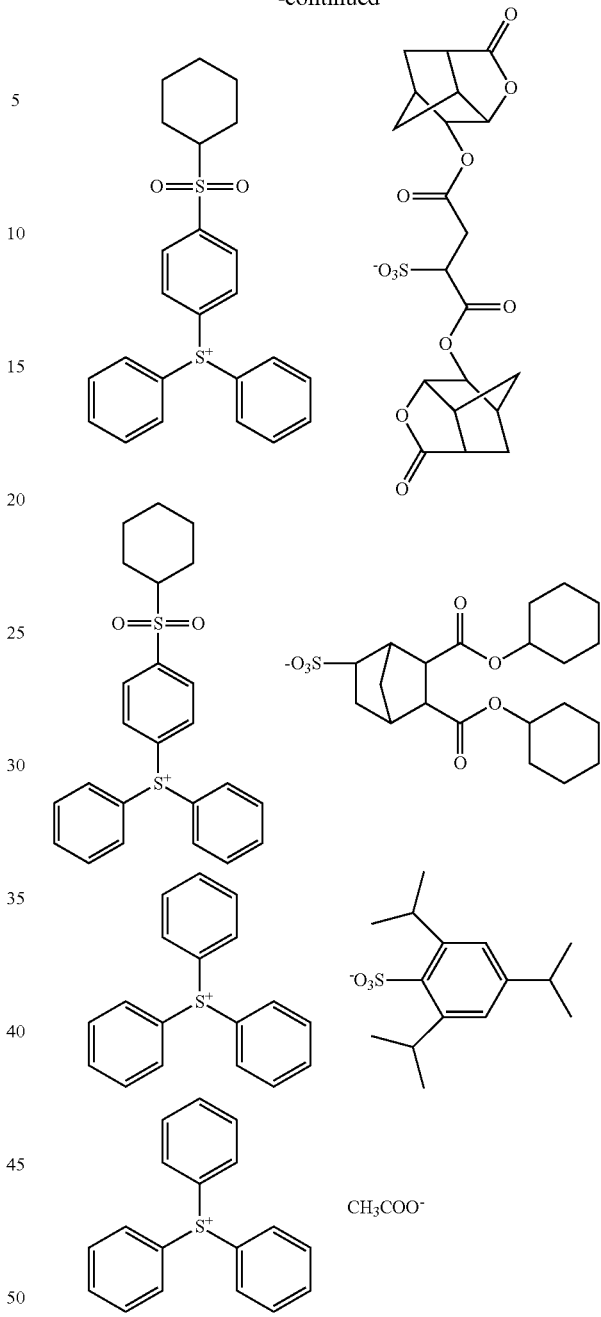

-continued

Among them, the radiation-sensitive weak acid generator is preferably the sulfonium salt, more preferably a triarylsulfonium salt, and further preferably a triphenylsulfonium salicylate or triphenylsulfonium 10-camphorsulfonate.

The lower limit of the content of the acid diffusion controlling agent is preferably 3 parts by mass, more preferably 4 parts by mass, and further preferably 5 parts by mass based on 100 parts by mass of the radiation-sensitive weak acid generator. The upper limit of the content is preferably 150 parts by mass, more preferably 120 parts by mass, and further preferably 110 parts by mass.

By adjusting the content of the acid diffusion controlling agent within the ranges, the radiation-sensitive resin composition can provide improved lithography properties. The radiation-sensitive resin composition may contain one type of the acid diffusion controlling agent, or two or more acid diffusion controlling agents in combination.

<Solvent>

The radiation-sensitive resin composition according to the present embodiment contains a solvent. The solvent is not particularly limited as long as it can dissolve or disperse at least the resin, the radiation-sensitive acid generator, and an additive or the like contained if necessary.

Examples of the solvent include an alcohol-based solvent, an ether-based solvent, a ketone-based solvent, an amide-based solvent, an ester-based solvent, and a hydrocarbon-based solvent.

Examples of the alcohol-based solvent include:
- a monoalcohol-based solvent having a carbon number of 1 to 18, including iso-propanol, 4-methyl-2-pentanol, 3-methoxybutanol, n-hexanol, 2-ethylhexanol, furfuryl alcohol, cyclohexanol, 3,3,5-trimethylcyclohexanol, and diacetone alcohol;
- a polyhydric alcohol having a carbon number of 2 to 18, including ethylene glycol, 1,2-propylene glycol, 2-methyl-2,4-pentanediol, 2,5-hexanediol, diethylene glycol, dipropylene glycol, triethylene glycol, and tripropylene glycol; and
- a partially etherized polyhydric alcohol-based solvent in which a part of hydroxy groups in the polyhydric alcohol-based solvent is etherized.

Examples of the ether-based solvent include:
- a dialkyl ether-based solvent, including diethyl ether, dipropyl ether, and dibutyl ether;
- a cyclic ether-based solvent, including tetrahydrofuran and tetrahydropyran;
- an ether-based solvent having an aromatic ring, including diphenylether and anisole (methyl phenyl ether); and
- an etherized polyhydric alcohol-based solvent in which a hydroxy group in the polyhydric alcohol-based solvent is etherized.

Examples of the ketone-based solvent include:
- a chain ketone-based solvent, including acetone, butanone, and methyl-iso-butyl ketone;
- a cyclic ketone-based solvent, including cyclopentanone, cyclohexanone, and methylcyclohexanone; and
- 2,4-pentanedione, acetonylacetone, and acetophenone.

Examples of the amide-based solvent include:
- a cyclic amide-based solvent, including N,N'-dimethyl imidazolidinone and N-methylpyrrolidone; and
- a chain amide-based solvent, including N-methylformamide, N,N-dimethylformamide, N,N-diethylformamide, acetamide, N-methylacetamide, N,N-dimethylacetamide, and N-methylpropionamide.

Examples of the ester-based solvent include:
- a monocarboxylate ester-based solvent, including n-butyl acetate and ethyl lactate;
- a partially etherized polyhydric alcohol acetate-based solvent, including diethylene glycol mono-n-butyl ether acetate, propylene glycol monomethyl ether acetate, and dipropylene glycol monomethyl ether acetate;
- a lactone-based solvent, including γ-butyrolactone and valerolactone;
- a carbonate-based solvent, including diethyl carbonate, ethylene carbonate, and propylene carbonate; and
- a polyhydric carboxylic acid diester-based solvent, including propylene glycol diacetate, methoxy triglycol acetate, diethyl oxalate, ethyl acetoacetate, ethyl lactate, and diethyl phthalate.

Examples of the hydrocarbon-based solvent include:
- an aliphatic hydrocarbon-based solvent, including n-hexane, cyclohexane, and methylcyclohexane;
- an aromatic hydrocarbon-based solvent, including benzene, toluene, di-iso-propylbenzene, and n-amylnaphthalene.

Among them, the ester-based solvent or the ketone-based solvent is preferred. The partially etherized polyhydric alcohol acetate-based solvent, the cyclic ketone-based solvent, or the lactone-based solvent is more preferred. Propylene glycol monomethyl ether acetate, cyclohexanone, or γ-butyrolactone is still more preferred. The radiation-sensitive resin composition may include one type of the solvent, or two or more types of the solvents in combination.

<Other Optional Components>

The radiation-sensitive resin composition may contain other optional components other than the above-descried components. Examples of other optional components include a cross-linking agent, a localization enhancing agent, a surfactant, an alicyclic backbone-containing compound, and a sensitizer. These other optional components may be used singly or in combination of two or more of them.

(Crosslinking Agent)

The crosslinking agent is a compound having two or more functional groups. The crosslinking agent causes a cross-linking reaction in the resin component by an acid catalytic reaction in the baking step after the collective exposure step to increase the molecular weight of the resin component, and thereby decreases the solubility of the pattern exposed part in the developer. Examples of the functional group include a (meth)acryloyl group, a hydroxymethyl group, an alkoxymethyl group, an epoxy group, and a vinyl ether group.

(Localization Enhancing Agent)

The localization enhancing agent has an effect of localizing the high fluorine-content resin on the surface of the resist film more effectively. The added amount of the high fluorine-content resin can be decreased compared to the traditionally added amount by including the localization enhancing agent in the radiation-sensitive resin composition. The localization enhancing agent can further prevent from eluting the ingredient of the composition from the resist film to an immersion medium and carry out the immersion exposure at higher speed with a high-speed scan, while maintaining the lithography properties of the radiation-sensitive resin composition. As a result, the hydrophobicity of the surface of the resist film can be improved, resulting in the prevention of the defect due to the immersion, for example, the watermark defect. Example of the compound which may be used as the localization enhancing agent includes a low molecular weight compound having a specific dielectric constant of not less than 30 and not more than 200 and a boiling point of 100° C. or more at 1 atm. Specific examples of the compound include a lactone compound, a carbonate compound, a nitrile compound, and a polyhydric alcohol.

Examples of the lactone compound include γ-butyrolactone, valerolactone, mevaloniclactone, and norbornane lactone.

Examples of the carbonate compound include propylene carbonate, ethylene carbonate, butylene carbonate, and vinylene carbonate.

Example of the nitrile compound includes succinonitrile.

Example of the polyhydric alcohol includes glycerine.

The lower limit of the content of the localization enhancing agent is preferably 10 parts by mass, more preferably 15 parts by mass, further preferably 20 parts by mass, and more further preferably 25 parts by mass based on 100 parts by mass of total resins in the radiation-sensitive resin composition. The upper limit of the content is preferably 300 parts by mass, more preferably 200 parts by mass, further preferably 100 parts by mass, and more further preferably 80 parts by mass. The radiation-sensitive resin composition may include one type of the localization enhancing agent, or two or more types of localization enhancing agents in combination.

(Surfactant)

The surfactant has an effect of improving the coating properties, the striation, and the developability of the composition. Examples of the surfactant include a nonionic surfactant, including polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate. Examples of the surfactant which is commercially available include KP341 (manufactured by Shin-Etsu Chemical Co., Ltd.), POLYFLOW No. 75, POLYFLOW No. 95 (all manufactured by Kyoeisha Chemical Co., Ltd.), EFTOP EF301, EFTOP EF303, EFTOP EF352 (all manufactured by Tokem Products), Megafac F171, Megafac F173 (all manufactured by DIC), Fluorad FC430, Fluorad FC431 (all manufactured by Sumitomo 3M Limited.), AsahiGuard AG710, Surflon S-382, Surflon SC-101, Surflon SC-102, Surflon SC-103, Surflon SC-104, Surflon SC-105, Surflon SC-106 (all manufactured by Asahi Glass Co., Ltd.). The content of the surfactant in the radiation-sensitive resin composition is typically not more than 2 parts by mass based on 100 parts by mass of total resins.

(Alicyclic Backbone-Containing Compound)

The alicyclic backbone-containing compound has an effect of improving the dry etching resistance, the shape of the pattern, the adhesiveness between the substrate, and the like.

Examples of the alicyclic backbone-containing compound include:

adamantane derivatives, including 1-adamantane carboxylic acid, 2-adamantanone, and t-butyl 1-adamantane carboxylate;

deoxycholic acid esters, including t-butyl deoxycholate, t-butoxycarbonylmethyl deoxycholate, and 2-ethoxyethyl deoxycholate;

lithocholic acid esters, including t-butyl lithocholate, t-butoxycarbonylmethyl lithocholate, and 2-ethoxyethyl lithocholate; and 3-[2-hydroxy-2,2-bis(trifluoromethyl)ethyl]tetracyclo [4.4.0.1(2,5).1(7,10)]dode cane, and 2-hydroxy-9-methoxycarbonyl-5-oxo-4-oxa-tricyclo[4.2.1.0(3,7)] nonane. The content of the alicyclic backbone-containing compound in the radiation-sensitive resin composition is typically not more than 5 parts by mass based on 100 parts by mass of total resins.

(Sensitizer)

The sensitizer shows an action of increasing the production of the acid, for example, from the radiation-sensitive acid generator, and has an effect of improving the "apparent sensitivity" of the radiation-sensitive resin composition.

Examples of the sensitizer include carbazoles, acetophenones, benzophenones, naphthalenes, phenols, biacetyl, eosin, rose bengal, pyrenes, anthracenes, and phenothiazines. The sensitizer may be used alone, or two or more sensitizers may be used in combination. The content of the sensitizer in the radiation-sensitive resin composition is typically not more than 2 parts by mass based on 100 parts by mass of total resins.

<Method for Preparing Radiation-Sensitive Resin Composition>

The radiation-sensitive resin composition can be prepared by, for example, mixing the compound (1), the resin, the radiation-sensitive acid generator, and optionally the high fluorine-content resin, as well as the solvent added in a predetermined ratio. The radiation-sensitive resin composition is preferably filtered through, for example, a filter having a pore diameter of about 0.05 μm to 0.20 μm after mixing. The solid matter concentration of the radiation-sensitive resin composition is usually 0.1 mass % to 50 mass %, preferably 0.5 mass % to 30 mass %, more preferably 1 mass % to 20 mass %.

<Method for Forming Pattern>

A pattern forming method according to an embodiment of the present invention includes:

a step (1) of applying the radiation-sensitive resin composition directly or indirectly on a substrate to form a resist film (hereinafter, also referred to as a "resist film forming step");

a step (2) of exposing the resist film (hereinafter, also referred to as an "exposure step"); and a step (3) of developing the exposed resist film (hereinafter, also referred to as a "developing step").

The method for forming a pattern uses the above-described radiation-sensitive resin composition excellent in sensitivity in the exposure step, LWR performance, and CDU performance, and therefore a high-quality resist pattern can be formed. Hereinbelow, each of the steps will be described.

[Resist Film Forming Step]

In this step (the above mentioned step (1)), a resist film is formed with the radiation-sensitive resin composition. Examples of the substrate on which the resist film is formed include one traditionally known in the art, including a silicon wafer, silicon dioxide, and a wafer coated with aluminum. An organic or inorganic antireflection film may be formed on the substrate, as disclosed in JP-B-06-12452 and JP-A-59-93448. Examples of the applicating method include a rotary coating (spin coating), flow casting, and roll coating. After applicating, a prebake (PB) may be carried out in order to evaporate the solvent in the film, if needed. The temperature of PB is typically from 60° C. to 140° C., and preferably from 80° C. to 120° C. The duration of PB is typically from 5 seconds to 600 seconds, and preferably from 10 seconds to 300 seconds. The thickness of the resist film formed is preferably from 10 nm to 1,000 nm, and more preferably from 10 nm to 500 nm.

When the immersion exposure is carried out, irrespective of presence of a water repellent polymer additive such as the high fluorine-content resin in the radiation-sensitive resin composition, the formed resist film may have a protective film for the immersion which is not soluble into the immersion liquid on the film in order to prevent a direct contact between the immersion liquid and the resist film. As the protective film for the immersion, a solvent-removable protective film that is removed with a solvent before the developing step (for example, see JP-A-2006-227632); or a developer-removable protective film that is removed during the development of the developing step (for example, see WO2005-069076 and WO2006-035790) may be used. In terms of the throughput, the developer-removable protective film is preferably used.

When the next step, the exposure step, is performed with radiation having a wavelength of 50 nm or less, it is preferable to use a resin having the structural unit (I) and the structural unit (IV) as the base resin in the composition.

[Exposing Step]

In this step (the above mentioned step (2)), the resist film formed in the resist film forming step as the step (1) is exposed by irradiating with a radioactive ray through a photomask (optionally through an immersion medium such as water). Examples of the radioactive ray used for the exposure include visible ray, ultraviolet ray, far ultraviolet ray, extreme ultraviolet ray (EUV); an electromagnetic wave including X ray and γ ray; an electron beam; and a charged particle radiation such as α ray. Among them, far ultraviolet ray, an electron beam, or EUV is preferred. ArF excimer laser light (wavelength is 193 nm), KrF excimer laser light (wavelength is 248 nm), an electron beam, or EUV is more preferred. An electron beam or EUV having a wavelength of 50 nm or less which is identified as the next generation exposing technology is further preferred.

When the exposure is carried out by immersion exposure, examples of the immersion liquid include water and fluorine-based inert liquid. The immersion liquid is preferably a liquid which is transparent with respect to the exposing wavelength, and has a minimum temperature factor of the refractive index so that the distortion of the light image reflected on the film becomes minimum. However, when the exposing light source is ArF excimer laser light (wavelength is 193 nm), water is preferably used because of the ease of availability and ease of handling in addition to the above considerations. When water is used, a small proportion of an additive that decreases the surface tension of water and increases the surface activity may be added. Preferably, the additive cannot dissolve the resist film on the wafer and can neglect an influence on an optical coating at an under surface of a lens. The water used is preferably distilled water.

After the exposure, post exposure bake (PEB) is preferably carried out to promote the dissociation of the acid-dissociable group in the resin by the acid generated from the radiation-sensitive acid generator with the exposure in the exposed part of the resist film. The difference of solubility into the developer between the exposed part and the non-exposed part is generated by the PEB. The temperature of PEB is typically from 50° C. to 180° C., and preferably from 80° C. to 130° C. The duration of PEB is typically from 5 seconds to 600 seconds, and preferably from 10 seconds to 300 seconds.

[Developing Step]

In this step (the above mentioned step (3)), the resist film exposed in the exposing step as the step (2) is developed. By this step, the predetermined resist pattern can be formed. After the development, the resist pattern is washed with a rinse solution such as water or alcohol, and the dried, in general.

Examples of the developer used for the development include, in the alkaline development, an alkaline aqueous solution obtained by dissolving at least one alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethyl ammonium hydroxide (TMAH), pyrrole, piperidine, choline, 1,8-diazabicyclo-[5.4.0]-7-undecene, 1,5-diazabicyclo-[4.3.0]-5-nonene. Among them, an aqueous TMAH solution is preferred, and 2.38% by mass of aqueous TMAH solution is more preferred.

In the case of the development with organic solvent, examples of the solvent include an organic solvent, including a hydrocarbon-based solvent, an ether-based solvent, an ester-based solvent, a ketone-based solvent, and an alcohol-based solvent; and a solvent containing an organic solvent. Examples of the organic solvent include one, two or more solvents listed as the solvent for the radiation-sensitive resin composition. Among them, an ether-based solvent, an ester-based solvent or a ketone-based solvent is preferred. As the ether-based solvent, a glycol ether-based solvent is preferable, and ethylene glycol monomethyl ether and propylene glycol monomethyl ether are more preferable. The ester-based solvent is preferably an acetate ester-based solvent, and more preferably n-butyl acetate or amyl acetate. The ketone-based solvent is preferably a chain ketone, and more preferably 2-heptanone. The content of the organic solvent in the developer is preferably not less than 80% by mass, more preferably not less than 90% by mass, further preferably not less than 95% by mass, and particularly preferably not less than 99% by mass. Examples of the ingredient other than the organic solvent in the developer include water and silicone oil.

As described above, the developer may be either an alkaline developer or an organic solvent developer. The developer can be appropriately selected depending on whether the desired positive pattern or negative pattern is desired.

Examples of the developing method include a method of dipping the substrate in a tank filled with the developer for a given time (dip method); a method of developing by putting and leaving the developer on the surface of the substrate with the surface tension for a given time (paddle method); a method of spraying the developer on the surface of the substrate (spray method); and a method of injecting the developer while scanning an injection nozzle for the developer at a constant rate on the substrate rolling at a constant rate (dynamic dispense method).

EXAMPLES

Hereinafter, the present invention will be specifically described with reference to Examples, but the present invention is not limited to these Examples. Methods for measuring various physical property values are shown below.

[Weight-Average Molecular Weight (Mw) and Number-Average Molecular Weight (Mn)]

The Mw and Mn of a resin (including an acid generating resin) were measured under the conditions described above. A degree of dispersion (Mw/Mn) was calculated from results of the measured Mw and Mn.

[$^{13}$C-NMR Analysis]

$^{13}$C-NMR analysis of the resin was performed using a nuclear magnetic resonance apparatus ("JNM-Delta 400" manufactured by JEOL Ltd.).

Synthesis of Compound (1)

Synthesis Example 1

(Synthesis of Compound (B-1))

A compound (B-1) was synthesized according to the following synthesis scheme.

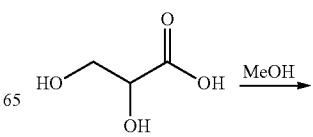

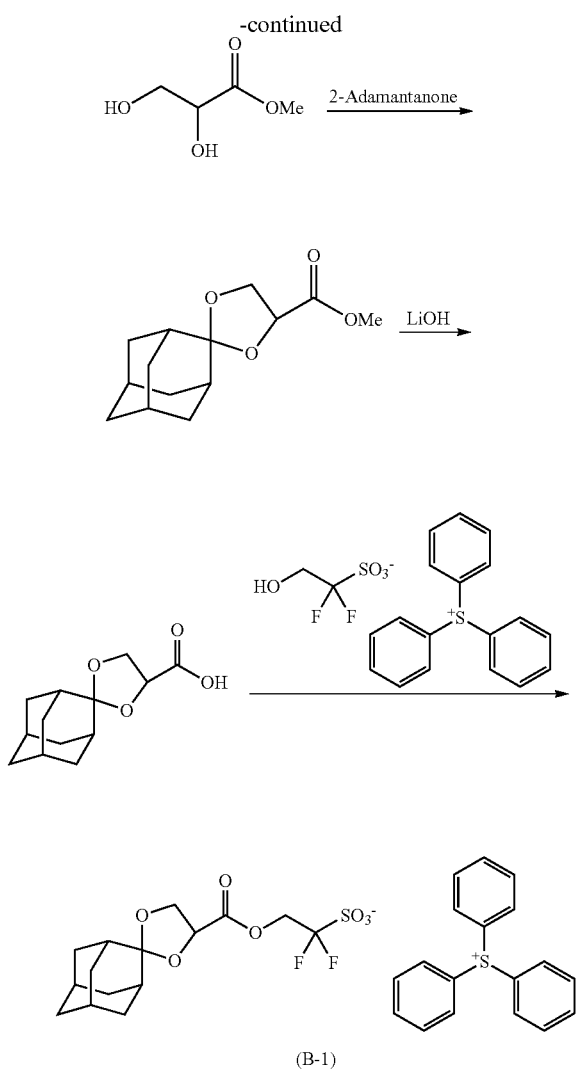

20.0 mmol of glyceric acid, 1.00 mmol of concentrated sulfuric acid, and 50 g of methanol were added into a reaction vessel, followed by stirring at 100° C. for 12 hours. Thereafter, a saturated aqueous solution of sodium bicarbonate was added to the stirred product to stop the reaction, and ethyl acetate was then added to resulting product to perform extraction, thereby separating an organic layer. The resulting organic layer was washed with a saturated aqueous solution of sodium chloride and then with water. After drying over sodium sulfate, a solvent was distilled off, and purification was performed by column chromatography to obtain an ester form in good yield.

20.0 mmol of 2-adamantanone, 1.00 mmol of concentrated sulfuric acid, and 50 g of toluene were added to the ester form, followed by stirring at 150° C. for 4 hours. Thereafter, a saturated aqueous solution of sodium bicarbonate was added to the stirred product to stop the reaction, and ethyl acetate was then added to resulting product to perform extraction, thereby separating an organic layer. The resulting organic layer was washed with a saturated aqueous solution of sodium chloride and then with water. After drying over sodium sulfate, a solvent was distilled off, and purification was performed by column chromatography to obtain an acetal form in good yield.

A mixed solution of acetonitrile and water (1:1 (mass ratio)) was added to the acetal form to obtain a 1 M solution. 20.0 mmol of lithium hydroxide was then added thereto, followed by reacting at room temperature for 4 hours. Thereafter, 1 M hydrochloric acid was added to the reaction product to make the inside of the system acidic, and methylene chloride was then added thereto to perform extraction, thereby separating an organic layer. The resulting organic layer was washed with a saturated aqueous solution of sodium chloride and then with water. After drying over sodium sulfate, a solvent was distilled off to obtain a carboxylic acid form in good yield.

20.0 mmol of triphenylsulfonium 1,1-difluoro hydroxymethane-1-sulfonate, 30.0 mmol of dicyclohexylcarbodiimide, and 50 g of methylene chloride were added to the carboxylic acid form, followed by reacting at room temperature for 5 hours. Thereafter, the reaction product was diluted by adding water, and methylene chloride was then added thereto to perform extraction, thereby separating an organic layer. The resulting organic layer was washed with a saturated aqueous solution of sodium chloride and then with water. After drying over sodium sulfate, a solvent was distilled off, and purification was performed by column chromatography to obtain a compound (B-1) represented by the above formula (B-1) in a good yield.

Synthesis Examples 2 to 22

(Synthesis of Compounds (B-2) to (B-22))

Compounds (1) represented by the following formulas (B-2) to (B-22) were synthesized in the same manner as in Synthesis Example 1 except that the raw materials and the precursor were appropriately changed. The compounds represented by the formulas (B-21) and (B-22) were used for synthesis of an acid-generating resin.

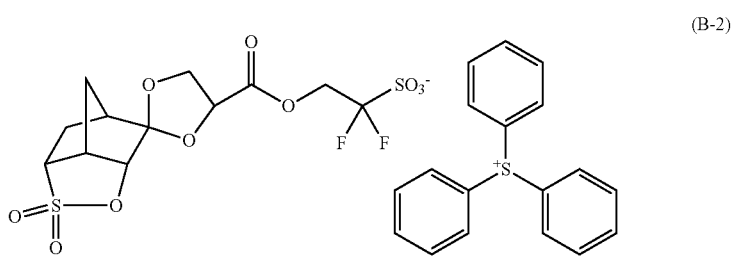

(B-2)

-continued
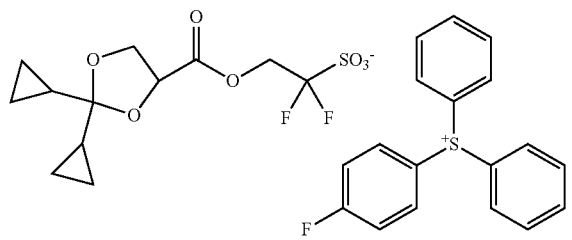
(B-3)
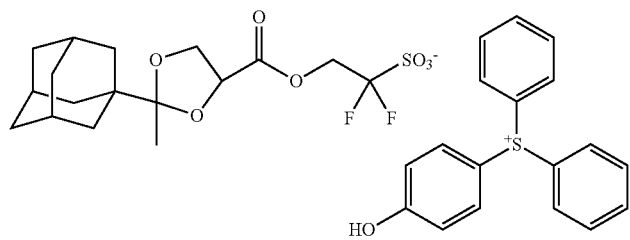
(B-4)
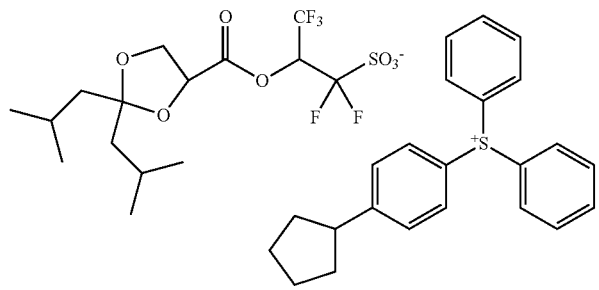
(B-5)
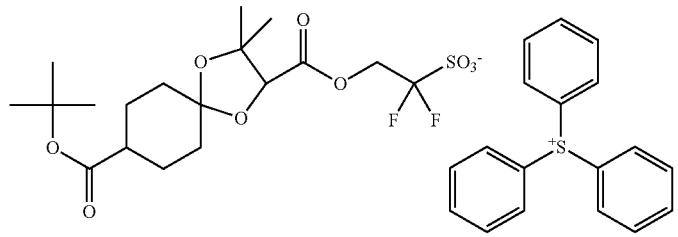
(B-6)
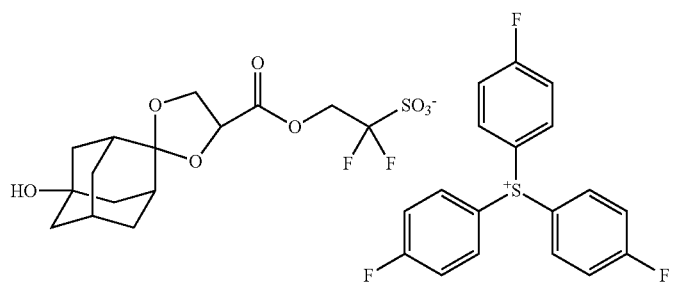
(B-7)
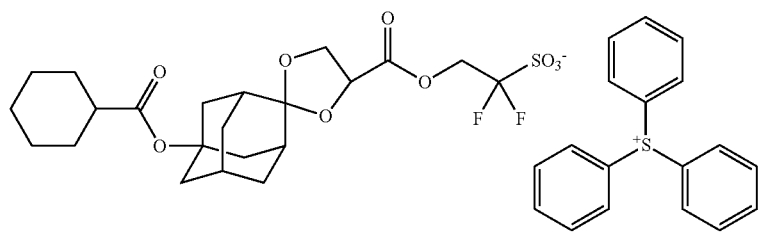
(B-8)

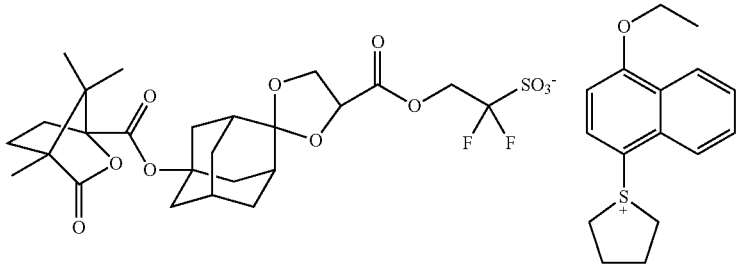
(B-9)
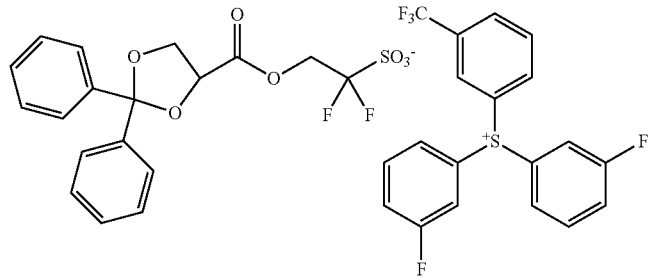
(B-10)
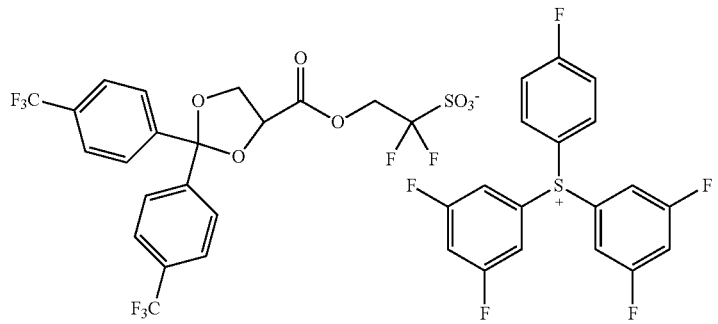
(B-11)
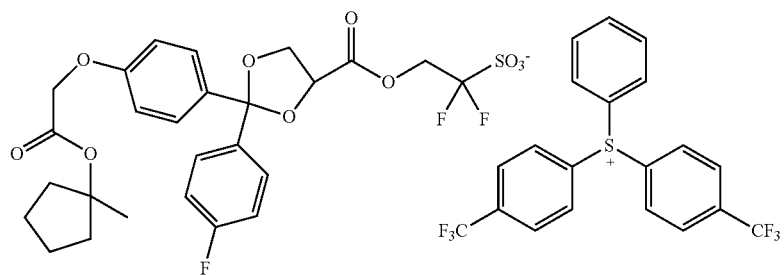
(B-12)
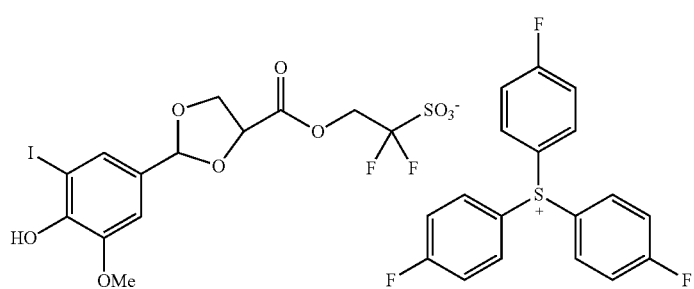
(B-13)

-continued
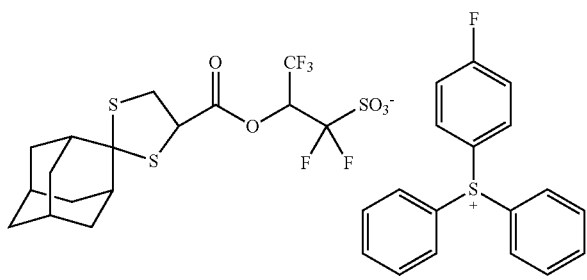
(B-14)
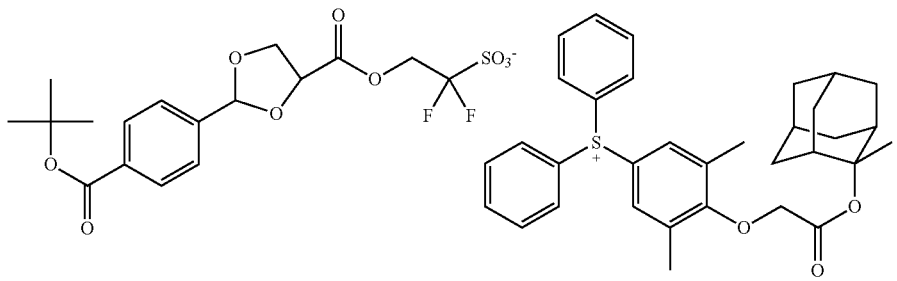
(B-15)
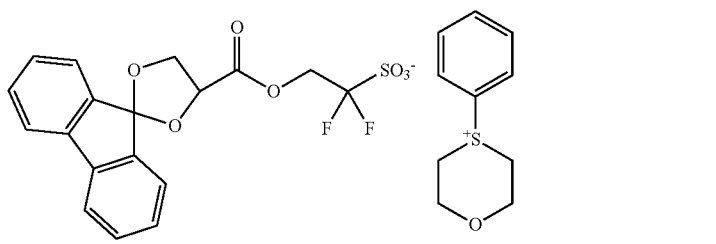
(B-16)
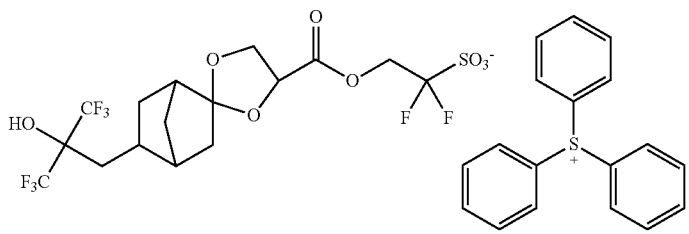
(B-17)
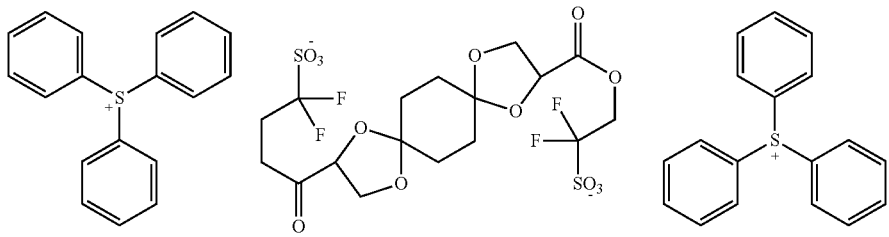
(B-18)
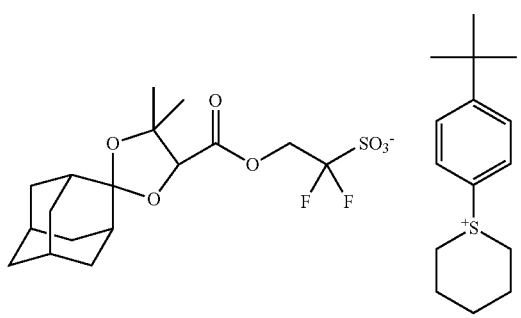
(B-19)

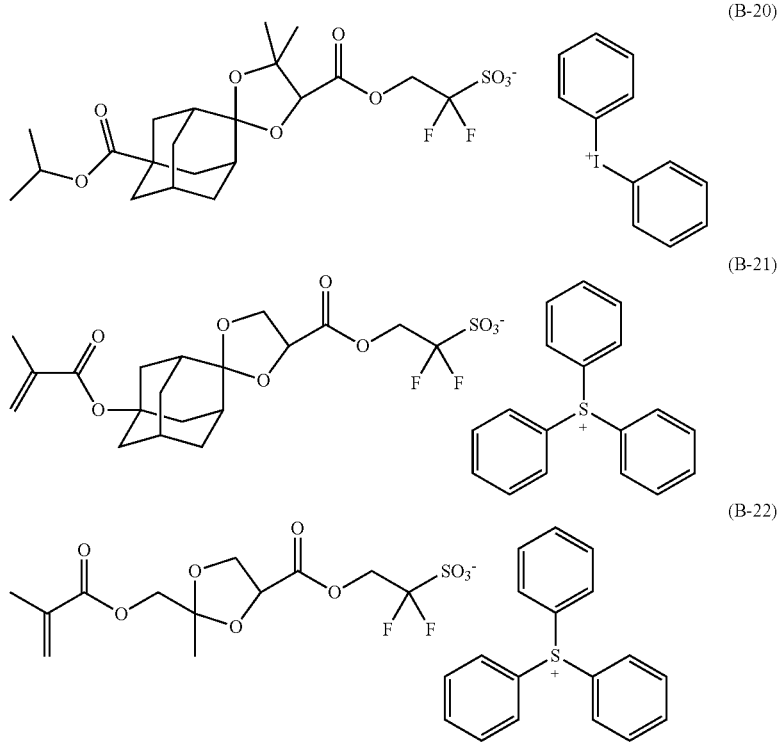

Synthesis Example 23

(Synthesis of Compound (B-23))

A compound (B-23) was synthesized using the above-described ester form as a raw material according to the following synthesis scheme.

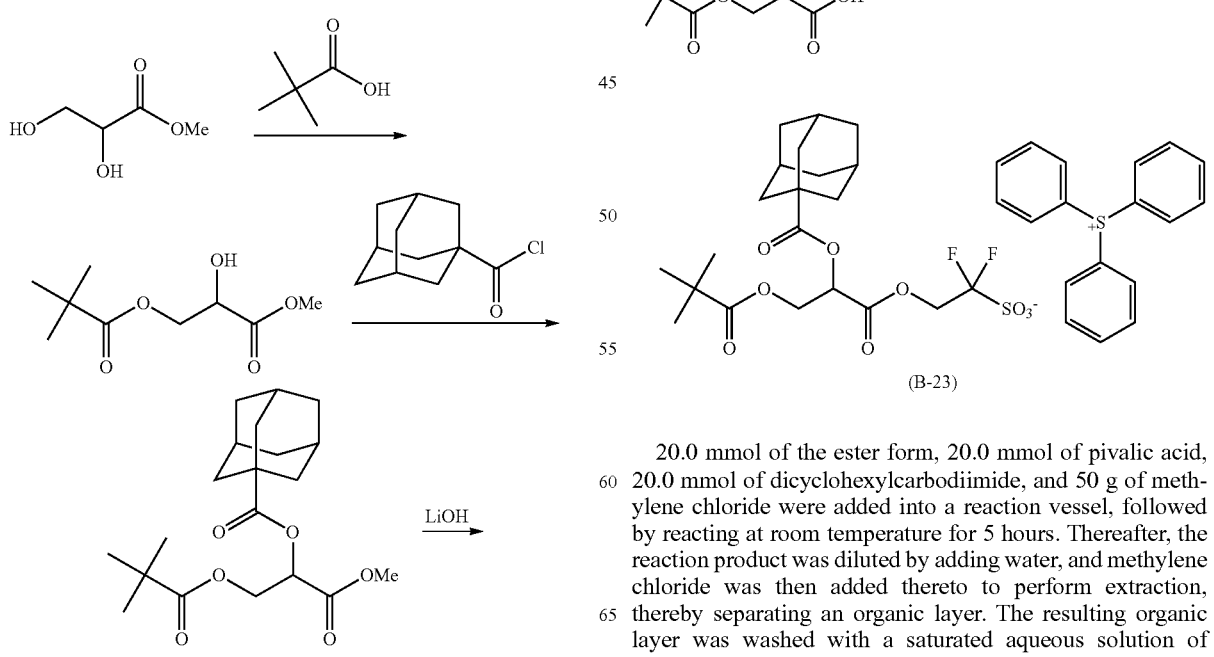

20.0 mmol of the ester form, 20.0 mmol of pivalic acid, 20.0 mmol of dicyclohexylcarbodiimide, and 50 g of methylene chloride were added into a reaction vessel, followed by reacting at room temperature for 5 hours. Thereafter, the reaction product was diluted by adding water, and methylene chloride was then added thereto to perform extraction, thereby separating an organic layer. The resulting organic layer was washed with a saturated aqueous solution of sodium chloride and then with water. After drying over sodium sulfate, a solvent was distilled off, and purification was performed by column chromatography to obtain a diester form in good yield.

20.0 mmol of 1-adamantanecarbonyl chloride, 20.0 mmol of triethylamine and 50 g of acetonitrile were added to the diester form, followed by stirring at room temperature for 12 hours. Thereafter, a saturated aqueous solution of ammonium chloride was added to the stirred product to stop the reaction, and ethyl acetate was then added thereto to perform extraction, thereby separating an organic layer. The resulting organic layer was washed with a saturated aqueous solution of sodium chloride and then with water. After drying over sodium sulfate, a solvent was distilled off, and purification was performed by column chromatography to obtain a triester form in good yield.

A mixed solution of acetonitrile and water (1:1 (mass ratio)) was added to the triester form to obtain a 1 M solution. 15.0 mmol of lithium hydroxide was then added thereto, followed by reacting at room temperature for 1 hour. Thereafter, 1 M hydrochloric acid was added to the reaction product to make the inside of the system acidic, and methylene chloride was then added thereto to perform extraction, thereby separating an organic layer. The resulting organic layer was washed with a saturated aqueous solution of sodium chloride and then with water. After drying over sodium sulfate, a solvent was distilled off to obtain a diester carboxylic acid form in good yield.

15.0 mmol of triphenylsulfonium 1,1-difluoro-2-hydroxymethane-1-sulfonate, 25.0 mmol of dicyclohexylcarbodiimide, and 50 g of methylene chloride were added to the diester carboxylic acid form, followed by reacting at room temperature for 5 hours. Thereafter, the reaction product was diluted by adding water, and methylene chloride was then added thereto to perform extraction, thereby separating an organic layer. The resulting organic layer was washed with a saturated aqueous solution of sodium chloride and then with water. After drying over sodium sulfate, a solvent was distilled off, and purification was performed by column chromatography to obtain a compound (B-23) represented by the above formula (B-23) in a good yield.

Synthesis Examples 24 to 31

(Synthesis of Compounds (B-24) to (B-31))

Compounds (1) represented by the following formulas (B-24) to (B-31) were synthesized in the same manner as in Synthesis Example 23 except that the raw materials and the precursor were appropriately changed.

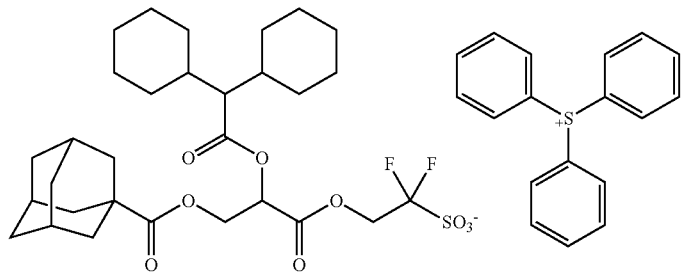

(B-24)

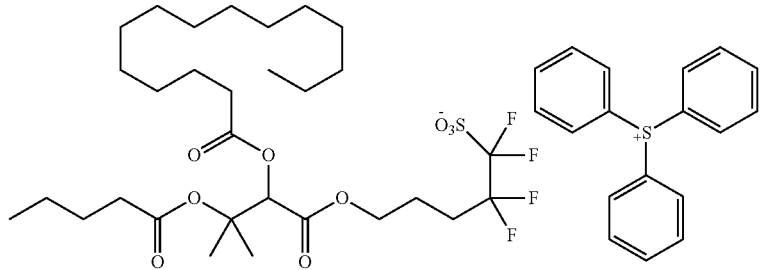

(B-25)

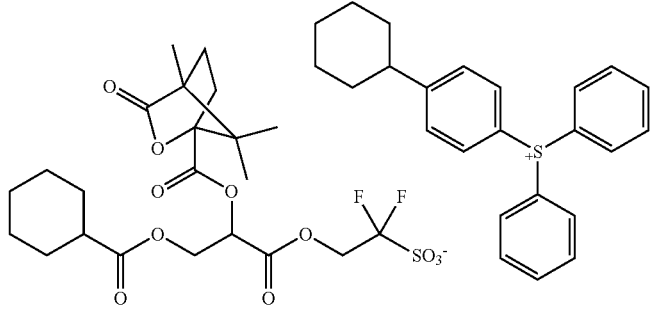

(B-26)

(B-27)
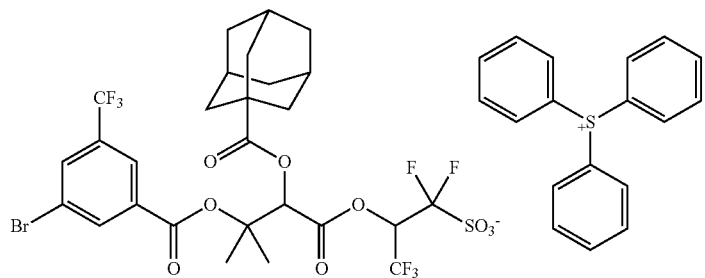
(B-28)
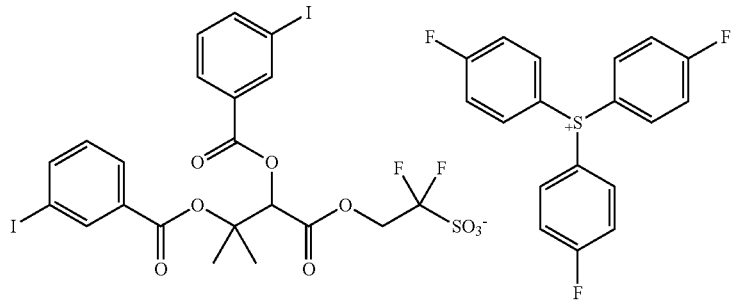
(B-29)
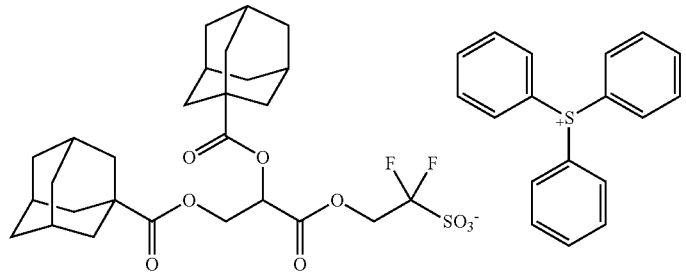
(B-30)
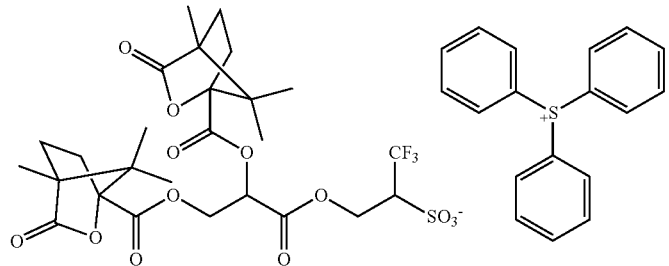
(B-31)
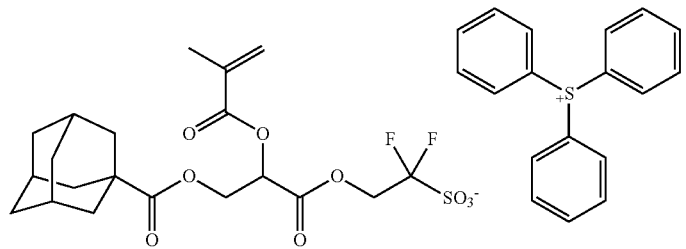

Radiation-Sensitive Acid Generator Other than Compounds (B-1) to (B-31)
b-1 to b-15: Compounds represented by the formulas (b-1) to (b-15) (hereinafter, the compounds represented by the formulas (b-1) to (b-15) may be respectively referred to as "compound (b-1)" to "compound (b-15)")
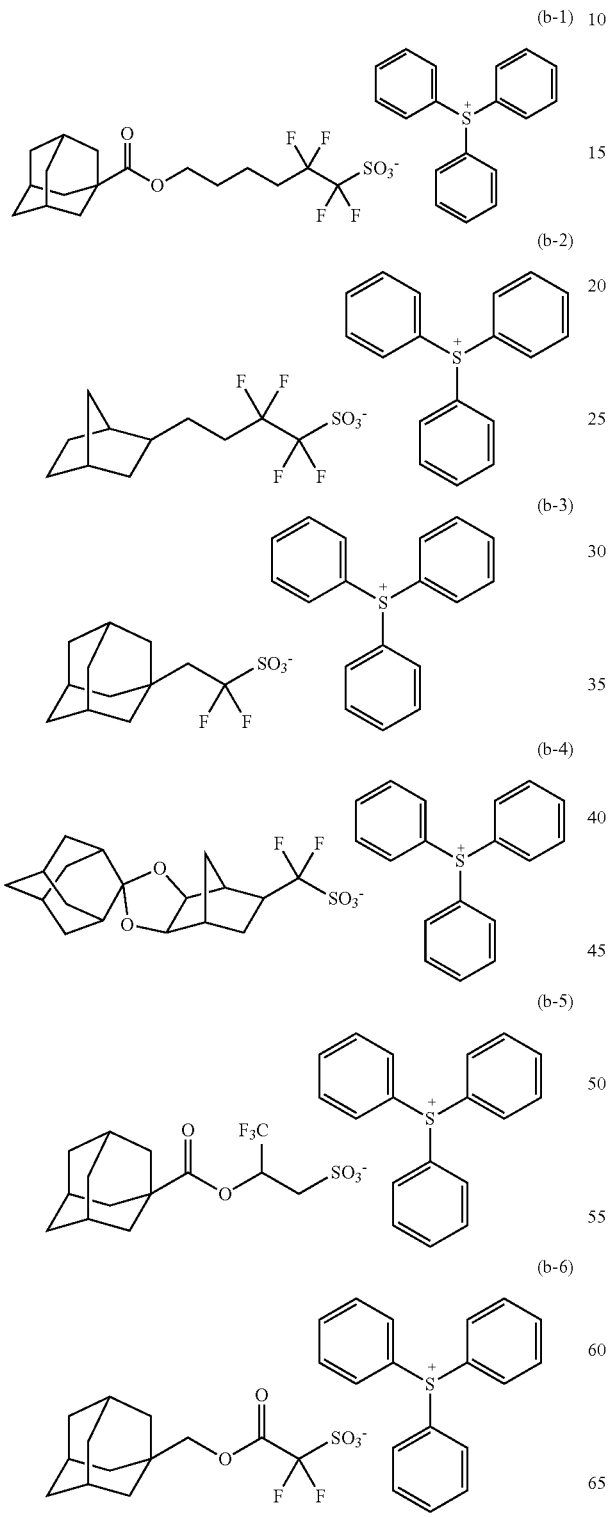
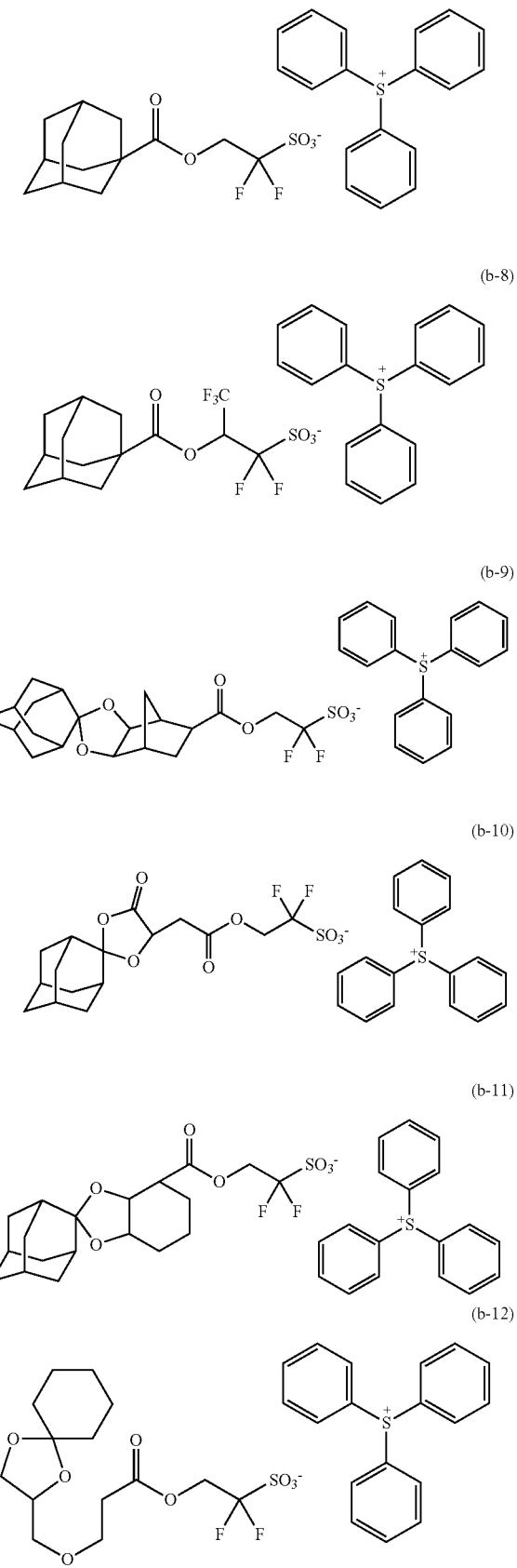

(b-13)
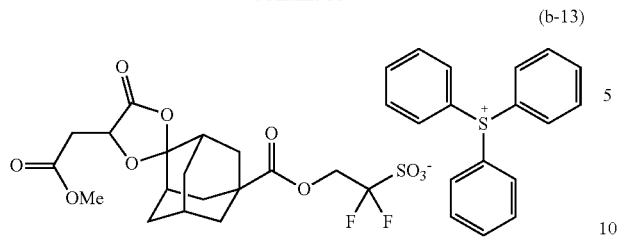

(b-14)
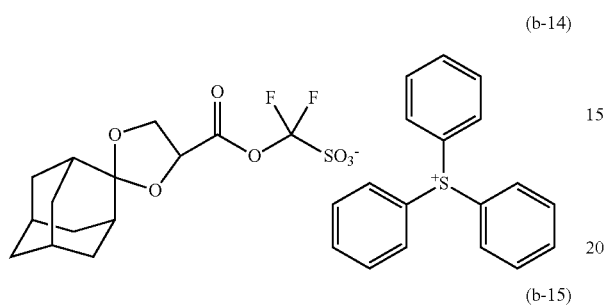

(b-15)
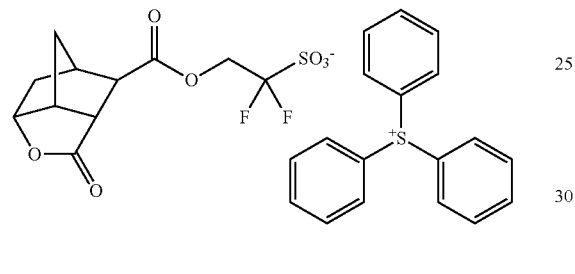

Synthesis of Resin and High Fluorine-Containing Resin

Monomers used for synthesis of resins and high fluorine-containing resins in Examples and Comparative Examples are shown below. In the following synthesis examples, unless otherwise specified, "parts by mass" means a value taken when the total mass of the monomers used is 100 parts by mass, and "mol %" means a value taken when the total number of moles of the monomers used is 100 mol %.

(M-1)

(M-2)
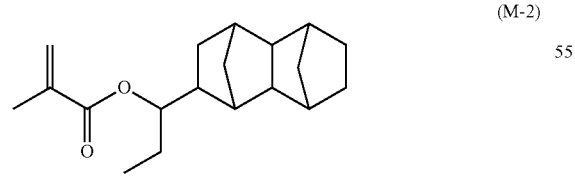

(M-3)
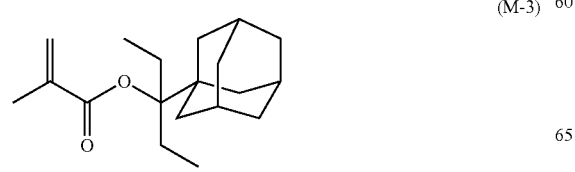

(M-4)

(M-5)
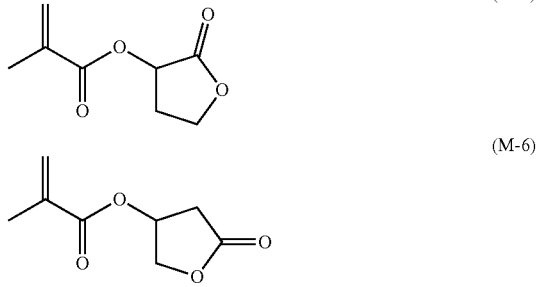

(M-6)
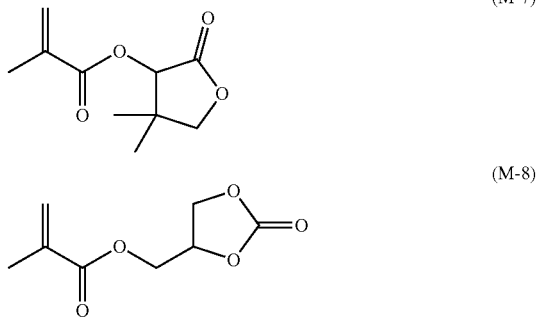

(M-7)
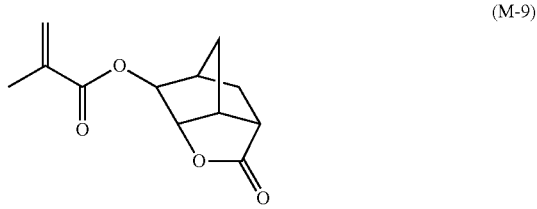

(M-8)
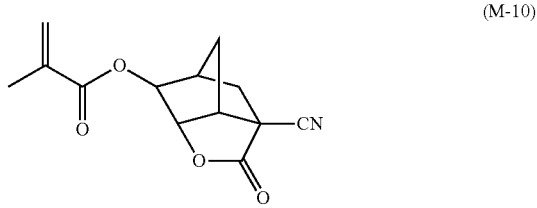

(M-9)

(M-10)
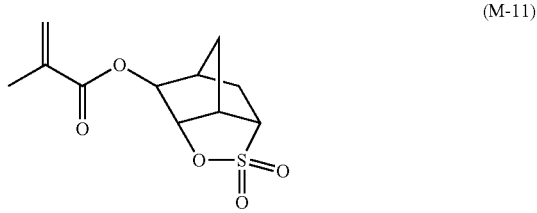

(M-11)

(M-12)
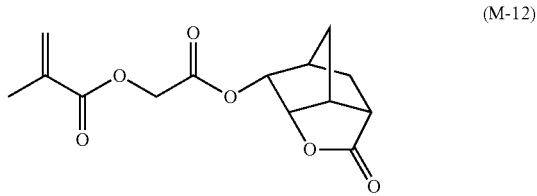

Synthesis Example 32

(Synthesis of Resin (A-1))

A monomer (M-1), a monomer (M-2), and a monomer (M-13) were dissolved at a molar ratio of 40/15/45 (mol %) in 2-butanone (200 parts by mass), and AIBN (azobisisobutyronitrile) (3 mol % based on 100 mol % in total of the monomers used) was added thereto as an initiator to prepare a monomer solution. 2-butanone (100 parts by mass) was placed in a reaction vessel, and the reaction vessel was purged with nitrogen for 30 minutes. Then, the temperature inside the reaction vessel was adjusted to 80° C., and the monomer solution was added dropwise thereto over 3 hours with stirring. A polymerization reaction was performed for 6 hours with the start of the dropwise addition regarded as the start time of the polymerization reaction. After the completion of the polymerization reaction, the polymerization solution was cooled with water to 30° C. or lower. The polymerization solution cooled was poured into methanol (2,000 parts by mass), and a precipitated white powder was collected by filtration. The white powder separated by filtration was washed with methanol twice, then separated by filtration, and dried at 50° C. for 24 hours to obtain a white powdery resin (A-1) (yield: 83%). The resin (A-1) had an Mw of 8,800 and an Mw/Mn of 1.50. As a result of $^{13}$C-NMR analysis, the contents by percent of the structural units derived from (M-1), (M-2), and (M-13) were respectively 41.3 mol %, 13.8 mol %, and 44.9 mol %.

Synthesis Examples 33 to 42

(Synthesis of Resins (A-2) to (A-11))

Resins (A-2) to (A-11) were synthesized in the same manner as in Synthesis Example 1 except that monomers of types and blending ratios shown in the following Table 1 were used. The content by percent (mol %), yield (%), and physical property values (Mw and Mw/Mn) of each of the structural units of the resulting resins are also shown in Table 1. In Table 1, "-" indicates that the corresponding monomer was not used (the same applies to Tables below).

TABLE 1

| Resin (A) | Monomer that gives structural unit (I) | | | Monomer that gives structural unit (II) | | | Monomer that gives structural unit (III) | | | Mw | Mw/Mn |
|---|---|---|---|---|---|---|---|---|---|---|---|
| | Type | Blending ratio (mol %) | Content by percent of structural unit (mol %) | Type | Blending ratio (mol %) | Content by percent of structural unit (mol %) | Type | Blending ratio (mol %) | Content by percent of structural unit (mol %) | | |
| Synthesis Example 32 | A-1 | M-1<br>M-2 | 40<br>15 | 41.3<br>13.8 | M-13 | 45 | 44.9 | — | — | — | 8800 | 1.50 |
| Synthesis Example 33 | A-2 | M-1<br>M-2 | 30<br>10 | 1.4<br>8.0 | M-6 | 60 | 60.6 | — | — | — | 9000 | 1.44 |
| Synthesis Example 34 | A-3 | M-1<br>M-3 | 30<br>10 | 31.9<br>6.4 | M-5 | 60 | 61.7 | — | — | — | 8900 | 1.39 |
| Synthesis Example 35 | A-4 | M-1<br>M-3 | 35<br>20 | 32.3<br>18.1 | M-12 | 45 | 49.6 | — | — | — | 8000 | 1.56 |
| Synthesis Example 36 | A-5 | M-1<br>M-4 | 40<br>15 | 41.1<br>13.2 | M-10 | 45 | 45.7 | — | — | — | 8700 | 1.44 |
| Synthesis Example 37 | A-6 | M-1<br>M-4 | 40<br>15 | 41.6<br>12.3 | M-11 | 45 | 46.1 | — | — | — | 7700 | 1.51 |
| Synthesis Example 38 | A-7 | M-1 | 40 | 42.4 | M-10 | 45 | 39.5 | M-14 | 15 | 18.1 | 7800 | 1.59 |
| Synthesis Example 39 | A-8 | M-1 | 40 | 41.1 | M-7 | 40 | 35.7 | M-15 | 20 | 23.2 | 8500 | 1.61 |
| Synthesis Example 40 | A-9 | M-1 | 50 | 51.0 | M-8 | 50 | 49.0 | — | — | — | 7800 | 1.55 |
| Synthesis Example 41 | A-10 | M-1 | 40 | 44.4 | M-9 | 60 | 55.6 | — | — | — | 7900 | 1.59 |
| Synthesis Example 42 | A-11 | M-1 | 40 | 42.8 | M-6 | 60 | 57.2 | — | — | — | 8000 | 1.43 |

Synthesis Example 43

(Synthesis of Acid Generating Resin (B-32))

A monomer (M-1), a monomer (M-2), a monomer (M-5), and a monomer (B-22) were dissolved at a molar ratio of 40/10/45/5 (mol %) in 2-butanone (200 parts by mass), and AIBN (azobisisobutyronitrile) (6 mol % based on 100 mol % in total of the monomers used) was added thereto as an initiator to prepare a monomer solution. 2-butanone (100 parts by mass) was placed in a reaction vessel, and the reaction vessel was purged with nitrogen for 30 minutes. Then, the temperature inside the reaction vessel was adjusted to 80° C., and the monomer solution was added dropwise thereto over 3 hours with stirring. A polymerization reaction was performed for 6 hours with the start of the dropwise addition regarded as the start time of the polymerization reaction. After the completion of the polymerization reaction, the polymerization solution was cooled with water to 30° C. or lower. The cooled polymerization solution was poured into hexane (2,000 parts by mass), and a precipitated white powder was collected by filtration. The white powder separated by filtration was washed with hexane twice, then separated by filtration, and dried at 50° C. for 24 hours to obtain a white powdery acid generating resin (B-32) (yield: 72%). The acid generating resin (B-32) had an Mw of 5,600 and an Mw/Mn of 1.61. As a result of $^{13}$C-NMR analysis, the contents by percent of the structural units derived from (M-1), (M-2), (M-5), and (B-22) were respectively 41.3 mol %, 9.1 mol %, 45.6 mol %, and 4.0 mol %.

Synthesis Examples 44 and 45

(Synthesis of Acid Generating Resins (B-33) and (B-34))

Acid generating resins (B-33) and (B-34) were synthesized in the same manner as in Synthesis Example 43 except that monomers of types and blending ratios shown in Table 2 were used. The content by percent (mol %), yield (%), and physical property values (Mw and Mw/Mn) of each of the structural units of the resulting acid generating resins are also shown in Table 2.

TABLE 2

| | Acid generating agent [B] | Monomer that gives structural unit (I) | | | Monomer that gives structural unit (II) | | | Monomer that gives specific moiety structure | | | Mw | Mw/Mn |
|---|---|---|---|---|---|---|---|---|---|---|---|---|
| | | Type | Blending ratio (mol %) | Content by percent of structural unit (mol %) | Type | Blending ratio (mol %) | Content by percent of structural unit (mol %) | Type | Blending ratio (mol %) | Content by percent of structural unit (mol %) | | |
| Synthesis Example 43 | B-32 | M-1<br>M-2 | 40<br>10 | 41.3<br>9.1 | M-5 | 45 | 45.6 | B-22 | 5 | 4.0 | 5600 | 1.61 |
| Synthesis Example 44 | B-33 | M-1<br>M-3 | 40<br>10 | 40.8<br>8.9 | M-9 | 45 | 45.9 | B-31 | 5 | 4.4 | 5100 | 1.67 |
| Synthesis Example 45 | B-34 | M-1<br>M-4 | 40<br>10 | 41.4<br>8.8 | M-13 | 45 | 45.1 | B-21 | 5 | 4.7 | 5800 | 1.62 |

Synthesis Example 46

(Synthesis of Resin (A-12))

Monomers (M-1) and (M-18) were dissolved at a molar ratio of 50/50 (mol %) in 1-methoxy-2 propanol (200 parts by mass), and AIBN (5 mol %) was added thereto as an initiator to prepare a monomer solution. 1-methoxy-2-propanol (100 parts by mass) was placed in a reaction vessel, and the reaction vessel was purged with nitrogen for 30 minutes. Then, the temperature inside the reaction vessel was adjusted to 80° C., and the monomer solution was added dropwise thereto over 3 hours with stirring. A polymerization reaction was performed for 6 hours with the start of the dropwise addition regarded as the start time of the polymerization reaction. After the completion of the polymerization reaction, the polymerization solution was cooled with water to 30° C. or lower. The cooled polymerization solution was poured into hexane (2,000 parts by mass), and a precipitated white powder was collected by filtration. The white powder separated by filtration was washed with hexane twice, then separated by filtration, and dissolved in 1-methoxy-2-propanol (300 parts by mass). Next, methanol (500 parts by mass), triethylamine (50 parts by mass) and ultrapure water (10 parts by mass) were added, and a hydrolysis reaction was performed at 70° C. for 6 hours with stirring. After the completion of the reaction, the remaining solvent was distilled off. The resulting solid was dissolved in acetone (100 parts by mass), and the solution was added dropwise to water (500 parts by mass) to solidify a resin. The resulting solid was separated by filtration, and dried at 50° C. for 13 hours to obtain a white powdery resin (A-12) (yield: 79%). The resin (A-12) had an Mw of 5,200 and an Mw/Mn of 1.60. As a result of $^{13}$C-NMR analysis, the contents by percent of the structural units derived from (M-1) and (M-18) were respectively 51.3 mol % and 48.7 mol %.

Synthesis Examples 47 to 51

(Synthesis of Resins (A-13) to (A-15) and Acid Generating Resins (B-35) and (B-36))

Resins (A-13) to (A-15) and acid generating resins (B-35) and (B-36) were synthesized in the same manner as in Synthesis Example 46 except that monomers of types and blending ratios shown in Table 3 were used. The content by percent (mol %), yield (%), and physical property values (Mw and Mw/Mn) of each of the structural units of the resulting resins and acid generating resins are also shown in Table 3.

TABLE 3

| | Resin [A] or acid generating resin [B] | Monomer that gives structural unit (I) | | | Monomer that gives structural unit (III) | | |
|---|---|---|---|---|---|---|---|
| | | Type | Blending ratio (mol %) | Content by percent of structural unit (mol %) | Type | Blending ratio (mol %) | Content by percent of structural unit (mol %) |
| Synthesis Example 46 | A-12 | M-1 | 50 | 51.3 | — | — | — |
| Synthesis Example 47 | A-13 | M-3 | 50 | 46.6 | M-14 | 10 | 11.1 |
| Synthesis Example 48 | A-14 | M-2 | 50 | 48.1 | M-17 | 20 | 21.3 |
| Synthesis Example 49 | A-15 | M-1 | 55 | 55.7 | M-17 | 15 | 15.1 |
| Synthesis Example 50 | B-35 | M-1 | 45 | 46.1 | M-14 | 15 | 15.6 |
| Synthesis Example 51 | B-36 | M-2 | 45 | 45.1 | M-17 | 15 | 15.2 |

| | Monomer that gives structural unit (IV) | | | Monomer that gives specific moiety structure | | | | |
|---|---|---|---|---|---|---|---|---|
| | Type | Blending ratio (mol %) | Content by percent of structural unit (mol %) | Type | Blending ratio (mol %) | Content by percent of structural unit (mol %) | Mw | Mw/Mn |
| Synthesis Example 46 | M-18 | 50 | 48.7 | — | — | — | 5200 | 1.60 |
| Synthesis Example 47 | M-19 | 40 | 42.3 | — | — | — | 5600 | 1.55 |
| Synthesis Example 48 | M-18 | 30 | 30.6 | — | — | — | 5100 | 1.59 |

TABLE 3-continued

| | | | | | | | | |
|---|---|---|---|---|---|---|---|---|
| Synthesis Example 49 | M-19 | 30 | 29.2 | — | — | — | 6100 | 1.50 |
| Synthesis Example 50 | M-18 | 35 | 34.9 | B-22 | 5 | 3.4 | 4900 | 1.67 |
| Synthesis Example 51 | M-19 | 35 | 35.3 | B-31 | 5 | 4.4 | 5000 | 1.70 |

Synthesis Example 52

Synthesis of High Fluorine-Containing Resin (E-1)

Monomers (M-1) and (M-20) were dissolved at a molar ratio of 20/80 (mol %) in 2-butanone (200 parts by mass), and AIBN (4 mol %) was added thereto as an initiator to prepare a monomer solution. 2-butanone (100 parts by mass) was placed in a reaction vessel, and the reaction vessel was purged with nitrogen for 30 minutes. Then, the temperature inside the reaction vessel was adjusted to 80° C., and the monomer solution was added dropwise thereto over 3 hours with stirring. A polymerization reaction was performed for 6 hours with the start of the dropwise addition regarded as the start time of the polymerization reaction. After the completion of the polymerization reaction, the polymerization solution was cooled with water to 30° C. or lower. The solvent was replaced with acetonitrile (400 parts by mass). Hexane (100 parts by mass) was then added, followed by stirring, and an acetonitrile layer was collected. The operation was repeated three times. By replacing the solvent with propylene glycol monomethyl ether acetate, a solution of a high fluorine-containing resin (E-1) was obtained (yield: 69%). The high fluorine-containing resin (E-1) had an Mw of 6,000 and an Mw/Mn of 1.62. As a result of $^{13}$C-NMR analysis, the contents by percent of the structural units derived from (M-1) and (M-20) were respectively 19.9 mol % and 80.1 mol %.

Synthesis Examples 53 to 56

(Synthesis of High Fluorine-Containing Resins (E-2) to (E-5))

High fluorine-containing resins (E-2) to (E-5) were synthesized in the same manner as in Synthesis Example 52 except that monomers of types and blending ratios shown in Table 4 were used. The content by percent (mol %), yield (%), and physical property values (Mw and Mw/Mn) of each of the structural units of the resulting high fluorine-containing resins are also shown in Table 4.

TABLE 4

| | High fluorine-containing resin [E] | Monomer that gives structural unit (V) or (VI) | | | Monomer that gives structural unit (I) | | |
|---|---|---|---|---|---|---|---|
| | | Type | Blending ratio (mol %) | Content by percent of structural unit (mol %) | Type | Blending ratio (mol %) | Content by percent of structural unit (mol %) |
| Synthesis Example 52 | E-1 | M-20 | 80 | 80.1 | M-1 | 20 | 19.9 |
| Synthesis Example 53 | E-2 | M-21 | 80 | 81.9 | M-1 | 20 | 18.1 |
| Synthesis Example 54 | E-3 | M-22 | 60 | 62.3 | — | — | — |
| Synthesis Example 55 | E-4 | M-22 | 70 | 68.7 | — | — | — |
| Synthesis Example 56 | E-5 | M-20 | 60 | 59.2 | M-2 | 10 | 10.3 |

| | Monomer that gives structural unit (II) | | | Monomer that gives other structural unit | | | | |
|---|---|---|---|---|---|---|---|---|
| | Type | Blending ratio (mol %) | Content by percent of structural unit (mol %) | Type | Blending ratio (mol %) | Content by percent of structural unit (mol %) | Mw | Mw/Mn |
| Synthesis Example 52 | — | — | — | — | — | — | 6000 | 1.62 |

TABLE 4-continued

| | | | | | | | |
|---|---|---|---|---|---|---|---|
| Synthesis Example 53 | — | — | — | — | — | — | 7200 | 1.77 |
| Synthesis Example 54 | — | — | — | M-16 | 40 | 38.7 | 6300 | 1.82 |
| Synthesis Example 55 | M-14 | 30 | 31.3 | — | — | — | 6500 | 1.81 |
| Synthesis Example 56 | M-17 | 30 | 30.5 | — | — | — | 6100 | 1.86 |

[Acid Diffusion Controlling Agent [C]]
C-1 to C-5: Compounds represented by the following formulas (C-1) to (C-5)

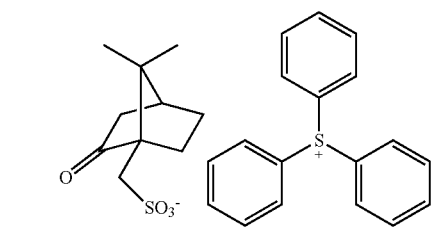
(C-1)

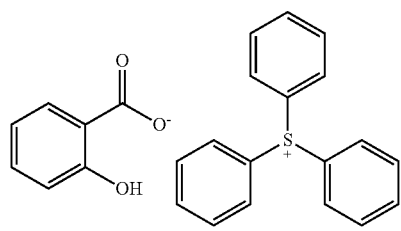
(C-2)

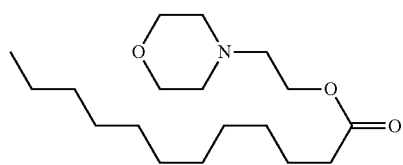
(C-3)

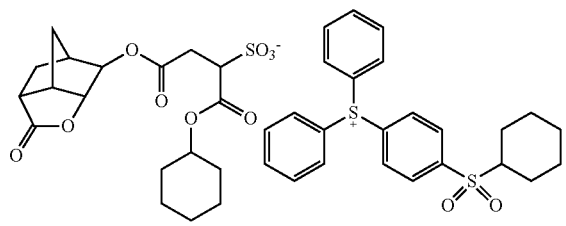
(C-4)

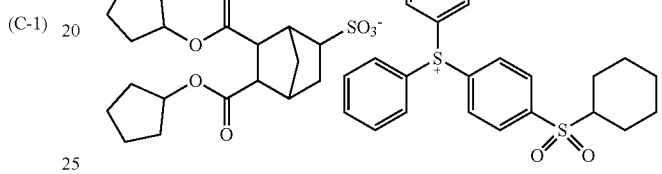
(C-5)

[Solvent [D]]
D-1: propylene glycol monomethyl ether acetate
D-2: Propylene glycol monomethyl ether
D-3: γ-butyrolactone
D-4: ethyl lactate

[Preparation of Positive Radiation-Sensitive Resin Composition for ArF Exposure]

Example 1

100 parts by mass of (A-1) as the resin [A], 12.0 parts by mass of (B-1) as the compound (1) [B], 3.0 parts by mass of (C-1) as the acid diffusion controlling agent [C], 3.0 parts by mass (solid content) of (E-1) as the high fluorine-containing resin [E], and 3,230 parts by mass of a mixed solvent of (D-1)/(D-2)/(D-3) as the solvent [D] were mixed, and the mixture was filtered through a membrane filter having a pore size of 0.2 μm to prepare a radiation-sensitive resin composition (J-1).

Examples 2 to 57 and Comparative Examples 1 to 15

Radiation-sensitive resin compositions (J-2) to (J-57) and (CJ-1) and (CJ-15) were prepared in the same manner as in Example 1 except that components of types and contents shown in Table 5 were used.

TABLE 5

| | Radiation-sensitive resin composition | [A] Resin | | [B] Compound (I) or acid-generating resin | | [C] Acid diffusion controlling agent | | [E] High fluorine-containing resin | | [D] Solvent | |
|---|---|---|---|---|---|---|---|---|---|---|---|
| | | Type | Content (parts by mass) | Type | Content (parts by mass) | Type | Content (parts by mass) | Type | Content (parts by mass) | Type | Content (parts by mass) |
| Example 1 | J-1 | A-1 | 100 | B-1 | 12.0 | C-1 | 3.0 | E-1 | 3.0 | D-1/D-2/D-3 | 2240/960/30 |
| Example 2 | J-2 | A-1 | 100 | B-2 | 12.0 | C-1 | 3.0 | E-1 | 3.0 | D-1/D-2/D-3 | 2240/960/30 |

TABLE 5-continued

| | Radiation-sensitive resin composition | [A] Resin Type | [A] Resin Content (parts by mass) | [B] Compound (I) or acid-generating resin Type | [B] Content (parts by mass) | [C] Acid diffusion controlling agent Type | [C] Content (parts by mass) | [E] High fluorine-containing resin Type | [E] Content (parts by mass) | [D] Solvent Type | [D] Content (parts by mass) |
|---|---|---|---|---|---|---|---|---|---|---|---|
| Example 3 | J-3 | A-1 | 100 | B-3 | 12.0 | C-1 | 3.0 | E-1 | 3.0 | D-1/D-2/D-3 | 2240/960/30 |
| Example 4 | J-4 | A-1 | 100 | B-4 | 12.0 | C-1 | 3.0 | E-1 | 3.0 | D-1/D-2/D-3 | 2240/960/30 |
| Example 5 | J-5 | A-1 | 100 | B-5 | 12.0 | C-1 | 3.0 | E-1 | 3.0 | D-1/D-2/D-3 | 2240/960/30 |
| Example 6 | J-6 | A-1 | 100 | B-6 | 12.0 | C-1 | 3.0 | E-1 | 3.0 | D-1/D-2/D-3 | 2240/960/30 |
| Example 7 | J-7 | A-1 | 100 | B-7 | 12.0 | C-1 | 3.0 | E-1 | 3.0 | D-1/D-2/D-3 | 2240/960/30 |
| Example 8 | J-8 | A-1 | 100 | B-8 | 12.0 | C-1 | 3.0 | E-1 | 3.0 | D-1/D-2/D-3 | 2240/960/30 |
| Example 9 | J-9 | A-1 | 100 | B-9 | 12.0 | C-1 | 3.0 | E-1 | 3.0 | D-1/D-2/D-3 | 2240/960/30 |
| Example 10 | J-10 | A-1 | 100 | B-10 | 12.0 | C-1 | 3.0 | E-1 | 3.0 | D-1/D-2/D-3 | 2240/960/30 |
| Example 11 | J-11 | A-1 | 100 | B-11 | 12.0 | C-1 | 3.0 | E-1 | 3.0 | D-1/D-2/D-3 | 2240/960/30 |
| Example 12 | J-12 | A-1 | 100 | B-12 | 12.0 | C-1 | 3.0 | E-1 | 3.0 | D-1/D-2/D-3 | 2240/960/30 |
| Example 13 | J-13 | A-1 | 100 | B-13 | 12.0 | C-1 | 3.0 | E-1 | 3.0 | D-1/D-2/D-3 | 2240/960/30 |
| Example 14 | J-14 | A-1 | 100 | B-14 | 12.0 | C-1 | 3.0 | E-1 | 3.0 | D-1/D-2/D-3 | 2240/960/30 |
| Example 15 | J-15 | A-1 | 100 | B-15 | 12.0 | C-1 | 3.0 | E-1 | 3.0 | D-1/D-2/D-3 | 2240/960/30 |
| Example 16 | J-16 | A-1 | 100 | B-16 | 12.0 | C-1 | 3.0 | E-1 | 3.0 | D-1/D-2/D-3 | 2240/960/30 |
| Example 17 | J-17 | A-1 | 100 | B-17 | 12.0 | C-1 | 3.0 | E-1 | 3.0 | D-1/D-2/D-3 | 2240/960/30 |
| Example 18 | J-18 | A-1 | 100 | B-18 | 12.0 | C-1 | 3.0 | E-1 | 3.0 | D-1/D-2/D-3 | 2240/960/30 |
| Example 19 | J-19 | A-1 | 100 | B-19 | 12.0 | C-1 | 3.0 | E-1 | 3.0 | D-1/D-2/D-3 | 2240/960/30 |
| Example 20 | J-20 | A-1 | 100 | B-20 | 12.0 | C-1 | 3.0 | E-1 | 3.0 | D-1/D-2/D-3 | 2240/960/30 |
| Example 21 | J-21 | A-1 | 100 | B-23 | 12.0 | C-1 | 3.0 | E-1 | 3.0 | D-1/D-2/D-3 | 2240/960/30 |
| Example 22 | J-22 | A-1 | 100 | B-24 | 12.0 | C-1 | 3.0 | E-1 | 3.0 | D-1/D-2/D-3 | 2240/960/30 |
| Example 23 | J-23 | A-1 | 100 | B-25 | 12.0 | C-1 | 3.0 | E-1 | 3.0 | D-1/D-2/D-3 | 2240/960/30 |
| Example 24 | J-24 | A-1 | 100 | B-26 | 12.0 | C-1 | 3.0 | E-1 | 3.0 | D-1/D-2/D-3 | 2240/960/30 |
| Example 25 | J-25 | A-1 | 100 | B-27 | 12.0 | C-1 | 3.0 | E-1 | 3.0 | D-1/D-2/D-3 | 2240/960/30 |
| Example 26 | J-26 | A-1 | 100 | B-28 | 12.0 | C-1 | 3.0 | E-1 | 3.0 | D-1/D-2/D-3 | 2240/960/30 |
| Example 27 | J-27 | A-1 | 100 | B-29 | 12.0 | C-1 | 3.0 | E-1 | 3.0 | D-1/D-2/D-3 | 2240/960/30 |
| Example 28 | J-28 | A-1 | 100 | B-30 | 12.0 | C-1 | 3.0 | E-1 | 3.0 | D-1/D-2/D-3 | 2240/960/30 |
| Example 29 | J-29 | A-2 | 100 | B-1 | 12.0 | C-1 | 3.0 | E-1 | 3.0 | D-1/D-2/D-3 | 2240/960/30 |
| Example 30 | J-30 | A-3 | 100 | B-1 | 12.0 | C-1 | 3.0 | E-1 | 3.0 | D-1/D-2/D-3 | 2240/960/30 |
| Example 31 | J-31 | A-4 | 100 | B-1 | 12.0 | C-1 | 3.0 | E-1 | 3.0 | D-1/D-2/D-3 | 2240/960/30 |
| Example 32 | J-32 | A-5 | 100 | B-1 | 12.0 | C-1 | 3.0 | E-1 | 3.0 | D-1/D-2/D-3 | 2240/960/30 |
| Example 33 | J-33 | A-6 | 100 | B-1 | 12.0 | C-1 | 3.0 | E-1 | 3.0 | D-1/D-2/D-3 | 2240/960/30 |
| Example 34 | J-34 | A-7 | 100 | B-1 | 12.0 | C-1 | 3.0 | E-1 | 3.0 | D-1/D-2/D-3 | 2240/960/30 |
| Example 35 | J-35 | A-8 | 100 | B-1 | 12.0 | C-1 | 3.0 | E-1 | 3.0 | D-1/D-2/D-3 | 2240/960/30 |
| Example 36 | J-36 | A-9 | 100 | B-1 | 12.0 | C-1 | 3.0 | E-1 | 3.0 | D-1/D-2/D-3 | 2240/960/30 |
| Example 37 | J-37 | A-10 | 100 | B-1 | 12.0 | C-1 | 3.0 | E-1 | 3.0 | D-1/D-2/D-3 | 2240/960/30 |
| Example 38 | J-38 | A-11 | 100 | B-1 | 12.0 | C-1 | 3.0 | E-1 | 3.0 | D-1/D-2/D-3 | 2240/960/30 |
| Example 39 | J-39 | A-1 | 100 | B-1 | 12.0 | C-2 | 3.0 | E-1 | 3.0 | D-1/D-2/D-3 | 2240/960/30 |
| Example 40 | J-40 | A-1 | 100 | B-1 | 12.0 | C-3 | 3.0 | E-1 | 3.0 | D-1/D-2/D-3 | 2240/960/30 |
| Example 41 | J-41 | A-1 | 100 | B-1 | 12.0 | C-4 | 3.0 | E-1 | 3.0 | D-1/D-2/D-3 | 2240/960/30 |
| Example 42 | J-42 | A-1 | 100 | B-1 | 12.0 | C-5 | 3.0 | E-1 | 3.0 | D-1/D-2/D-3 | 2240/960/30 |
| Example 43 | J-43 | A-1 | 100 | B-1 | 12.0 | C-1 | 3.0 | E-2 | 3.0 | D-1/D-2/D-3 | 2240/960/30 |
| Example 44 | J-44 | A-1 | 100 | B-1 | 12.0 | C-1 | 3.0 | E-3 | 3.0 | D-1/D-2/D-3 | 2240/960/30 |
| Example 45 | J-45 | A-1 | 100 | B-1 | 12.0 | C-1 | 3.0 | E-4 | 3.0 | D-1/D-2/D-3 | 2240/960/30 |
| Example 46 | J-46 | — | — | B-32 | 100 | C-1 | 3.0 | E-1 | 3.0 | D-1/D-2/D-3 | 2240/960/30 |
| Example 47 | J-47 | — | — | B-33 | 100 | C-1 | 3.0 | E-1 | 3.0 | D-1/D-2/D-3 | 2240/960/30 |
| Example 48 | J-48 | — | — | B-34 | 100 | C-1 | 3.0 | E-1 | 3.0 | D-1/D-2/D-3 | 2240/960/30 |
| Example 49 | J-49 | — | — | B-32/b-5 | 100/1.0 | C-1 | 3.0 | E-1 | 3.0 | D-1/D-2/D-3 | 2240/960/30 |
| Example 50 | J-50 | A-1 | 100 | B-1 | 2.0 | C-1 | 3.0 | E-1 | 3.0 | D-1/D-2/D-3 | 2240/960/30 |
| Example 51 | J-51 | A-1 | 100 | B-1 | 7.0 | C-1 | 3.0 | E-1 | 3.0 | D-1/D-2/D-3 | 2240/960/30 |
| Example 52 | J-52 | A-1 | 100 | B-1 | 20.0 | C-1 | 3.0 | E-1 | 3.0 | D-1/D-2/D-3 | 2240/960/30 |
| Example 53 | J-53 | A-1 | 100 | B-1 | 12.0 | C-1/C-2 | 1.5/1.5 | E-1 | 3.0 | D-1/D-2/D-3 | 2240/960/30 |
| Example 54 | J-54 | A-1 | 100 | B-1 | 12.0 | C-2/C-5 | 1.5/1.5 | E-1 | 3.0 | D-1/D-2/D-3 | 2240/960/30 |
| Example 55 | J-55 | A-1 | 100 | B-1/b-4 | 9.0/3.0 | C-1 | 3.0 | E-1 | 3.0 | D-1/D-2/D-3 | 2240/960/30 |
| Example 56 | J-56 | A-1 | 100 | B-1/b-5 | 9.0/3.0 | C-1 | 3.0 | E-1 | 3.0 | D-1/D-2/D-3 | 2240/960/30 |
| Example 57 | J-57 | A-1 | 100 | B-1/b-9 | 9.0/3.0 | C-1 | 3.0 | E-1 | 3.0 | D-1/D-2/D-3 | 2240/960/30 |
| Comparative Example 1 | CJ-1 | A-1 | 100 | b-1 | 12.0 | C-1 | 3.0 | E-1 | 3.0 | D-1/D-2/D-3 | 2240/960/30 |
| Comparative Example 2 | CJ-2 | A-1 | 100 | b-2 | 12.0 | C-1 | 3.0 | E-1 | 3.0 | D-1/D-2/D-3 | 2240/960/30 |
| Comparative Example 3 | CJ-3 | A-1 | 100 | b-3 | 12.0 | C-1 | 3.0 | E-1 | 3.0 | D-1/D-2/D-3 | 2240/960/30 |
| Comparative Example 4 | CJ-4 | A-1 | 100 | b-4 | 12.0 | C-1 | 3.0 | E-1 | 3.0 | D-1/D-2/D-3 | 2240/960/30 |
| Comparative Example 5 | CJ-5 | A-1 | 100 | b-5 | 12.0 | C-1 | 3.0 | E-1 | 3.0 | D-1/D-2/D-3 | 2240/960/30 |
| Comparative Example 6 | CJ-6 | A-1 | 100 | b-6 | 12.0 | C-1 | 3.0 | E-1 | 3.0 | D-1/D-2/D-3 | 2240/960/30 |
| Comparative Example 7 | CJ-7 | A-1 | 100 | b-7 | 12.0 | C-1 | 3.0 | E-1 | 3.0 | D-1/D-2/D-3 | 2240/960/30 |
| Comparative Example 8 | CJ-8 | A-1 | 100 | b-8 | 12.0 | C-1 | 3.0 | E-1 | 3.0 | D-1/D-2/D-3 | 2240/960/30 |

TABLE 5-continued

| Radiation-sensitive resin composition | [A] Resin Type | Content (parts by mass) | [B] Compound (I) or acid-generating resin Type | Content (parts by mass) | [C] Acid diffusion controlling agent Type | Content (parts by mass) | [E] High fluorine-containing resin Type | Content (parts by mass) | [D] Solvent Type | Content (parts by mass) |
|---|---|---|---|---|---|---|---|---|---|---|
| Comparative Example 9 | CJ-9 | A-1 | 100 | b-9 | 12.0 | C-1 | 3.0 | E-1 | 3.0 | D-1/D-2/D-3 | 2240/960/30 |
| Comparative Example 10 | CJ-10 | A-1 | 100 | b-10 | 12.0 | C-1 | 3.0 | E-1 | 3.0 | D-1/D-2/D-3 | 2240/960/30 |
| Comparative Example 11 | CJ-11 | A-1 | 100 | b-11 | 12.0 | C-1 | 3.0 | E-1 | 3.0 | D-1/D-2/D-3 | 2240/960/30 |
| Comparative Example 12 | CJ-12 | A-1 | 100 | b-12 | 12.0 | C-1 | 3.0 | E-1 | 3.0 | D-1/D-2/D-3 | 2240/960/30 |
| Comparative Example 13 | CJ-13 | A-1 | 100 | b-13 | 12.0 | C-1 | 3.0 | E-1 | 3.0 | D-1/D-2/D-3 | 2240/960/30 |
| Comparative Example 14 | CJ-14 | A-1 | 100 | b-14 | 12.0 | C-1 | 3.0 | E-1 | 3.0 | D-1/D-2/D-3 | 2240/960/30 |
| Comparative Example 15 | CJ-15 | A-1 | 100 | b-15 | 12.0 | C-1 | 3.0 | E-1 | 3.0 | D-1/D-2/D-3 | 2240/960/30 |

<Formation of Resist Pattern Using Positive Radiation-Sensitive Resin Composition for ArF Exposure>

Onto the surface of a 12-inch silicon wafer, an underlayer antireflection film forming composition ("ARC66" manufactured by Brewer Science Incorporated.) was applied with use of a spin coater ("CLEAN TRACK ACT12" manufactured by Tokyo Electron Limited.). The wafer was then heated at 205° C. for 60 seconds to form an underlayer antireflection film having an average thickness of 100 nm. The positive radiation-sensitive resin composition for ArF exposure prepared above was applied onto the underlayer antireflection film with use of the spin coater, followed by performing PB (pre-baking) at 100° C. for 60 seconds. Thereafter, cooling was performed at 23° C. for 30 seconds to form a resist film having an average thickness of 90 nm. Next, the resist film was exposed through a 40 nm line-and-space mask pattern using an ArF excimer laser immersion exposure apparatus ("TWINSCAN XT-1900i" manufactured by ASML) with NA of 1.35 under an optical condition of Dipole ($\sigma=0.9/0.7$). After the exposure, PEB (post exposure baking) was performed at 100° C. for 60 seconds. Thereafter, the resist film was developed with an alkali with use of a 2.38% by mass aqueous TMAH solution as an alkaline developer, followed by washing with water and further drying to form a positive resist pattern (40 nm line-and-space pattern).

<Evaluation>

The resist patterns formed using the positive radiation-sensitive resin compositions for ArF exposure were evaluated on sensitivity and LWR performance according to the following methods. The results are shown in Table 6. A scanning electron microscope ("CG-5000" manufactured by Hitachi High-Tech Corporation) was used for measuring the length of the resist pattern.

[Sensitivity]

An exposure dose at which a 40 nm line-and-space pattern was formed in the aforementioned resist pattern formation using each of the positive radiation-sensitive resin compositions for ArF exposure was defined as an optimum exposure dose, and this optimum exposure dose was defined as sensitivity (mJ/cm²). The sensitivity was evaluated to be "good" in a case of being 25 mJ/cm² or less, and "poor" in a case of exceeding 25 mJ/cm².

[LWR Performance]

A 40 nm line-and-space resist pattern was formed by irradiation with the optimum exposure dose obtained in the evaluation of the sensitivity. The formed resist pattern was observed from above the pattern with use of the scanning electron microscope. The variation in the line width was measured at a total of 500 points. The 3 sigma value was obtained from the distribution of the measurement values, and defined as LWR performance (nm). The smaller the value of the LWR is, the smaller the roughness of the line is, which is better. The LWR performance was evaluated to be "good" in a case of being 3.0 nm or less, and "poor" in a case of exceeding 3.0 nm.

TABLE 6

| | radiation-sensitive resin composition | sensitivity (mJ/cm²) | LWR (nm) |
|---|---|---|---|
| Example 1 | J-1 | 22 | 2.6 |
| Example 2 | J-2 | 21 | 2.3 |
| Example 3 | J-3 | 20 | 2.4 |
| Example 4 | J-4 | 20 | 2.5 |
| Example 5 | J-5 | 21 | 2.7 |
| Example 6 | J-6 | 23 | 2.5 |
| Example 7 | J-7 | 22 | 2.2 |
| Example 8 | J-8 | 21 | 2.2 |
| Example 9 | J-9 | 21 | 2.3 |
| Example 10 | J-10 | 24 | 2.4 |
| Example 11 | J-11 | 24 | 2.2 |
| Example 12 | J-12 | 22 | 2.4 |
| Example 13 | J-13 | 22 | 2.3 |
| Example 14 | J-14 | 23 | 2.6 |
| Example 15 | J-15 | 20 | 2.8 |
| Example 16 | J-16 | 21 | 2.2 |
| Example 17 | J-17 | 20 | 2.6 |
| Example 18 | J-18 | 24 | 2.2 |
| Example 19 | J-19 | 23 | 2.5 |
| Example 20 | J-20 | 23 | 2.3 |
| Example 21 | J-21 | 20 | 2.7 |
| Example 22 | J-22 | 21 | 2.7 |
| Example 23 | J-23 | 19 | 2.8 |
| Example 24 | J-24 | 18 | 2.7 |
| Example 25 | J-25 | 20 | 2.8 |
| Example 26 | J-26 | 20 | 2.8 |
| Example 27 | J-27 | 19 | 2.6 |
| Example 28 | J-28 | 18 | 2.7 |
| Example 29 | J-29 | 21 | 2.5 |
| Example 30 | J-30 | 22 | 2.7 |

TABLE 6-continued

| | radiation-sensitive resin composition | sensitivity (mJ/cm$^2$) | LWR (nm) |
|---|---|---|---|
| Example 31 | J-31 | 23 | 2.6 |
| Example 32 | J-32 | 23 | 2.6 |
| Example 33 | J-33 | 22 | 2.5 |
| Example 34 | J-34 | 22 | 2.5 |
| Example 35 | J-35 | 23 | 2.7 |
| Example 36 | J-36 | 19 | 2.4 |
| Example 37 | J-37 | 22 | 2.4 |
| Example 38 | J-38 | 20 | 2.3 |
| Example 39 | J-39 | 24 | 2.3 |
| Example 40 | J-40 | 24 | 2.8 |
| Example 41 | J-41 | 22 | 2.6 |
| Example 42 | J-42 | 21 | 2.5 |
| Example 43 | J-43 | 22 | 2.6 |
| Example 44 | J-44 | 22 | 2.7 |
| Example 45 | J-45 | 21 | 2.8 |
| Example 46 | J-46 | 19 | 2.2 |
| Example 47 | J-47 | 18 | 2.7 |
| Example 48 | J-48 | 19 | 2.3 |
| Example 49 | J-49 | 20 | 2.6 |
| Example 50 | J-50 | 24 | 2.3 |
| Example 51 | J-51 | 22 | 2.6 |
| Example 52 | J-52 | 17 | 2.8 |
| Example 53 | J-53 | 22 | 2.5 |
| Example 54 | J-54 | 23 | 2.4 |
| Example 55 | J-55 | 24 | 2.7 |
| Example 56 | J-56 | 24 | 2.6 |
| Example 57 | J-57 | 22 | 2.5 |
| Comparative Example 1 | CJ-1 | 27 | 3.5 |
| Comparative Example 2 | CJ-2 | 29 | 3.3 |
| Comparative Example 3 | CJ-3 | 34 | 3.5 |
| Comparative Example 4 | CJ-4 | 33 | 3.2 |
| Comparative Example 5 | CJ-5 | 35 | 3.8 |
| Comparative Example 6 | CJ-6 | 30 | 3.1 |
| Comparative Example 7 | CJ-7 | 30 | 3.5 |
| Comparative Example 8 | CJ-8 | 31 | 3.1 |
| Comparative Example 9 | CJ-9 | 27 | 3.2 |
| Comparative Example 10 | CJ-10 | 33 | 3.4 |
| Comparative Example 11 | CJ-11 | 32 | 3.2 |
| Comparative Example 12 | CJ-12 | 28 | 3.7 |
| Comparative Example 13 | CJ-13 | 30 | 3.4 |
| Comparative Example 14 | CJ-14 | 38 | 3.9 |
| Comparative Example 15 | CJ-15 | 27 | 3.3 |

As is apparent from the results in Table 6, the radiation-sensitive resin compositions of Examples were good in sensitivity and LWR performance when used for ArF exposure, whereas the radiation-sensitive resin compositions of Comparative Examples were poorer in the characteristics than those of Examples. Therefore, when the radiation-sensitive resin compositions of Examples are used for ArF exposure, a resist pattern having high sensitivity and good LWR performance can be formed.

[Preparation of Positive Radiation-Sensitive Resin Composition for Extreme Ultraviolet (EUV) Exposure]

Example 58

100 parts by mass of (A-12) as the resin [A], 15.0 parts by mass of (B-7) as the compound (1) [B], 4.0 parts by mass of (C-2) as the acid diffusion controlling agent [C], 3.0 parts by mass (solid content) of (E-5) as the high fluorine-containing resin [E], and 6,110 parts by mass of a mixed solvent of (D-1)/(D-4) as the solvent [D] were mixed, and the mixture was filtered through a membrane filter having a pore size of 0.2 μm to prepare a radiation-sensitive resin composition (J-58).

Examples 59 to 70 and Comparative Examples 16 to 19

Radiation-sensitive resin compositions (J-59) to (J-70) and (CJ-16) to (CJ-19) were prepared in the same manner as in Example 58 except that components of types and contents shown in Table 7 were used.

TABLE 7

| | Radiation-sensitive resin composition | [A] Resin | | [B] Compound (1) or acid-generating resin | | [C] Acid diffusion controlling agent | | [E] High fluorine-containing resin | | [D] Solvent | |
|---|---|---|---|---|---|---|---|---|---|---|---|
| | | Type | Content (pares by mass) | Type | Content (parts by mass) | Type | Content (pares by mass) | Type | Content (parts by mass) | Type | Content (parts by mass) |
| Example 58 | J-58 | A-12 | 100 | B-7 | 15.0 | C-2 | 4.0 | E-5 | 3.0 | D-1/D-4 | 4280/1830 |
| Example 59 | J-59 | A-12 | 100 | E-11 | 15.0 | C-2 | 4.0 | E-5 | 3.0 | D-1/D-4 | 4280/1830 |
| Example 60 | J-60 | A-12 | 100 | B-13 | 15.0 | C-2 | 4.0 | E-5 | 3.0 | D-1/D-4 | 4280/1830 |
| Example 61 | J-61 | A-12 | 100 | E-15 | 15.0 | C-2 | 4.0 | E-5 | 3.0 | D-1/D-4 | 4280/1830 |
| Example 62 | J-62 | A-12 | 100 | B-29 | 15.0 | C-2 | 4.0 | E-5 | 3.0 | D-1/D-4 | 4280/1830 |
| Example 63 | J-63 | A-13 | 100 | B-7 | 15.0 | C-2 | 4.0 | E-5 | 3.0 | D-1/D-4 | 4280/1830 |
| Example 64 | J-64 | A-14 | 100 | B-7 | 15.0 | C-2 | 4.0 | E-5 | 3.0 | D-1/D-4 | 4280/1830 |
| Example 65 | J-65 | A-15 | 100 | B-7 | 15.0 | C-2 | 4.0 | E-5 | 3.0 | D-1/D-4 | 4280/1830 |
| Example 66 | J-66 | A-12 | 100 | B-7 | 15.0 | C-5 | 4.0 | E-5 | 3.0 | D-1/D-4 | 4280/1830 |
| Example 67 | J-67 | — | — | B-32 | 100 | C-2 | 4.0 | E-5 | 3.0 | D-1/D-4 | 4280/1830 |
| Example 68 | J-68 | — | — | B-35 | 100 | C-2 | 4.0 | E-5 | 3.0 | D-1/D-4 | 4280/1830 |
| Example 69 | J-69 | — | — | B-36 | 100 | C-2 | 4.0 | E-5 | 3.0 | D-1/D-4 | 4280/1830 |
| Example 70 | J-70 | — | — | E-35/b-4 | 100/2.0 | C-2 | 4.0 | E-5 | 3.0 | D-1/D-4 | 4280/1830 |
| Comparative Example 16 | CJ-16 | A-12 | 100 | b-7 | 15.0 | C-2 | 4.0 | E-5 | 3.0 | D-1/D-4 | 4280/1830 |
| Comparative Example 17 | CJ-17 | A-12 | 100 | b-9 | 15.0 | C-2 | 4.0 | E-5 | 3.0 | D-1/D-4 | 4280/1830 |
| Comparative Example 18 | CJ-18 | A-12 | 100 | b-10 | 15.0 | C-2 | 4.0 | E-5 | 3.0 | D-1/D-4 | 4280/1830 |
| Comparative Example 19 | CJ-19 | A-12 | 100 | b-15 | 15.0 | C-2 | 4.0 | E-5 | 3.0 | D-1/D-4 | 4280/1830 |

<Formation of Resist Pattern Using Positive Radiation-Sensitive Resin Composition for EUV Exposure>

Onto the surface of a 12-inch silicon wafer, an underlayer antireflection film forming composition ("ARC66" manufactured by Brewer Science Incorporated.) was applied with use of a spin coater ("CLEAN TRACK ACT12" manufactured by Tokyo Electron Limited.). The wafer was then heated at 205° C. for 60 seconds to form an underlayer antireflection film having an average thickness of 105 nm. The positive radiation-sensitive resin composition for EUV exposure prepared above was applied onto the underlayer antireflection film with use of the spin coater, followed by performing PB at 130° C. for 60 seconds. Thereafter, cooling was performed at 23° C. for 30 seconds to form a resist film having an average thickness of 55 nm. Next, the resist film was exposed by an EUV exposure apparatus ("NXE3300", manufactured by ASML) with NA of 0.33 under a lighting condition of Conventional s=0.89 and with a mask of imecDEFECT32FFR02. After exposing, PEB was performed at 120° C. for 60 seconds. Thereafter, the resist film was developed with an alkali with use of a 2.38% by mass aqueous TMAH solution as an alkaline developer, followed by washing with water and further drying to form a positive resist pattern (32 nm line-and-space pattern).

<Evaluation>

The resist patterns formed using the positive radiation-sensitive resin compositions for EUV exposure were evaluated on sensitivity and LWR performance according to the following methods. The results are shown in Table 8. A scanning electron microscope ("CG-5000" manufactured by Hitachi High-Tech Corporation) was used for measuring the length of the resist pattern.

[Sensitivity]

An exposure dose at which a 32 nm line-and-space pattern was formed in the aforementioned resist pattern formation using the positive radiation-sensitive resin composition for EUV exposure was defined as an optimum exposure dose, and this optimum exposure dose was defined as sensitivity (mJ/cm$^2$). The sensitivity was evaluated to be "good" in a case of being 30 mJ/cm$^2$ or less, and "poor" in a case of exceeding 30 mJ/cm$^2$.

[LWR Performance]

A resist pattern was formed by adjusting a mask size so as to form a 32 nm line-and-space pattern by irradiation with the optimum exposure dose obtained in the evaluation of the sensitivity. The formed resist pattern was observed from above the pattern with use of the scanning electron microscope. The variation in the line width was measured at a total of 500 points. The 3 sigma value was obtained from the distribution of the measurement values, and defined as LWR performance (nm). The smaller the value of the LWR is, the smaller the wobble of the line is, which is better. The LWR performance was evaluated to be "good" in a case of being 3.5 nm or less, and "poor" in a case of exceeding 3.5 nm.

TABLE 8

| | Radiation-sensitive resin composition | Sensitivity (mJ/cm$^2$) | LWR (nm) |
|---|---|---|---|
| Example 58 | J-58 | 25 | 3.0 |
| Example 59 | J-59 | 24 | 2.9 |
| Example 60 | J-60 | 23 | 2.7 |
| Example 61 | J-61 | 26 | 2.6 |
| Example 62 | J-62 | 25 | 3.1 |
| Example 63 | J-63 | 24 | 2.9 |
| Example 64 | J-64 | 25 | 3.1 |

TABLE 8-continued

| | Radiation-sensitive resin composition | Sensitivity (mJ/cm$^2$) | LWR (nm) |
|---|---|---|---|
| Example 65 | J-65 | 25 | 3.1 |
| Example 66 | J-66 | 23 | 3.3 |
| Example 67 | J-67 | 24 | 3.3 |
| Example 68 | J-68 | 23 | 2.8 |
| Example 69 | J-69 | 24 | 2.7 |
| Example 70 | J-70 | 24 | 2.7 |
| Comparative Example 16 | CJ-16 | 33 | 3.8 |
| Comparative Example 17 | CJ-17 | 32 | 3.7 |
| Comparative Example 18 | CJ-18 | 35 | 4.0 |
| Comparative Example 19 | CJ-19 | 34 | 3.8 |

As is apparent from the results in Table 8, the radiation-sensitive resin compositions of Examples were good in sensitivity and LWR performance when used for EUV exposure, whereas the radiation-sensitive resin compositions of Comparative Examples were poorer in the characteristics than those of Examples.

[Preparation of Negative Radiation-Sensitive Resin Composition for ArF Exposure, and Formation and Evaluation of Resist Pattern Using this Composition]

Example 71

100 parts by mass of (A-6) as the resin [A], 12.0 parts by mass of (B-8) as the compound (1) [B], 4.0 parts by mass of (C-5) as the acid diffusion controlling agent [C], 5.0 parts by mass (solid content) of (E-3) as the high fluorine-containing resin [E], and 3,230 parts by mass of a mixed solvent of (D-1)/(D-2)/(D-3) as the solvent [D] were mixed, and the mixture was filtered through a membrane filter having a pore size of 0.2 μm to prepare a radiation-sensitive resin composition (J-71).

Onto the surface of a 12-inch silicon wafer, an underlayer antireflection film forming composition ("ARC66" manufactured by Brewer Science Incorporated.) was applied with use of a spin coater ("CLEAN TRACK ACT12" manufactured by Tokyo Electron Limited.). The wafer was then heated at 205° C. for 60 seconds to form an underlayer antireflection film having an average thickness of 100 nm. The negative radiation-sensitive resin composition for ArF exposure (J-71) prepared above was applied onto the underlayer antireflection film with use of the spin coater, followed by performing PB (pre-baking) at 100° C. for 60 seconds. Thereafter, cooling was performed at 23° C. for 30 seconds to form a resist film having an average thickness of 90 nm. Next, this resist film was exposed through a mask pattern having a hole of 40 nm and a pitch of 105 nm using an ArF excimer laser immersion exposure apparatus ("TWINSCAN XT-1900i" manufactured by ASML) with NA of 1.35 under an optical condition of Annular (σ=0.8/0.6). After the exposure, PEB (post exposure baking) was performed at 100° C. for 60 seconds. Thereafter, the resist film was developed with an organic solvent using n-butyl acetate as an organic solvent developer, and dried to form a negative resist pattern (hole of 40 nm, pitch of 105 nm).

<Evaluation>

The resist patterns formed using the negative radiation-sensitive resin compositions for ArF exposure were evaluated on CDU performance according to the following methods. A scanning electron microscope ("CG-5000" manufactured by Hitachi High-Tech Corporation) was used for measuring the length of the resist pattern.

[CDU Performance]

Using the scanning electron microscope, the length of a resist pattern having a hole of 40 nm and a pitch of 105 nm was measured at a total of optional 1,800 points from the top of the pattern. Dimensional variation (3σ) was determined, and defined as CDU performance (nm). The smaller the value of the CDU performance is, the smaller the variation in the hole diameter over long period is, which is better.

As a result of evaluating the resist pattern using the negative radiation-sensitive resin composition for ArF exposure as described above, the radiation-sensitive resin composition of Example 71 had good CDU performance even when a negative resist pattern was formed by ArF exposure.

[Preparation of Negative Radiation-Sensitive Resin Composition for EUV Exposure, and Formation and Evaluation of Resist Pattern Using this Composition]

Example 72

100 parts by mass of (A-13) as the resin [A], 21.0 parts by mass of (B-7) as the compound (1) [B], 5.0 parts by mass of (C-2) as the acid diffusion controlling agent [C], 3.0 parts by mass (solid content) of (E-5) as the high fluorine-containing resin [E], and 6,110 parts by mass of a mixed solvent of (D-1)/(D-4) as the solvent [D] were mixed, and the mixture was filtered through a membrane filter having a pore size of 0.2 µm to prepare a radiation-sensitive resin composition (J-72).

Onto the surface of a 12-inch silicon wafer, an underlayer antireflection film forming composition ("ARC66" manufactured by Brewer Science Incorporated.) was applied with use of a spin coater ("CLEAN TRACK ACT12" manufactured by Tokyo Electron Limited.). The wafer was then heated at 205° C. for 60 seconds to form an underlayer antireflection film having an average thickness of 105 nm. The negative radiation-sensitive resin composition for EUV exposure prepared above was applied onto the underlayer antireflection film with use of the spin coater, followed by performing PB at 130° C. for 60 seconds. Thereafter, cooling was performed at 23° C. for 30 seconds to form a resist film having an average thickness of 55 nm. Next, the resist film was exposed by an EUV exposure apparatus ("NXE3300", manufactured by ASML) with NA of 0.33 under a lighting condition of Conventional s=0.89 and with a mask of imecDEFECT32FFR02. After exposing, PEB was performed at 120° C. for 60 seconds. Thereafter, the resist film was developed with an organic solvent using n-butyl acetate as an organic solvent developer, and dried to form a negative resist pattern (hole of 40 nm, pitch of 105 nm).

The resist pattern using the negative radiation-sensitive resin composition for EUV exposure was evaluated in the same manner as in the evaluation of the resist pattern using the negative radiation-sensitive resin composition for ArF exposure. As a result, the radiation-sensitive resin composition of Example 72 had good CDU performance even when a negative resist pattern was formed by EUV exposure.

According to the radiation-sensitive resin composition and the method for forming a resist pattern described above, a resist pattern having good sensitivity to exposure light and excellent LWR performance and CDU performance can be formed. Therefore, these can be suitably used for a machining process and the like of a semiconductor device in which micronization is expected to further progress in the future.

Obviously, numerous modifications and variations of the present invention(s) are possible in light of the above teachings. It is therefore to be understood that within the scope of the appended claims, the invention may be practiced otherwise than as specifically described herein.

What is claimed is:

1. A radiation-sensitive resin composition comprising:
a solvent; and
an onium salt compound represented by formula (1-1) or (1-2):

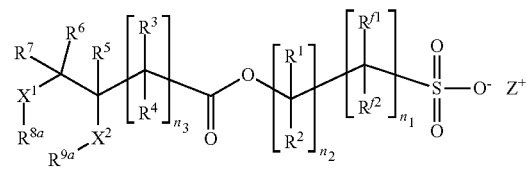

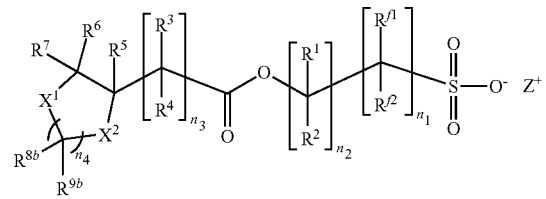

wherein:
$R^{f1}$ and $R^{f2}$ each independently represent a fluorine atom or a monovalent fluorinated hydrocarbon group having 1 to 20 carbon atoms;
$R^1$ represents a hydrogen atom, a monovalent hydrocarbon group having 1 to 20 carbon atoms, a fluorine atom, or a monovalent fluorinated hydrocarbon group having 1 to 20 carbon atoms;
$R^2$, $R^3$, $R^4$, $R^5$, $R^6$, and $R^7$ each independently represent a hydrogen atom or a monovalent hydrocarbon group having 1 to 20 carbon atoms;
$n_1$ represents an integer of 0 to 4, provided that when there are a plurality of $R^{f1}$s and $R^{f2}$s, the plurality of $R^{f1}$s and $R^{f2}$s are the same or different from each other;
$n_2$ represents an integer of 0 to 4, provided that when there are a plurality of $R^1$s and $R^2$s, the plurality of $R^1$s and $R^2$s are the same or different from each other;
$n_1+n_2$ is an integer of 2 to 8;
$n_3$ represents an integer of 0 to 5, provided that when there are a plurality of $R^3$s and $R^4$s, the plurality of $R^3$s and $R^4$s are the same as or different from each other;
$X^1$ and $X^2$ each independently represent an oxygen atom or a sulfur atom;
$Z^+$ represents a monovalent radiation-sensitive onium cation,
$R^{8a}$ and $R^{9a}$ each independently represents a monovalent organic group having 1 to 40 carbon atoms;
$R^{8b}$ and $R^{9b}$ each independently represent a hydrogen atom or a monovalent organic group having 1 to 40 carbon atoms provided that at least one of $R^{8b}$ and $R^{9b}$ is a monovalent organic group having 2 to 40 carbon atoms, or $R^{8b}$ and $R^{9b}$ taken together represent a ring structure having 3 to 20 ring atoms together with the carbon atom to which $R^{8b}$ and $R^{9b}$ are bonded provided that when the ring structure represented by $R^{8b}$ and $R^{9b}$ taken together is an adamantyl or cyclohexyl, the adamantyl or cyclohexyl is substituted by an organic group; and $n_4$ represents an integer of 1 to 4, provided that when there are a plurality of $R^{8b}$s and $R^{9b}$s, the plurality of $R^{8b}$s and $R^{9b}$s are the same or different from each other.

2. The radiation-sensitive resin composition according to claim 1, further comprising a resin comprising a structural unit having an acid-dissociable group.

3. The radiation-sensitive resin composition according to claim 2, wherein a content of the onium salt compound in the radiation-sensitive resin composition is 0.01 parts by mass or more and 50 parts by mass or less with respect to 100 parts by mass of the resin.

4. The radiation-sensitive resin composition according to claim 1, wherein the organic groups represented by $R^{8a}$, $R^{9a}$, $R^{8b}$, and $R^{9b}$ are each independently a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, or a combination thereof.

5. The radiation-sensitive resin composition according to claim 4, wherein the alicyclic hydrocarbon group is a monovalent monocyclic alicyclic group having 3 to 10 carbon atoms or a monovalent polycyclic alicyclic group having 6 to 14 carbon atoms.

6. The radiation-sensitive resin composition according to claim 1, wherein the ring structure having 3 to 20 ring atoms is an alicyclic monocyclic structure having 3 to 10 carbon atoms, an alicyclic polycyclic structure having 6 to 14 carbon atoms, or an aromatic ring structure having 8 to 20 carbon atoms.

7. The radiation-sensitive resin composition according to claim 1, wherein the radiation-sensitive onium cation in formulae (1-1) and (1-2) is a sulfonium cation or an iodonium cation.

8. The radiation-sensitive resin composition according to claim 1, wherein $n_1$ in the formulae (1-1) and (1-2) represents an integer of 1 to 4.

9. The radiation-sensitive resin composition according to claim 1, wherein $n_2$ in the formulae (1-1) and (1-2) represents an integer of 1 to 4.

10. The radiation-sensitive resin composition according to claim 1, wherein $n_1+n_2$ in the formulae (1-1) and (1-2) is 2.

11. The radiation-sensitive resin composition according to claim 1, wherein $n_3$ in the formulae (1-1) and (1-2) represents 0.

12. The radiation-sensitive resin composition according to claim 1, further comprising an acid diffusion controlling agent.

13. A method for forming a pattern, the method comprising:
directly or indirectly applying the radiation-sensitive resin composition according to claim 1 onto a substrate to form a resist film;
exposing the resist film; and
developing the exposed resist film with a developer.

14. A radiation-sensitive resin composition comprising:
a solvent; and
an onium salt compound represented by formula (1-2):

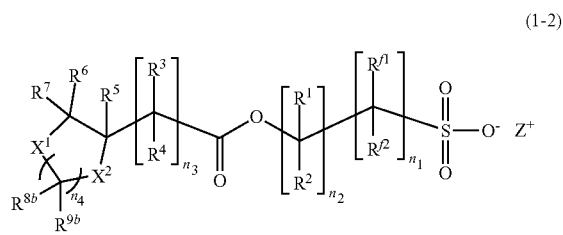

(1-2)

wherein:
$R^{f1}$ and $R^{f2}$ each independently represent a fluorine atom or a perfluoroalkyl group having 1 to 5 carbon atoms;
$R^1$ and $R^2$ represent a hydrogen atom;
$R^5$, $R^6$, and $R^7$ each independently represent a hydrogen atom or a monovalent hydrocarbon group having 1 to 20 carbon atoms;
$n_1$ and $n_2$ each represent 1;
$n_3$ represents 0;
$n_4$ represents 1;
$X^1$ and $X^2$ each represent an oxygen atom;
$Z^+$ represents a monovalent radiation-sensitive onium cation; and
$R^{8b}$ and $R^{9b}$ each independently represent a hydrogen atom or a monovalent organic group having 1 to 40 carbon atoms, or $R^{8b}$ and $R^{9b}$ taken together represent a ring structure having 3 to 20 ring atoms together with the carbon atom to which $R^{8b}$ and $R^{9b}$ are bonded.

* * * * *